(12) United States Patent
Kimura

(10) Patent No.: US 7,807,520 B2
(45) Date of Patent: Oct. 5, 2010

(54) METHOD FOR MANUFACTURING SEMICONDUCTOR DEVICE

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 233 days.

(21) Appl. No.: 12/142,454

(22) Filed: Jun. 19, 2008

(65) Prior Publication Data

US 2009/0001387 A1 Jan. 1, 2009

(30) Foreign Application Priority Data

Jun. 29, 2007 (JP) ............... 2007-173281

(51) Int. Cl.
 *H01L 21/762* (2006.01)
(52) U.S. Cl. .............. 438/164; 438/219; 438/479; 257/E29.285; 257/E21.415; 257/E21.411
(58) Field of Classification Search .......... 257/E29.285, 257/E21.415, E21.411; 438/164, 219, 479, 438/FOR. 210
See application file for complete search history.

(56) References Cited

U.S. PATENT DOCUMENTS

| 5,710,057 | A   | * | 1/1998  | Kenney ............ 438/406  |
| 6,372,609 | B1  |   | 4/2002  | Aga et al.                  |
| 6,949,451 | B2  | * | 9/2005  | Yeo et al. ............ 438/479 |
| 7,029,960 | B2  | * | 4/2006  | Hashimoto et al. ..... 438/164 |
| 7,119,365 | B2  |   | 10/2006 | Takafuji et al.             |
| 7,229,901 | B2  | * | 6/2007  | Savage et al. ........ 438/479 |
| 7,612,438 | B2  | * | 11/2009 | Akiyama et al. ....... 257/676 |
| 2002/0192956 | A1 | * | 12/2002 | Kizilyalli et al. ..... 438/689 |
| 2004/0128829 | A1 | * | 7/2004  | Kimura .............. 29/832  |
| 2005/0264176 | A1 | * | 12/2005 | Onozuka et al. ....... 313/500 |

FOREIGN PATENT DOCUMENTS

JP  06-018926  1/1994

* cited by examiner

*Primary Examiner*—George Fourson
(74) *Attorney, Agent, or Firm*—Fish & Richardson P.C.

(57) ABSTRACT

To provide a method for manufacturing a large semiconductor device which easily operates normally and has excellent current characteristics. A first single-crystal semiconductor layer is provided over an insulating substrate. Then, the first single-crystal semiconductor layer is processed into an island shape. After that, a second single-crystal semiconductor layer is provided over the insulating substrate so as to overlap with part of a region where the first single-crystal semiconductor layer is provided. After that, the second single-crystal semiconductor layer is processed into an island shape. Thus, defects at joint portions in the case of providing the single-crystal semiconductor layers can be reduced.

9 Claims, 39 Drawing Sheets

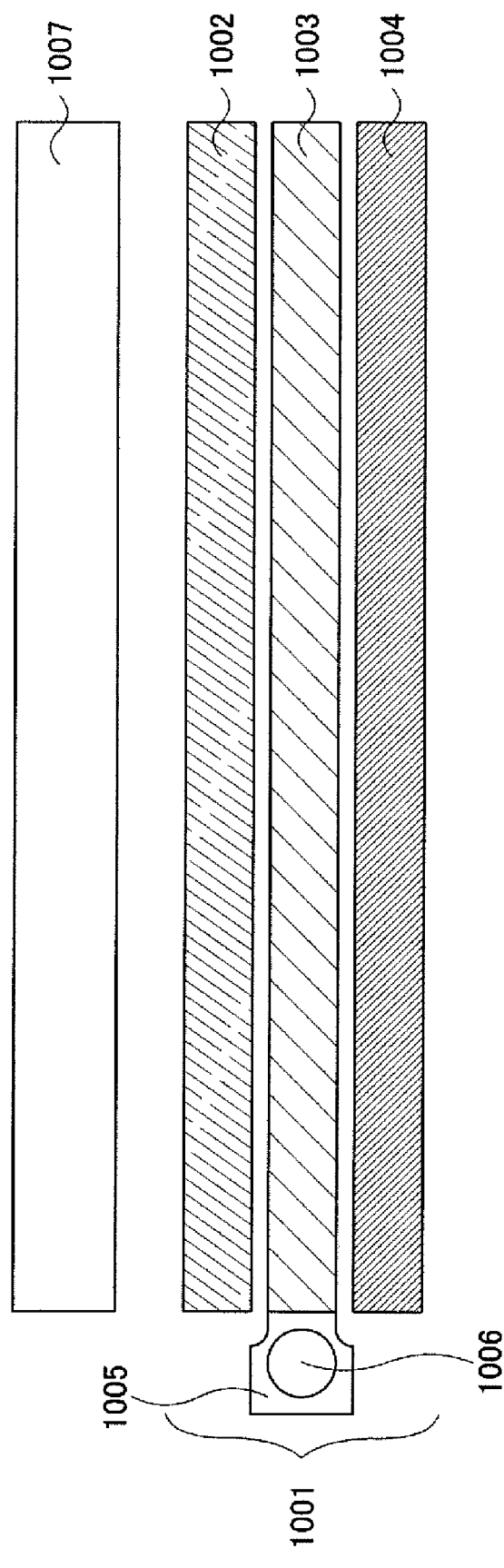

semiconductor layer
gate metal
wiring
light-transmitting conductive film

METHOD FOR MANUFACTURING SEMICONDUCTOR DEVICE

BACKGROUND OF THE INVENTION

1. Field of the Invention

The present invention relates to a device and a manufacturing method thereof. In particular, the present invention relates to a manufacturing method of a display device or a semiconductor device. Specifically, the present invention relates to a manufacturing method of a display device or a semiconductor device, in which a single-crystal semiconductor is fixed to an insulating substrate.

2. Description of the Related Art

In recent years, a technique for forming a thin film transistor (TFT) by using a semiconductor thin film (having a thickness of approximately several to several hundreds of nanometers) formed over a substrate having an insulating surface has attracted attention. Thin film transistors have been widely applied to electronic devices such as ICs and electro-optical devices and have been rapidly developed particularly as switching elements for image display devices.

In order to obtain high-definition image display, a highly accurate photolithography technique for arranging switching elements of an image display device with high area efficiency has been required. A large one-shot exposure apparatus, a stepper exposure apparatus, or the like is used in order to form switching elements over a large substrate with high accuracy.

Although a large one-shot exposure apparatus can expose a large area to light at a time, there is a problem in that variation in illuminance intensity or degree of parallelization is large. Therefore, a stepper exposure apparatus using an optical system is often used.

A region which is exposed to light at a time with a stepper exposure apparatus is limited. When light exposure is performed on an area which is larger than the region, light exposure is needed to be performed repeatedly with several shots.

In addition, instead of a silicon wafer which is manufactured by thinly slicing an ingot of a single-crystal semiconductor, a semiconductor substrate which is referred to as a silicon-on-insulator (an SOI substrate) in which a thin single-crystal semiconductor layer is provided over an insulating layer has been developed and has been spread as a substrate in manufacturing a microprocessor or the like. This is because an integrated circuit using an SOI substrate has attracted attention as a circuit which reduces parasitic capacitance between a drain of a transistor and the substrate, improves performance of a semiconductor integrated circuit, and reduces power consumption.

As a method for manufacturing an SOI substrate, a hydrogen ion implantation separation method is known (e.g., see Reference 1: U.S. Pat. No. 6,372,609). A hydrogen ion implantation separation method is a method in which hydrogen ions are implanted into a silicon wafer to form a microbubble layer at a predetermined depth from the surface of the silicon wafer and a thin silicon layer (an SOI layer) is bonded to another silicon wafer with the microbubble layer used as a cleavage plane. In addition to heat treatment for separating the SOI layer, it is necessary to remove an oxide film after the oxide film is formed over the SOI layer by heat treatment in an oxidizing atmosphere and then to perform heat treatment at 1000 to 1300° C. in a reducing atmosphere to increase bonding strength.

Meanwhile, a method for forming an SOI layer over an insulating substrate such as a glass substrate has been proposed. As an example of an SOI substrate where an SOI layer is formed over a glass substrate, a device where a thin single-crystal silicon layer is formed over a glass substrate having a coating film by using a hydrogen ion implantation separation method is known (see Reference 2: U.S. Pat. No. 7,119,365). Also in this case, hydrogen ions are implanted into a single-crystal silicon piece to form a microbubble layer at a predetermined depth from the surface of the single-crystal silicon piece, a glass substrate and the single-crystal silicon piece are attached to each other, and then a thin silicon layer (an SOI layer) is formed over the glass substrate by separating the single-crystal silicon piece with the microbubble layer used as a cleavage plane.

SUMMARY OF THE INVENTION

In order to separate a single-crystal silicon layer from a silicon wafer by a hydrogen ion implantation separation method, heat treatment at a high temperature of higher than or equal to 600° C. is needed. However, in the case where an SOI substrate is formed by bonding a single-crystal silicon layer to a glass substrate which is used in a liquid crystal panel or the like for cost reduction of the substrate, there is a problem in that heat treatment at such a high temperature causes a warp in the glass substrate. When the glass substrate warps, decrease in bonding strength between the glass substrate and the single-crystal silicon layer is concerned. In addition, there is also a problem in that strain stress is applied to the single-crystal silicon layer, so that characteristics of the transistor are adversely affected. That is, even when a single-crystal silicon layer is provided over a glass substrate and a transistor is manufactured using the single-crystal silicon layer, sufficient characteristics cannot be obtained with the conventional technique.

In addition, the shape of a glass substrate is rectangular and the size thereof is increased from 300×400 mm of the first generation in the early 1990s to 680×880 mm or 730×920 mm of the fourth generation in 2000.

On the other hand, the wafer size of a semiconductor substrate is limited because a semiconductor substrate is manufactured by forming an ingot of 20 to 30 cm in diameter by a Czochralski method (a CZ method), and slicing the ingot with a diamond blade or the like so that the slice has a thickness of approximately 0.5 to 1.5 mm to make one circle wafer.

Therefore, in the case of manufacturing an active matrix display device by using a glass substrate which is larger than a semiconductor substrate, a plurality of semiconductor substrates are used for one glass substrate. In this case, it is difficult to arrange the plurality of semiconductor substrates over the glass substrate with accurate alignment.

Accordingly, when a transistor is formed at a joint portion of a semiconductor, the transistor does not operate normally in some cases. Alternatively, when a transistor is formed at a joint portion of a semiconductor, a problem with current characteristics of the transistor occurs in some cases.

In view of the foregoing problems, it is an object of the present invention to provide a large semiconductor device, a large display device, or a manufacturing method thereof. Alternatively, it is an object of the present invention to provide a semiconductor device which easily operates normally, a display device which easily operates normally, or a manufacturing method thereof. Further alternatively, it is an object of the present invention to provide a semiconductor device having excellent current characteristics, a display device having excellent current characteristics, or a manufacturing method thereof.

Thus, a single-crystal semiconductor layer is extracted from a single-crystal semiconductor substrate and is fixed to an insulating substrate. Alternatively, a single-crystal semiconductor substrate is attached to an insulating substrate and the single-crystal semiconductor substrate is separated, so that a single-crystal semiconductor layer, which is part of the single-crystal semiconductor substrate, is fixed to the insulating substrate. Then, the single-crystal semiconductor layer is processed into an island shape. After that, the single-crystal semiconductor layer is extracted from the single-crystal semiconductor substrate again and is fixed to the insulating substrate. Alternatively, the single-crystal semiconductor substrate is attached to the insulating substrate and the single-crystal semiconductor substrate is separated, so that the single-crystal semiconductor layer, which is part of the single-crystal semiconductor substrate, is fixed to the insulating substrate. Then, the single-crystal semiconductor layer is processed into an island shape again.

Then, a TFT is formed over the insulating substrate by using such a single-crystal semiconductor layer.

The present invention is a method for manufacturing a semiconductor device, which includes first to fourth steps. The first step includes a step of providing a first single-crystal semiconductor layer over an insulating substrate. The second step includes a step of processing the first single-crystal semiconductor layer into an island shape. The third step includes a step of providing a second single-crystal semiconductor layer over the insulating substrate. The fourth step includes a step of processing the second single-crystal semiconductor layer into an island shape. The present invention further includes fifth to seventh steps. The fifth step includes a step of forming a gate insulating film. The sixth step includes a step of forming a conductive film above the gate insulating film. The seventh step includes a step of processing the conductive film into an island shape. Further, in the third step, the second single-crystal semiconductor layer is preferably provided over the insulating substrate so as to overlap with part of a region where the first single-crystal semiconductor layer is provided.

Alternatively, the present invention is a method for manufacturing a semiconductor device, which includes first to fourth steps. The first step includes a step of providing a first single-crystal semiconductor layer and a second single-crystal semiconductor layer over an insulating substrate. The second step includes a step of processing each of the first single-crystal semiconductor layer and the second single-crystal semiconductor layer into an island shape. The third step includes a step of providing a third single-crystal semiconductor layer over the insulating substrate. The fourth step includes a step of processing the third single-crystal semiconductor layer into an island shape. The present invention further includes fifth to seventh steps. The fifth step includes a step of forming a gate insulating film. The sixth step includes a step of forming a conductive film above the gate insulating film. The seventh step includes a step of processing the conductive film into an island shape. Further, in the third step, the third single-crystal semiconductor layer is preferably provided over the insulating substrate so as to overlap with part of a region where the first single-crystal semiconductor layer is provided and part of a region where the second single-crystal semiconductor layer is provided.

Alternatively, the present invention is a method for manufacturing a semiconductor device, which includes first to sixth steps. The first step includes a step of providing a first single-crystal semiconductor layer over an insulating substrate. The second step includes a step of processing the first single-crystal semiconductor layer into an island shape. The third step includes a step of providing a second single-crystal semiconductor layer over the insulating substrate. The fourth step includes a step of processing the second single-crystal semiconductor layer into an island shape. The fifth step includes a step of providing a third single-crystal semiconductor layer over the insulating substrate. The sixth step includes a step of processing the third single-crystal semiconductor layer into an island shape. The present invention further includes seventh to ninth steps. The seventh step includes a step of forming a gate insulating film. The eighth step includes a step of forming a conductive film above the gate insulating film. The ninth step includes a step of processing the conductive film into an island shape. Further, in the third step, the second single-crystal semiconductor layer is preferably provided over the insulating substrate so as to overlap with part of a region where the first single-crystal semiconductor layer is provided. In the fifth step, the third single-crystal semiconductor layer is preferably provided over the insulating substrate so as to overlap with part of a region where the first single-crystal semiconductor layer is provided and part of a region where the second single-crystal semiconductor layer is provided.

Alternatively, the present invention includes a display element and a semiconductor device manufactured by the method for manufacturing a semiconductor device, which is described in any of the above-described structures.

Alternatively, the present invention includes a light-emitting element and a semiconductor device manufactured by the method for manufacturing a semiconductor device, which is described in any of the above-described structures.

Note that various types of switches can be used as a switch. An electrical switch, a mechanical switch, and the like are given as examples. That is, any element can be used as long as it can control a current flow, without limiting to a certain element. For example, a transistor (e.g., a bipolar transistor or a MOS transistor), a diode (e.g., a PN diode, a PIN diode, a Schottky diode, an MIM (metal insulator metal) diode, an MIS (metal insulator semiconductor) diode, or a diode-connected transistor), a thyristor, or the like can be used as a switch. Alternatively, a logic circuit combining such elements can be used as a switch.

An example of a mechanical switch is a switch formed using MEMS (micro electro mechanical system) technology, such as a digital micromirror device (DMD). Such a switch includes an electrode which can be moved mechanically, and operates by controlling connection and non-connection based on movement of the electrode.

In the case of using a transistor as a switch, polarity (a conductivity type) of the transistor is not particularly limited because it operates just as a switch. However, a transistor of polarity with smaller off-current is preferably used when off-current is to be suppressed. Examples of a transistor with smaller off-current are a transistor provided with an LDD region, a transistor with a multi-gate structure, and the like. In addition, it is preferable that an N-channel transistor be used when a potential of a source terminal is closer to a potential of a low-potential-side power supply (e.g., $V_{ss}$, GND, or 0 V), while a P-channel transistor be used when the potential of the source terminal is closer to a potential of a high-potential-side power supply (e.g., $V_{dd}$). This is because the absolute value of gate-source voltage can be increased when the potential of the source terminal is closer to a potential of a low-potential-side power supply in an N-channel transistor and when the potential of the source terminal is closer to a potential of a high-potential-side power supply in a P-channel transistor, so that the transistor can be more precisely operated as a switch. This is also because the transistor does not often perform a source follower operation, so that reduction in output voltage does not often occur.

Note that a CMOS switch may be employed as a switch by using both N-channel and P-channel transistors. When a CMOS switch is employed, the switch can more precisely operate as a switch because current can flow when either the P-channel transistor or the N-channel transistor is turned on. For example, voltage can be appropriately output regardless of whether voltage of an input signal to the switch is high or low. In addition, since a voltage amplitude value of a signal for turning on or off the switch can be made smaller, power consumption can be reduced.

Note that when a transistor is used as a switch, the switch includes an input terminal (one of a source terminal and a drain terminal), an output terminal (the other of the source terminal and the drain terminal), and a terminal for controlling conduction (a gate terminal). On the other hand, when a diode is used as a switch, the switch does not have a terminal for controlling conduction in some cases. Therefore, when a diode is used as a switch, the number of wirings for controlling terminals can be reduced compared to the case of using a transistor as a switch.

Note that when it is explicitly described that "A and B are connected", the case where A and B are electrically connected, the case where A and B are functionally connected, and the case where A and B are directly connected are included therein. Here, each of A and B corresponds to an object (e.g., a device, an element, a circuit, a wiring, an electrode, a terminal, a conductive film, or a layer). Accordingly, another element may be interposed between elements having a connection relation shown in drawings and texts, without limiting to a predetermined connection relation, for example, the connection relation shown in the drawings and the texts.

For example, in the case where A and B are electrically connected, one or more elements which enable electric connection between A and B (e.g., a switch, a transistor, a capacitor, an inductor, a resistor, and/or a diode) may be provided between A and B. In addition, in the case where A and B are functionally connected, one or more circuits which enable functional connection between A and B (e.g., a logic circuit such as an inverter, a NAND circuit, or a NOR circuit, a signal converter circuit such as a DA converter circuit, an AD converter circuit, or a gamma correction circuit, a potential level converter circuit such as a power supply circuit (e.g., a boosting circuit or a voltage lower control circuit) or a level shifter circuit for changing a potential level of a signal, a voltage source, a current source, a switching circuit, or an amplifier circuit such as a circuit which can increase signal amplitude, the amount of current, or the like (e.g., an operational amplifier, a differential amplifier circuit, a source follower circuit, or a buffer circuit), a signal generating circuit, a memory circuit, and/or a control circuit) may be provided between A and B. Alternatively, in the case where A and B are directly connected, A and B may be directly connected without interposing another element or another circuit therebetween.

Note that when it is explicitly described that "A and B are directly connected", the case where A and B are directly connected (i.e., the case where A and B are connected without interposing another element or another circuit therebetween) and the case where A and B are electrically connected (i.e., the case where A and B are connected by interposing another element or another circuit therebetween) are included therein.

Note that when it is explicitly described that "A and B are electrically connected", the case where A and B are electrically connected (i.e., the case where A and B are connected by interposing another element or another circuit therebetween), the case where A and B are functionally connected (i.e., the case where A and B are functionally connected by interposing another circuit therebetween), and the case where A and B are directly connected (i.e., the case where A and B are connected without interposing another element or another circuit therebetween) are included therein. That is, when it is explicitly described that "A and B are electrically connected", the description is the same as the case where it is explicitly only described that "A and B are connected".

Note that a display element, a display device which is a device having a display element, a light-emitting element, and a light-emitting device which is a device having a light-emitting element can use various modes and can include various elements. As a display element or a light-emitting element, an EL (electroluminescence) element (e.g., an EL element including organic and inorganic materials, an organic EL element, or an inorganic EL element), an electron emitter, a liquid crystal element, electronic ink, an electrophoresis element, a grating light valve (GLV), a plasma display panel (PDP), a digital micromirror device (DMD), a piezoelectric ceramic display, or a carbon nanotube can be used, for example. Such an element is an element, whose contrast, luminance, reflectivity, transmittivity, or the like is changed by an electromagnetic action. Note that display devices using EL elements include an EL display; display devices using electron emitters include a field emission display (FED), an SED-type flat panel display (SED: surface-conduction electron-emitter display), and the like; display devices using liquid crystal elements include a liquid crystal display (e.g., a transmissive liquid crystal display, a transflective liquid crystal display, a reflective liquid crystal display, a direct-view liquid crystal display, or a projection liquid crystal display); and display devices using electronic ink or electrophoresis elements include electronic paper.

Note that an EL element is an element having an anode, a cathode, and an EL layer interposed between the anode and the cathode. Note that as an EL layer, a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer formed using an organic material, a layer formed using an inorganic material, a layer formed using an organic material and an inorganic material, a layer including a high-molecular material, a layer including a low molecular material, a layer including a low-molecular material and a high-molecular material, or the like can be used. Note that the present invention is not limited to this, and various EL elements can be used as an EL element.

Note that an electron emitter is an element in which electrons are extracted by high electric field concentration on a pointed cathode. For example, as an electron emitter, a Spindt type, a carbon nanotube (CNT) type, a metal-insulator-metal (MIM) type in which a metal, an insulator, and a metal are stacked, a metal-insulator-semiconductor (MIS) type in which a metal, an insulator, and a semiconductor are stacked, a MOS type, a silicon type, a thin film diode type, a diamond type, a surface conduction emitter SCD type, a thin film type in which a metal, an insulator, a semiconductor, and a metal are stacked, an HEED type, an EL type, a porous silicon type, a surface-conduction (SED) type, or the like can be used. However, the present invention is not limited to this, and various elements can be used as an electron emitter.

Note that a liquid crystal element is an element which controls transmission or non-transmission of light by optical modulation action of a liquid crystal and includes a pair of electrodes and a liquid crystal. Note that optical modulation action of a liquid crystal is controlled by an electric filed applied to the liquid crystal (including a horizontal electric field, a vertical electric field, and an oblique electric field). Note that the following can be used for a liquid crystal element: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a ferroelectric liquid crystal, an anti-ferroelectric liquid crystal, a main-chain liquid crystal, a side-chain high-molecular liquid crystal, a plasma addressed liquid crystal (PALC), a banana-shaped liquid crystal, and the like. In addition, the following can be used as a diving method of a liquid crystal: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optical compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, and the like. Note that the present invention is not limited to this, and various liquid crystal elements and driving methods can be used as a liquid crystal element and a driving method thereof.

Note that electronic paper corresponds to a device which displays an image by molecules which utilize optical anisotropy, dye molecular orientation, or the like; a device which displays an image by particles which utilize electrophoresis, particle movement, particle rotation, phase change, or the like; a device which displays an image by moving one end of a film; a device which displays an image by using coloring properties or phase change of molecules; a device which displays an image by using optical absorption by molecules; and a device which displays an image by using self-light emission by bonding electrons and holes. For example, the following can be used for a display method of electronic paper: microcapsule electrophoresis, horizontal electrophoresis, vertical electrophoresis, a spherical twisting ball, a magnetic twisting ball, a columnar twisting ball, a charged toner, electro liquid powder, magnetic electrophoresis, a magnetic thermosensitive type, an electrowetting type, a light-scattering (transparent-opaque change) type, a cholesteric liquid crystal and a photoconductive layer, a cholesteric liquid crystal device, a bistable nematic liquid crystal, a ferroelectric liquid crystal, a liquid crystal dispersed type with a dichroic dye, a movable film, coloring and decoloring properties of a leuco dye, a photochromic material, an electrochromic material, an electrodeposition material, flexible organic EL, and the like. Note that the present invention is not limited to this, and various electronic paper and display methods can be used as electronic paper and a display method thereof. Here, when microcapsule electrophoresis is used, defects of electrophoresis, which are aggregation and precipitation of phoresis particles, can be solved. Electro liquid powder has advantages such as high-speed response, high reflectivity, wide viewing angle, low power consumption, and memory properties.

Note that a plasma display panel has a structure in which a substrate having a surface provided with an electrode and a substrate having a surface provided with an electrode and a minute groove in which a phosphor layer is formed face each other at a narrow interval and a rare gas is sealed therein. Note that display can be performed by applying voltage between the electrodes to generate an ultraviolet ray so that a phosphor emits light. Note that the plasma display panel may be a DC-type PDP or an AC-type PDP. As a driving method of the plasma display panel, AWS (address while sustain) driving, ADS (address display separated) driving in which a subframe is divided into a reset period, an address period, and a sustain period, CLEAR (high-contrast, low energy address and reduction of false contour sequence) driving, ALIS (alternate lighting of surfaces) method, TERES (technology of reciprocal sustainer) driving, or the like can be used. Note that the present invention is not limited to this, and various driving methods can be used as a driving method of a plasma display panel.

Note that electroluminescence, a cold cathode fluorescent lamp, a hot cathode fluorescent lamp, an LED, a laser light source, a mercury lamp, or the like can be used as a light source of a display device in which a light source is necessary, such as a liquid crystal display (a transmissive liquid crystal display, a transflective liquid crystal display, a reflective liquid crystal display, a direct-view liquid crystal display, or a projection liquid crystal display), a display device using a grating light valve (GLV), or a display device using a digital micromirror device (DMD). Note that the present invention is not limited to this, and various light sources can be used as a light source.

Note that various types of transistors can be used as a transistor, without limiting to a certain type. For example, a thin film transistor (TFT) including a non-single crystal semiconductor film typified by amorphous silicon, polycrystalline silicon, microcrystalline (also referred to as semi-amorphous) silicon, or the like can be used. In the case of using the TFT, there are various advantages. For example, since the TFT can be formed at temperature lower than that of the case of using single-crystal silicon, manufacturing cost can be reduced or a manufacturing apparatus can be made larger. Since the manufacturing apparatus is made larger, the TFT can be formed using a large substrate. Therefore, many display devices can be formed at the same time at low cost. In addition, a substrate having low heat resistance can be used because of low manufacturing temperature. Therefore, the transistor can be formed using a light-transmitting substrate. Accordingly, transmission of light in a display element can be controlled by using the transistor formed using the light-transmitting substrate. Alternatively, part of a film which forms the transistor can transmit light because the film thickness of the transistor is thin. Therefore, the aperture ratio can be improved.

Note that when a catalyst (e.g., nickel) is used in the case of forming polycrystalline silicon, crystallinity can be further improved and a transistor having excellent electric characteristics can be formed. Accordingly, a gate driver circuit (e.g., a scan line driver circuit), a source driver circuit (e.g., a signal line driver circuit), and/or a signal processing circuit (e.g., a signal generation circuit, a gamma correction circuit, or a DA converter circuit) can be formed over the same substrate as a pixel portion.

Note that when a catalyst (e.g., nickel) is used in the case of forming microcrystalline silicon, crystallinity can be further improved and a transistor having excellent electric characteristics can be formed. At this time, crystallinity can be improved by just performing heat treatment without performing laser irradiation. Accordingly, a gate driver circuit (e.g., a scan line driver circuit) and part of a source driver circuit (e.g., an analog switch) can be formed over the same substrate. In addition, in the case of not performing laser irradiation for crystallization, crystallinity unevenness of silicon can be suppressed. Therefore, a high-quality image can be displayed.

Note that polycrystalline silicon and microcrystalline silicon can be formed without using a catalyst (e.g., nickel).

Note that it is preferable that crystallinity of silicon be improved to polycrystal, microcrystal, or the like in the whole panel; however, the present invention is not limited to this. Crystallinity of silicon may be improved only in part of the panel. Selective increase in crystallinity can be achieved by selective laser irradiation or the like. For example, only a peripheral driver circuit region excluding pixels may be irradiated with laser light. Alternatively, only a region of a gate driver circuit, a source driver circuit, or the like may be irradiated with laser light. Further alternatively, only part of a source driver circuit (e.g., an analog switch) may be irradiated with laser light. Accordingly, crystallinity of silicon can be improved only in a region in which a circuit needs to be operated at high speed. Since a pixel region is not particularly needed to be operated at high speed, even if crystallinity is not improved, the pixel circuit can be operated without problems. Since a region, crystallinity of which is improved, is small, manufacturing steps can be decreased, throughput can be increased, and manufacturing cost can be reduced. Since the number of necessary manufacturing apparatus is small, manufacturing cost can be reduced.

A transistor can be formed by using a semiconductor substrate, an SOI substrate, or the like. Thus, a transistor with few variations in characteristics, sizes, shapes, or the like, with high current supply capacity, and with a small size can be formed. When such a transistor is used, power consumption of a circuit can be reduced or a circuit can be highly integrated.

A transistor including a compound semiconductor or an oxide semiconductor such as ZnO, a-InGaZnO, SiGe, GaAs, indium zinc oxide (IZO), indium tin oxide (ITO), or SnO, a thin film transistor obtained by thinning such a compound semiconductor or a oxide semiconductor, or the like can be used. Thus, manufacturing temperature can be lowered and for example, such a transistor can be formed at room temperature. Accordingly, the transistor can be formed directly on a substrate having low heat resistance, such as a plastic substrate or a film substrate. Note that such a compound semiconductor or an oxide semiconductor can be used for not only a channel portion of the transistor but also other applications. For example, such a compound semiconductor or an oxide semiconductor can be used as a resistor, a pixel electrode, or a light-transmitting electrode. Further, since such an element can be formed at the same time as the transistor, cost can be reduced.

A transistor formed by using an inkjet method or a printing method, or the like can be used. Accordingly, a transistor can be formed at room temperature, can be formed at a low vacuum, or can be formed using a large substrate. In addition, since the transistor can be formed without using a mask (a reticle), a layout of the transistor can be easily changed. Further, since it is not necessary to use a resist, material cost is reduced and the number of steps can be reduced. Furthermore, since a film is formed only in a necessary portion, a material is not wasted compared with a manufacturing method in which etching is performed after the film is formed over the entire surface, so that cost can be reduced.

A transistor including an organic semiconductor or a carbon nanotube, or the like can be used. Accordingly, such a transistor can be formed using a substrate which can be bent. Therefore, a device using a transistor including an organic semiconductor or a carbon nanotube, or the like can resist a shock.

Further, transistors with various structures can be used. For example, a MOS transistor, a junction transistor, a bipolar transistor, or the like can be used as a transistor. When a MOS transistor is used, the size of the transistor can be reduced. Thus, a large number of transistors can be mounted. When a bipolar transistor is used, large current can flow. Thus, a circuit can be operated at high speed.

Note that a MOS transistor, a bipolar transistor, and the like may be formed over one substrate. Thus, reduction in power consumption, reduction in size, high speed operation, and the like can be realized.

Furthermore, various transistors can be used.

Note that a transistor can be formed using various types of substrates without limiting to a certain type. For example, a single-crystal semiconductor substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate. Alternatively, a skin (e.g., epidermis or corium) or hypodermal tissue of an animal such as a human being can be used as a substrate. Further alternatively, the transistor may be formed using one substrate, and then, the transistor may be transferred to another substrate. A single-crystal semiconductor substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate to which the transistor is transferred. Alternatively, a skin (e.g., epidermis or corium) or hypodermal tissue of an animal such as a human being can be used as a substrate to which the transistor is transferred. Further alternatively, the transistor may be formed using one substrate and the substrate may be thinned by polishing. A single-crystal semiconductor substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate to be polished. Alternatively, a skin (e.g., epidermis or corium) or hypodermal tissue of an animal such as a human being can be used as a substrate to be polished. When such a substrate is used, a transistor with excellent properties or a transistor with low power consumption can be formed, a device with high durability, high heat resistance can be provided, or reduction in weight or thickness can be achieved.

Note that the structure of a transistor can be various modes without limiting to a certain structure. For example, a multi-gate structure having two or more gate electrodes may be used. When the multi-gate structure is used, a structure where a plurality of transistors are connected in series is provided because channel regions are connected in series. With the multi-gate structure, off-current can be reduced or the withstand voltage of the transistor can be increased to improve reliability. Alternatively, with the multi-gate structure, drain-source current does not fluctuate very much even if drain-source voltage fluctuates when the transistor operates in a saturation region, so that a flat slope of voltage-current characteristics can be obtained. When the flat slope of the voltage-current characteristics is utilized, an ideal current source circuit or an active load having an extremely high resistance value can be realized. Accordingly, a differential circuit or a current mirror circuit having excellent properties can be realized.

As another example, a structure where gate electrodes are formed above and below a channel can be used. When the structure where gate electrodes are formed above and below the channel is used, a channel region is increased, so that the amount of current flowing therethrough can be increased or a depletion layer can be easily formed to decrease subthreshold swing. When the gate electrodes are formed above and below the channel, a structure where a plurality of transistors are connected in parallel is provided.

A structure where a gate electrode is formed above a channel region, a structure where a gate electrode is formed below a channel region, a staggered structure, an inversely staggered structure, a structure where a channel region is divided into a plurality of regions, or a structure where channel regions are connected in parallel or in series can be used. Alternatively, a structure where a source electrode or a drain electrode overlaps with a channel region (or part of it) can be used. When the structure where the source electrode or the drain electrode overlaps with the channel region (or part of it) is used, the case can be prevented in which charge is accumulated in part of the channel region, which would result in an unstable operation. Further alternatively, a structure where an LDD region is provided can be used. When the LDD region is provided, off-current can be reduced or the withstand voltage of the transistor can be increased to improve reliability. Further, when the LDD region is provided, drain-source current does not fluctuate very much even if drain-source voltage fluctuates when the transistor operates in the saturation region, so that a flat slope of voltage-current characteristics can be obtained.

Note that various types of transistors can be used as a transistor and the transistor can be formed using various types of substrates. Accordingly, all the circuits that are necessary to realize a predetermined function can be formed using the same substrate. For example, all the circuits that are necessary to realize the predetermined function can be formed using a glass substrate, a plastic substrate, a single-crystal semiconductor substrate, an SOI substrate, or any other substrate. When all the circuits that are necessary to realize the predetermined function are formed using the same substrate, cost can be reduced by reduction in the number of component parts or reliability can be improved by reduction in the number of connections to circuit components. Alternatively, part of the circuits which are necessary to realize the predetermined function can be formed using one substrate and another part of the circuits which are necessary to realize the predetermined function can be formed using another substrate. That is, not all the circuits that are necessary to realize the predetermined function are required to be formed using the same substrate. For example, part of the circuits which are necessary to realize the predetermined function is formed by transistors using a glass substrate and another part of the circuits which are necessary to realize the predetermined function is formed using a single-crystal semiconductor substrate, so that an IC chip formed by a transistor using the single-crystal semiconductor substrate can be connected to the glass substrate by COG (chip on glass) and the IC chip can be provided over the glass substrate. Alternatively, the IC chip can be connected to the glass substrate by TAB (tape automated bonding) or a printed wiring board. When part of the circuits are formed using the same substrate in this manner, cost can be reduced by reduction in the number of component parts or reliability can be improved by reduction in the number of connections to circuit components. Further alternatively, when circuits with high driving voltage and high driving frequency, which consume large power, are formed using a single-crystal semiconductor substrate instead of forming such circuits using the same substrate and an IC chip formed by the circuit is used, increase in power consumption can be prevented.

Note that one pixel corresponds to one element whose brightness can be controlled. Therefore, for example, one pixel corresponds to one color element and brightness is expressed with the one color element. Accordingly, in the case of a color display device having color elements of R (red), G (green), and B (blue), a minimum unit of an image is formed of three pixels of an R pixel, a G pixel, and a B pixel. Note that the color elements are not limited to three colors, and color elements of more than three colors may be used or a color other than RGB may be used. For example, RGBW (W corresponds to white) can be used by adding white. Alternatively, one or more colors of yellow, cyan, magenta emerald green, vermilion, and the like can be added to RGB. Further alternatively, a color similar to at least one of R, Q and B can be added to RGB. For example, R, G, B1, and B2 may be used. Although both B1 and B2 are blue, they have slightly different frequency. Similarly, R1, R2, G, and B can be used. When such color elements are used, display which is closer to the real object can be performed and power consumption can be reduced. As another example, in the case of controlling brightness of one color element by using a plurality of regions, one region can correspond to one pixel. Therefore, for example, in the case of performing area ratio gray scale display or the case of including a subpixel, a plurality of regions which control brightness are provided in each color element and gray scales are expressed with the whole regions. In this case, one region which controls brightness can correspond to one pixel. Thus, in that case, one color element includes a plurality of pixels. Alternatively, even when the plurality of regions which control brightness are provided in one color element, these regions may be collected as one pixel. Thus, in that case, one color element includes one pixel. In that case, one color element includes one pixel. Further alternatively, in the case where brightness is controlled in a plurality of regions in each color element, regions which contribute to display have different area dimensions depending on pixels in some cases. Further alternatively, in the plurality of regions which control brightness in each color element, signals supplied to each of the plurality of regions may be slightly varied to widen a viewing angle. That is, potentials of pixel electrodes included in the plurality of regions provided in each color element can be different from each other. Accordingly, voltage applied to liquid crystal molecules are varied depending on the pixel electrodes. Therefore, the viewing angle can be widened.

Note that explicit description "one pixel (for three colors)" corresponds to the case where three pixels of R, G, and B are considered as one pixel. Meanwhile, explicit description "one pixel (for one color)" corresponds to the case where the plurality of regions are provided in each color element and collectively considered as one pixel.

Note that pixels are provided (arranged) in matrix in some cases. Here, description that pixels are provided (arranged) in matrix includes the case where the pixels are arranged in a straight line and the case where the pixels are arranged in a jagged line, in a longitudinal direction or a lateral direction. Thus, for example, in the case of performing full color display with three color elements (e.g., RGB), the following cases are included therein: the case where the pixels are arranged in stripes and the case where dots of the three color elements are arranged in a delta pattern. In addition, the case is also included therein in which dots of the three color elements are provided in Bayer arrangement. Note that the color elements are not limited to three colors, and color elements of more than three colors may be used. For example, RGBW (W corresponds to white), RGB plus one or more of yellow, cyan, and magenta, or the like may be used. Further, the sizes of display regions may be different between respective dots of color elements. Thus, power consumption can be reduced or the life of a display element can be prolonged.

Note that an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, an MIM (metal insulator metal), a TFD (thin film diode), or the like can also be used. Since such an element has few number of manufacturing steps, manufacturing cost can be reduced or yield can be improved. Further, since the size of the element is small, the aperture ratio can be improved, so that power consumption can be reduced or high luminance can be achieved.

Note that as a method other than an active matrix method, a passive matrix method in which an active element (a non-linear element) is not used can also be used. Since an active element (a non-linear element) is not used, manufacturing steps is few, so that manufacturing cost can be reduced or yield can be improved. Further, since an active element (a non-linear element) is not used, the aperture ratio can be improved, so that power consumption can be reduced or high luminance can be achieved.

Note that a transistor is an element having at least three terminals of a gate, a drain, and a source. The transistor has a channel region between a drain region and a source region, and current can flow through the drain region, the channel region, and the source region. Here, since the source and the drain of the transistor change depending on the structure, the operating condition, and the like of the transistor, it is difficult to define which is a source or a drain. Therefore, in this document, a region functioning as a source and a drain may not be called the source or the drain. In such a case, one of the source and the drain may be referred to as a first terminal and the other thereof may be referred to as a second terminal, for example. Alternatively, one of the source and the drain may be referred to as a first electrode and the other thereof may be referred to as a second electrode. Further alternatively, one of the source and the drain may be referred to as a source region and the other thereof may be called a drain region.

Note that a transistor may be an element having at least three terminals of a base, an emitter, and a collector. In this case, one of the emitter and the collector may be similarly referred to as a first terminal and the other terminal may be referred to as a second terminal.

Note that a gate corresponds to all or part of a gate electrode and a gate wiring (also referred to as a gate line, a gate signal line, a scan line, a scan signal line, or the like). A gate electrode corresponds to a conductive film which overlaps with a semiconductor which forms a channel region with a gate insulating film interposed therebetween. Note that part of the gate electrode overlaps with an LDD (lightly doped drain) region or the source region (or the drain region) with the gate insulating film interposed therebetween in some cases. A gate wiring corresponds to a wiring for connecting a gate electrode of each transistor to each other, a wiring for connecting a gate electrode of each pixel to each other, or a wiring for connecting a gate electrode to another wiring.

However, there is a portion (a region, a conductive film, a wiring, or the like) which functions as both a gate electrode and a gate wiring. Such a portion (a region, a conductive film, a wiring, or the like) may be referred to as either a gate electrode or a gate wiring. That is, there is a region where a gate electrode and a gate wiring cannot be clearly distinguished from each other. For example, in the case where a channel region overlaps with part of an extended gate wiring, the overlapped portion (region, conductive film, wiring, or the like) functions as both a gate wiring and a gate electrode. Accordingly, such a portion (a region, a conductive film, a wiring, or the like) may be referred to as either a gate electrode or a gate wiring.

Note that a portion (a region, a conductive film, a wiring, or the like) which is formed using the same material as a gate electrode, forms the same island as the gate electrode, and is connected to the gate electrode may also be referred to as a gate electrode. Similarly, a portion (a region, a conductive film, a wiring, or the like) which is formed using the same material as a gate wiring, forms the same island as the gate wiring, and is connected to the gate wiring may also be referred to as a gate wiring. In a strict detect, such a portion (a region, a conductive film, a wiring, or the like) does not overlap with a channel region or does not have a function of connecting the gate electrode to another gate electrode in some cases. However, there is a portion (a region, a conductive film, a wiring, or the like) which is formed using the same material as a gate electrode or a gate wiring, forms the same island as the gate electrode or the gate wiring, and is connected to the gate electrode or the gate wiring because of specifications or the like in manufacturing. Thus, such a portion (a region, a conductive film, a wiring, or the like) may also be referred to as either a gate electrode or a gate wiring.

Note that in a multi-gate transistor, for example, a gate electrode is often connected to another gate electrode by using a conductive film which is formed using the same material as the gate electrode. Since such a portion (a region, a conductive film, a wiring, or the like) is a portion (a region, a conductive film, a wiring, or the like) for connecting the gate electrode to another gate electrode, it may be referred to as a gate wiring, and it may also be referred to as a gate electrode because a multi-gate transistor can be considered as one transistor. That is, a portion (a region, a conductive film, a wiring, or the like) which is formed using the same material as a gate electrode or a gate wiring, forms the same island as the gate electrode or the gate wiring, and is connected to the gate electrode or the gate wiring may be referred to as either a gate electrode or a gate wiring. In addition, for example, part of a conductive film which connects the gate electrode and the gate wiring and is formed using a material which is different from that of the gate electrode or the gate wiring may also be referred to as either a gate electrode or a gate wiring.

Note that a gate terminal corresponds to part of a portion (a region, a conductive film, a wiring, or the like) of a gate electrode or a portion (a region, a conductive film, a wiring, or the like) which is electrically connected to the gate electrode.

Note that when a wiring is referred to as a gate wiring, a gate line, a gate signal line, a scan line, a scan signal line, there is the case in which a gate of a transistor is not connected to a wiring. In this case, the gate wiring, the gate line, the gate signal line, the scan line, or the scan signal line corresponds to a wiring formed in the same layer as the gate of the transistor, a wiring formed using the same material of the gate of the transistor, or a wiring formed at the same time as the gate of the transistor in some cases. As examples, there are a wiring for a storage capacitor, a power supply line, a reference potential supply line, and the like.

Note that a source corresponds to all or part of a source region, a source electrode, and a source wiring (also referred to as a source line, a source signal line, a data line, a data signal line, or the like). A source region corresponds to a semiconductor region including a large amount of p-type impurities (e.g., boron or gallium) or n-type impurities (e.g., phosphorus or arsenic). Therefore, a region including a small amount of p-type impurities or n-type impurities, namely, an LDD (lightly doped drain) region is not included in the source region. A source electrode is part of a conductive layer which is formed using a material different from that of a source region and is electrically connected to the source region. However, there is the case where a source electrode and a source region are collectively referred to as a source electrode. A source wiring is a wiring for connecting a source electrode of each transistor to each other, a wiring for connecting a source electrode of each pixel to each other, or a wiring for connecting a source electrode to another wiring.

However, there is a portion (a region, a conductive film, a wiring, or the like) functioning as both a source electrode and a source wiring. Such a portion (a region, a conductive film, a wiring, or the like) may be referred to as either a source electrode or a source wiring. That is, there is a region where a source electrode and a source wiring cannot be clearly distinguished from each other. For example, in the case where a source region overlaps with part of an extended source wiring, the overlapped portion (region, conductive film, wiring, or the like) functions as both a source wiring and a source electrode. Accordingly, such a portion (a region, a conductive film, a wiring, or the like) may be referred to as either a source electrode or a source wiring.

Note that a portion (a region, a conductive film, a wiring, or the like) which is formed using the same material as a source electrode, forms the same island as the source electrode, and is connected to the source electrode, or a portion (a region, a conductive film, a wiring, or the like) which connects a source electrode and another source electrode may also be referred to as a source electrode. Further, a portion which overlaps with a source region may be referred to as a source electrode. Similarly, a portion (a region, a conductive film, a wiring, or the like) which is formed using the same material as a source wiring, forms the same island as the source wiring, and is connected to the source wiring may also be referred to as a source wiring. In a strict sense, such a portion (a region, a conductive film, a wiring, or the like) does not have a function of connecting the source electrode to another source electrode in some cases. However, there is a portion (a region, a conductive film, a wiring, or the like) which is formed using the same material as a source electrode or a source wiring, forms the same island as the source electrode or the source wiring, and is connected to the source electrode or the source wiring because of specifications or the like in manufacturing. Thus, such a portion (a region, a conductive film, a wiring, or the like) may also be referred to as either a source electrode or a source wiring.

For example, part of a conductive film which connects a source electrode and a source wiring and is formed using a material which is different from that of the source electrode or the source wiring may be referred to as either a source electrode or a source wiring.

Note that a source terminal corresponds to part of a source region, a source electrode, or a portion (a region, a conductive film, a wiring, or the like) which is electrically connected to the source electrode.

Note that when a wiring is referred to as a source wiring, a source line, a source signal line, a data line, a data signal line, there is the case in which a source (a drain) of a transistor is not connected to a wiring. In this case, the source wiring, the source line, the source signal line, the data line, or the data signal line corresponds to a wiring formed in the same layer as the source (the drain) of the transistor, a wiring formed using the same material of the source (the drain) of the transistor, or a wiring formed at the same time as the source (the drain) of the transistor in some cases. As examples, there are a wiring for a storage capacitor, a power supply line, a reference potential supply line, and the like.

Note that the same can be said for a drain.

Note that a semiconductor device corresponds to a device having a circuit including a semiconductor element (e.g., a transistor, a diode, or a thyristor). The semiconductor device may also correspond to all devices that can function by utilizing semiconductor characteristics. In addition, the semiconductor device corresponds to a device having a semiconductor material.

Note that a display element corresponds to an optical modulation element, a liquid crystal element, a light-emitting element, an EL element (an organic EL element, an inorganic EL element, or an EL element including organic and inorganic materials), an electron emitter, an electrophoresis element, a discharging element, a light-reflective element, a light diffraction element, a digital micromirror device (DMD), or the like. Note that the present invention is not limited to this.

Note that a display device corresponds to a device having a display element. The display device may include a plurality of pixels each having a display element. Note that that the display device may also include a peripheral driver circuit for driving the plurality of pixels. The peripheral driver circuit for driving the plurality of pixels may be formed over the same substrate as the plurality of pixels. The display device may also include a peripheral driver circuit provided over a substrate by wire bonding or bump bonding, namely, an IC chip connected by chip on glass (COG) or an IC chip connected by TAB or the like. Further, the display device may also include a flexible printed circuit (FPC) to which an IC chip, a resistor, a capacitor, an inductor, a transistor, or the like is attached. Note that the display device includes a printed wiring board (PWB) which is connected through a flexible printed circuit (FPC) and to which an IC chip, a resistor, a capacitor, an inductor, a transistor, or the like is attached. The display device may also include an optical sheet such as a polarizing plate or a retardation plate. The display device may also include a lighting device, a housing, an audio input and output device, a light sensor, or the like. Here, a lighting device such as a backlight unit may include a light guide plate, a prism sheet, a diffusion sheet, a reflective sheet, a light source (e.g., an LED or a cold cathode fluorescent lamp), a cooling device (e.g., a water cooling device or an air cooling device), or the like.

Note that a lighting device corresponds to a device having a backlight unit, a light guide plate, a prism sheet, a diffusion sheet, a reflective sheet, or a light source (e.g., an LED, a cold cathode fluorescent lamp, or a hot cathode fluorescent lamp), a cooling device, or the like.

Note that a light-emitting device corresponds to a device having a light-emitting element and the like. In the case of including a light-emitting element as a display element, the light-emitting device is one of specific examples of a display device.

Note that a reflective device corresponds to a device having a light-reflective element, a light diffraction element, light-reflective electrode, or the like.

Note that a liquid crystal display device corresponds to a display device including a liquid crystal element. Liquid crystal display devices include a direct-view liquid crystal display, a projection liquid crystal display, a transmissive liquid crystal display, a reflective liquid crystal display, a transflective liquid crystal display, and the like.

Note that a driving device corresponds to a device having a semiconductor element, an electric circuit, or an electronic circuit. For example, a transistor which controls input of a signal from a source signal line to a pixel (also referred to as a selection transistor, a switching transistor, or the like), a transistor which supplies voltage or current to a pixel electrode, a transistor which supplies voltage or current to a light-emitting element, and the like are examples of the driving device. A circuit which supplies a signal to a gate signal line (also referred to as a gate driver, a gate line driver circuit, or the like), a circuit which supplies a signal to a source signal line (also referred to as a source driver, a source line driver circuit, or the like) are also examples of the driving device.

Note that a display device, a semiconductor device, a lighting device, a cooling device, a light-emitting device, a reflective device, a driving device, and the like overlap with each other in some cases. For example, a display device includes a semiconductor device and a light-emitting device in some cases. Alternatively, a semiconductor device includes a display device and a driving device in some cases.

Note that when it is explicitly described that "B is formed on A" or "B is formed over A", it does not necessarily mean that B is formed in direct contact with A. The description includes the case where A and B are not in direct contact with each other, i.e., the case where another object is interposed between A and B. Here, each of A and B corresponds to an object (e.g., a device, an element, a circuit, a wiring, an electrode, a terminal, a conductive film, or a layer).

Accordingly, for example, when it is explicitly described that "a layer B is formed on (or over) a layer A", it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., a layer C or a layer D) may be a single layer or a plurality of layers.

Similarly, when it is explicitly described that "B is formed above A", it does not necessarily mean that B is formed in direct contact with A, and another object may be interposed therebetween. Thus, for example, when it is described that "a layer B is formed above a layer A", it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., a layer C or a layer D) may be a single layer or a plurality of layers.

Note that when it is explicitly described that "B is formed in direct contact with A", it includes not the case where another object is interposed between A and B but the case where B is formed in direct contact with A.

Note that the same can be said when it is described that B is formed below or under A.

Note that when an object is explicitly described in a singular form, the object is preferably singular. Note that the present invention is not limited to this, and the object can be plural. Similarly, when an object is explicitly described in a plural form, the object is preferably plural. Note that the present invention is not limited to this, and the object can be singular.

A large semiconductor device or a large display device can be manufactured. Alternatively, a semiconductor device which easily operates normally or a display device which easily operates normally can be manufactured. Further alternatively, a semiconductor device having excellent current characteristics or a display device having excellent current characteristics can be manufactured.

BRIEF DESCRIPTION OF THE DRAWINGS

In the accompanying drawings:

FIG. 21 is a cross-sectional view illustrating a liquid crystal display device of the present invention;

DETAILED DESCRIPTION OF THE INVENTION

Figure 1A:
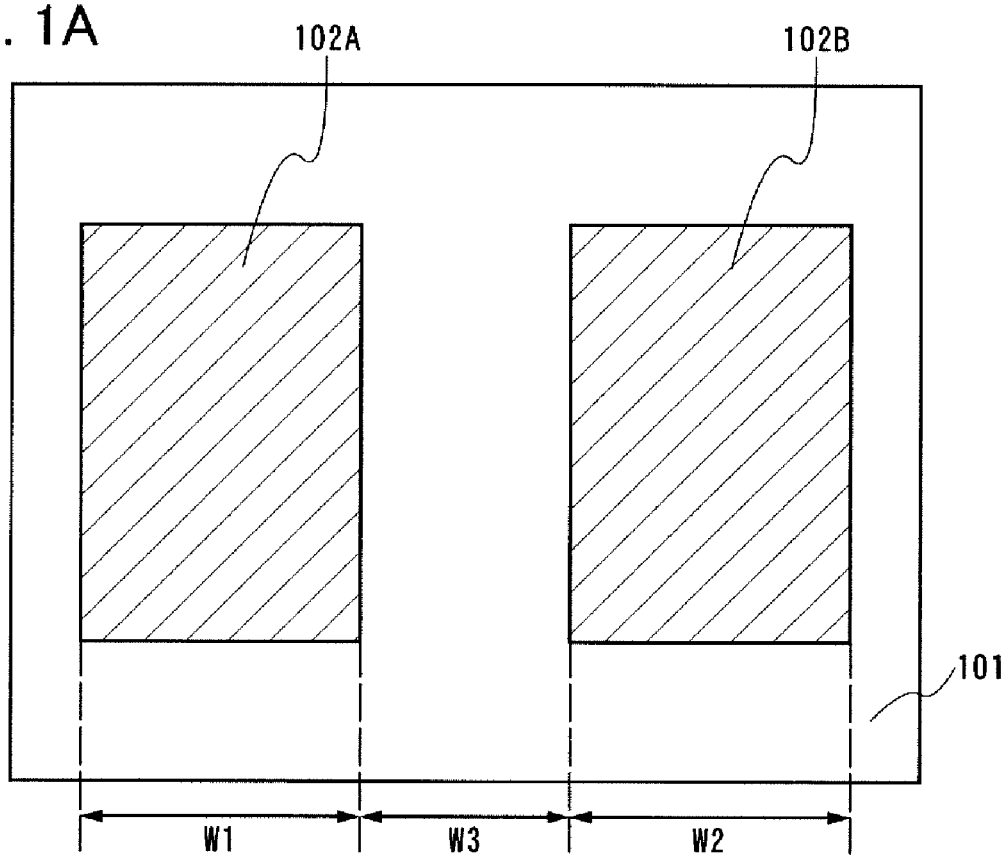
FIGS. 1A and 1B illustrate a method for manufacturing a semiconductor device of the present invention.

Hereinafter, the present invention will be described by way of embodiment modes with reference to the drawings. Note that the present invention can be implemented in various different ways and it will be readily appreciated by those skilled in the art that various changes and modifications are possible without departing from the spirit and the scope of the present invention. Therefore, the present invention should not be construed as being limited to the description of the embodiment modes of the present invention. Note that in structures of the present invention described hereinafter, like portions or portions having similar functions are denoted by common reference numerals in different drawings, and detailed description thereof is omitted.

Embodiment Mode 1

All or part of a semiconductor device or a display device is formed using a TFT which is formed over an insulating substrate by extracting a single-crystal semiconductor layer from a single-crystal semiconductor substrate and fixing the single-crystal semiconductor layer to the insulating substrate, or a TFT which is formed over an insulating substrate by attaching a single-crystal semiconductor substrate to the insulating substrate and fixing a single-crystal semiconductor layer which is part of the single-crystal semiconductor substrate to the insulating substrate by separating the single-crystal semiconductor substrate. Note that a TFT which is formed over an insulating substrate by extracting a single-crystal semiconductor layer from a single-crystal semiconductor substrate and fixing the single-crystal semiconductor layer to the insulating substrate, or a TFT which is formed over an insulating substrate by attaching a single-crystal semiconductor substrate to the insulating substrate and fixing a single-crystal semiconductor layer which is part of the single-crystal semiconductor substrate to the insulating substrate by separating the single-crystal semiconductor substrate is hereinafter referred to as a single-crystal TFT.

When a plurality of single-crystal semiconductor substrates are used for one insulating substrate, a semiconductor device or a display device can be manufactured over an insulating substrate which is larger than the single-crystal semiconductor substrate.

In the present invention, when a plurality of single-crystal semiconductor layers are attached to an insulating substrate, the plurality of single-crystal semiconductor layers are provided over the insulating substrate so as not to be in close contact with each other but to be spaced apart from each other, as shown in FIG. 1A. A single-crystal semiconductor layer 102A and a single-crystal semiconductor layer 102B are provided over an insulating substrate 101.

Note that a method for providing single-crystal semiconductor layers over the insulating substrate 101 or a method for forming a transistor or the like by using the provided single-crystal semiconductor layers is described in another embodiment mode.

Note that although the insulating substrate over which single-crystal semiconductor layers are provided is preferably a glass substrate, the present invention is not limited to this. The single-crystal semiconductor layers can be provided over any of various substrates such as a plastic substrate, a film substrate, a stainless steel substrate, and a stainless steel foil substrate.

Note that an insulating film or the like may be formed over the substrate over which single-crystal semiconductor layers are provided. For example, a silicon nitride film, a silicon oxide film, or the like may be formed over the insulating substrate. In addition, the single-crystal semiconductor layers may be provided over such a film.

Note that although single-crystal silicon is preferable as materials of the single-crystal semiconductor substrate and the single-crystal semiconductor layers, the present invention is not limited to this. For example, instead of single-crystal silicon, various single-crystal semiconductor materials or various materials including a single-crystal semiconductor material, such as gallium arsenide, germanium, and indium phosphide, can be used.

The single-crystal semiconductor layer 102A and the single-crystal semiconductor layer 102B are spaced apart from each other. Here, the width of the single-crystal semiconductor layer 102A is denoted by W1, the width of the single-crystal semiconductor layer 102B is denoted by W2, and the interval between the single-crystal semiconductor layer 102A and the single-crystal semiconductor layer 102B is denoted by W3. In that case, W3 is preferably equal to or narrower than W1. Alternatively, W3 is preferably equal to or narrower than W2.

Figure 1B:
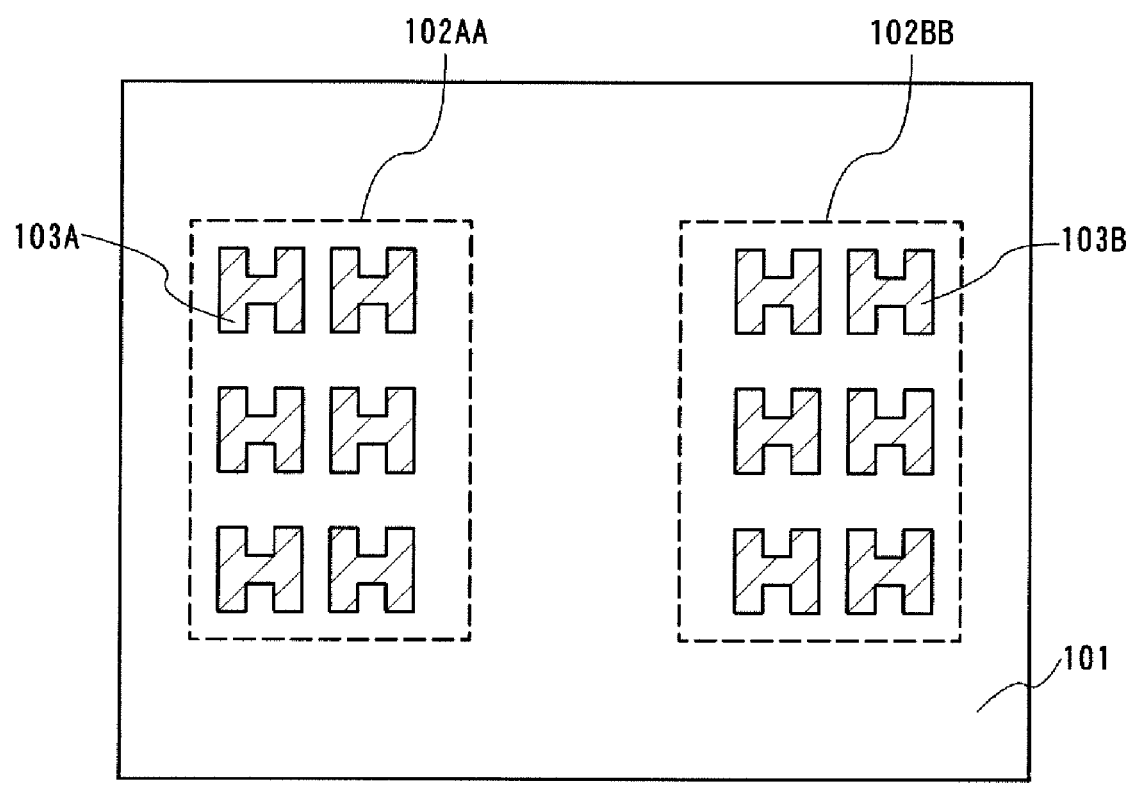

Next, as shown in FIG. 1B, unnecessary portions of the single-crystal semiconductor layer 102A and the single-crystal semiconductor layer 102B are removed by etching so that the single-crystal semiconductor layer 102A and the single-crystal semiconductor layer 102B have predetermined shapes. That is, the single-crystal semiconductor layer 102A and the single-crystal semiconductor layer 102B are processed into island shapes. In other words, the single-crystal semiconductor layer 102A and the single-crystal semiconductor layer 102B are patterned. Then, an island-shaped single-crystal semiconductor layer 103A is obtained in a region 102AA where the single-crystal semiconductor layer 102A is provided, and an island-shaped single-crystal semiconductor layer 103B is obtained in a region 102BB where the single-crystal semiconductor layer 102B is provided. A transistor, a diode, a resistor, and the like are formed by using the island-shaped single-crystal semiconductor layers. In a transistor, the island-shaped single-crystal semiconductor layer functions as an active layer.

Figure 2A:
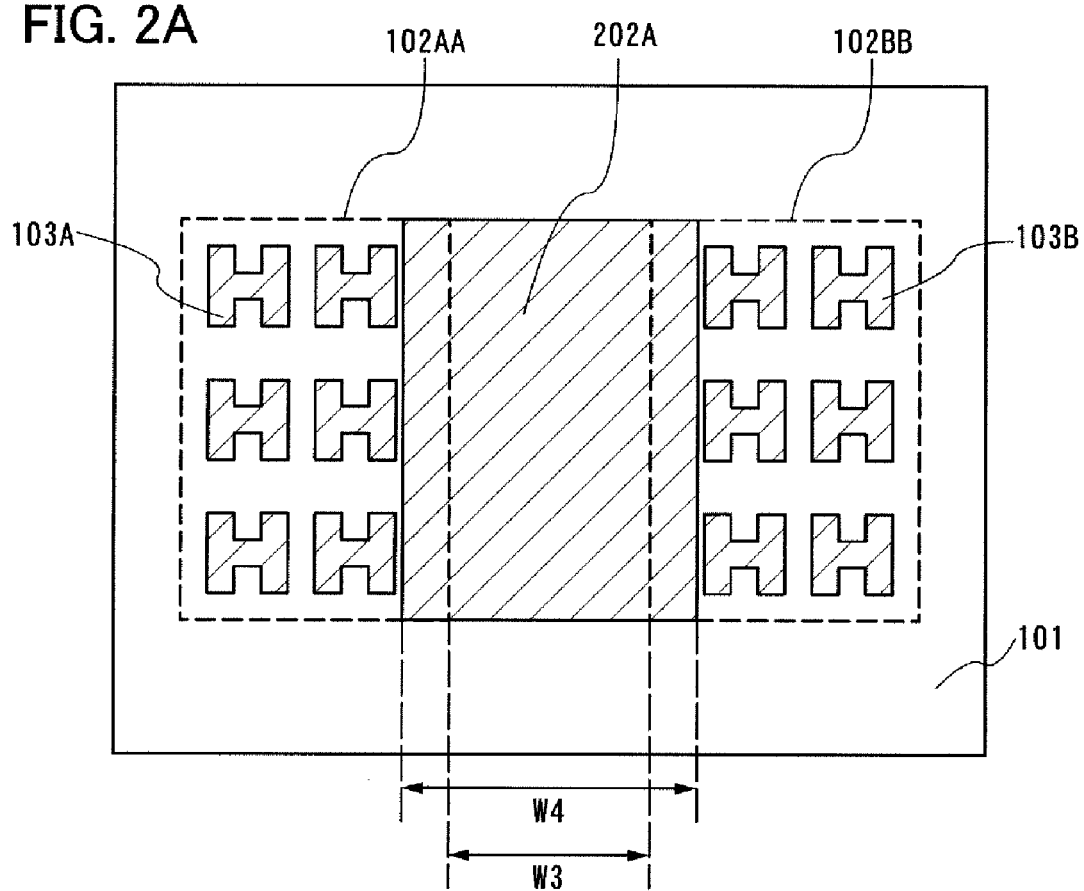
FIGS. 2A and 2B illustrate a method for manufacturing a semiconductor device of the present invention.

Next, as shown in FIG. 2A, a single-crystal semiconductor layer 202A is provided between the region where the single-crystal semiconductor layer 102A is provided and the region where the single-crystal semiconductor layer 102B is provided. Here, the width of the single-crystal semiconductor layer 202A is denoted by W4. In that case, W4 is preferably almost equal to or wider than W3. Alternatively, W4 is preferably almost equal to or wider than W1. Further alternatively, W4 is preferably almost equal to or wider than W2. When the single-crystal semiconductor layer 202A is provided so as to overlap with part of the region 102AA and part of the region 102BB in this manner, a transistor can be provided even at a joint portion where the single-crystal semiconductor layers are provided.

Note that description "almost equal" is used in consideration of a manufacturing error, manufacturing variation, or the like. Therefore, variation of 10% or less, preferably 5% or less is included.

Here, when W4 is almost equal to W1, the single-crystal semiconductor layers can be provided by using single-crystal semiconductor substrates having the same size. Therefore, since it is not necessary to prepare single-crystal semiconductor layers having a particular size, manufacturing can be performed easily.

Similarly, when W4 is almost equal to W2, the single-crystal semiconductor layers can be provided by using single-crystal semiconductor substrates having the same size. Therefore, since it is not necessary to prepare single-crystal semiconductor layers having a particular size, manufacturing can be performed easily.

Further, since the single-crystal semiconductor layer 102A and the single-crystal semiconductor layer 102B have already been formed into island shapes when the single-crystal semiconductor layer 202A is provided, an extra single-crystal semiconductor layer is removed. Therefore, even when W4 is wider than W3, the single-crystal semiconductor layer 202A can be provided so as to overlap with part of the region 102AA and part of the region 102BB.

Note that although the single-crystal semiconductor layer 202A is provided so as to overlap with part of the region 102AA and part of the region 102BB, the present invention is not limited to this. For example, the single-crystal semiconductor layer 202A can be provided so as to overlap with all the region 102AA and all the region 102BB, or can be provided so as not to overlap with the region 102AA and the region 102BB completely.

Further, when there is a defect in the single-crystal semiconductor layer 103A or the single-crystal semiconductor layer 103B, the single-crystal semiconductor layer 103A or the single-crystal semiconductor layer 103B can be recovered by providing the single-crystal semiconductor layer 202A.

Figure 2B:
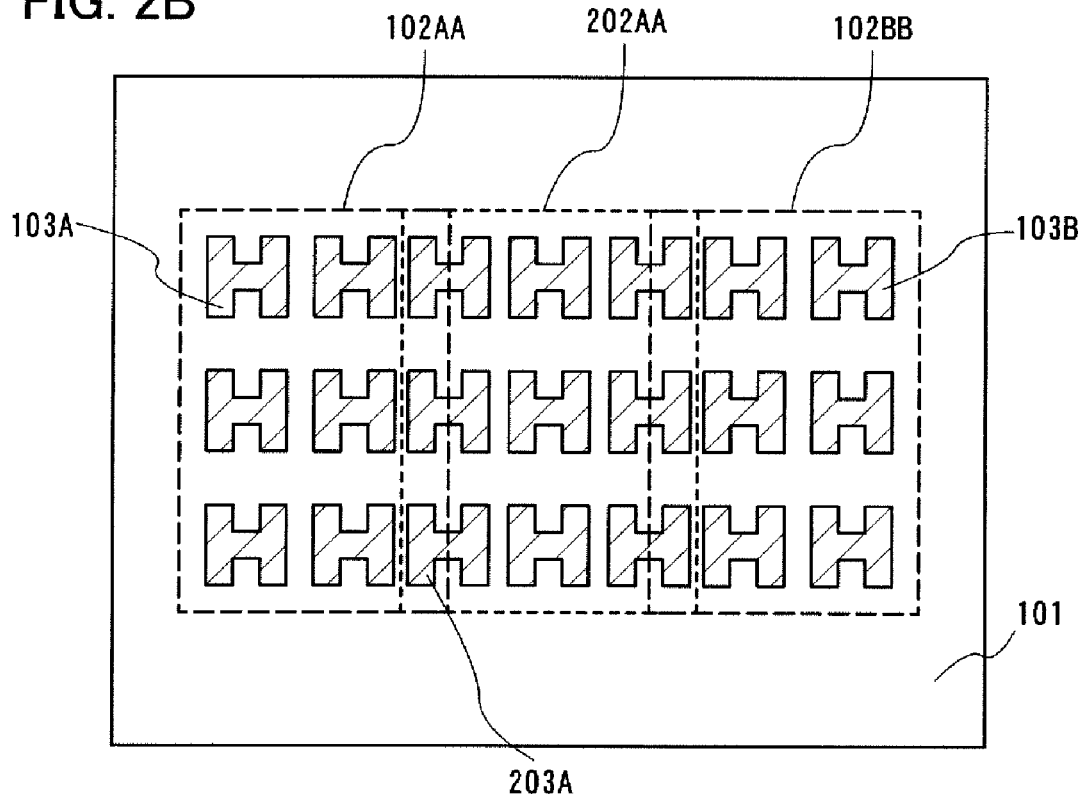

Next, as shown in FIG. 2B, unnecessary portions of the single-crystal semiconductor layer 202A are removed by etching so that the single-crystal semiconductor layer 202A has a predetermined shape. That is, the single-crystal semiconductor layer 202A is processed into an island shape. In other words, the single-crystal semiconductor layer 202A is patterned. Then, an island-shaped single-crystal semiconductor layer 203A is obtained in a region 202AA where the single-crystal semiconductor layer 202A is provided.

At this time, when W4 is wider than W3, the single-crystal semiconductor layer 203A can be formed in a portion where the region 102AA and the region 202AA overlap with each other and a portion where the region 102BB and the region 202AA overlap with each other. That is, a transistor can be provided across the portion where the region 102AA and the region 202AA overlap with each other, or the portion where the region 102BB and the region 202AA overlap with each other. Thus, a transistor which does not operate normally or a transistor having a problem in current characteristics is not formed even at a joint portion of a semiconductor.

Various elements such as a transistor, a diode, and a resistor can be formed by using the island-shaped single-crystal semiconductor layers formed as described above. As an example, the case where a transistor and the like are formed is described in another embodiment mode.

Figure 3A:
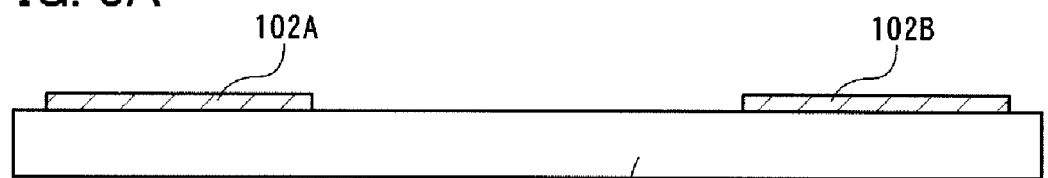
FIGS. 3A to 3D illustrate a method for manufacturing a semiconductor device of the present invention.
Figure 3B:
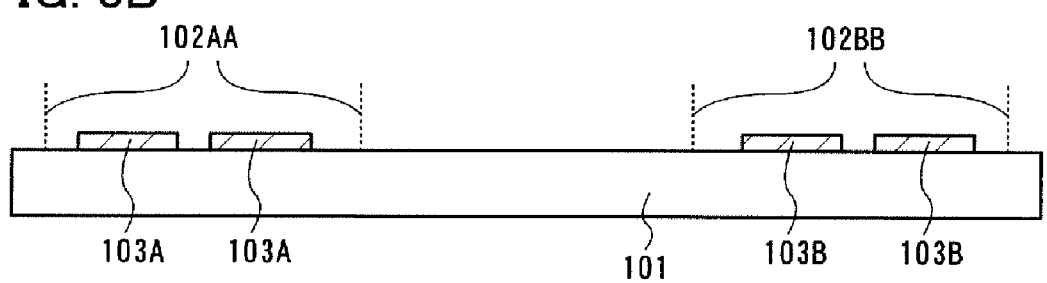
Figure 3C:
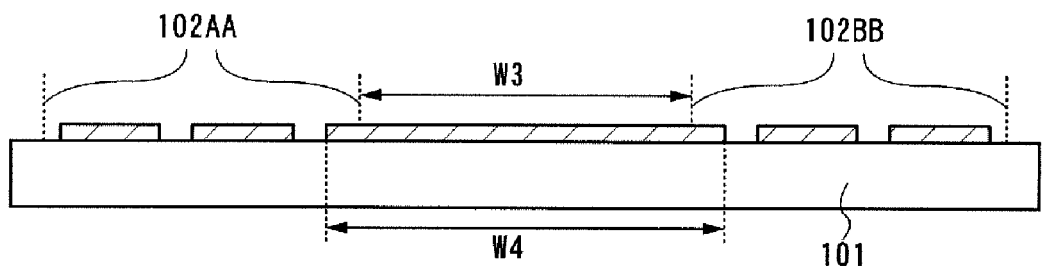
Figure 3D:
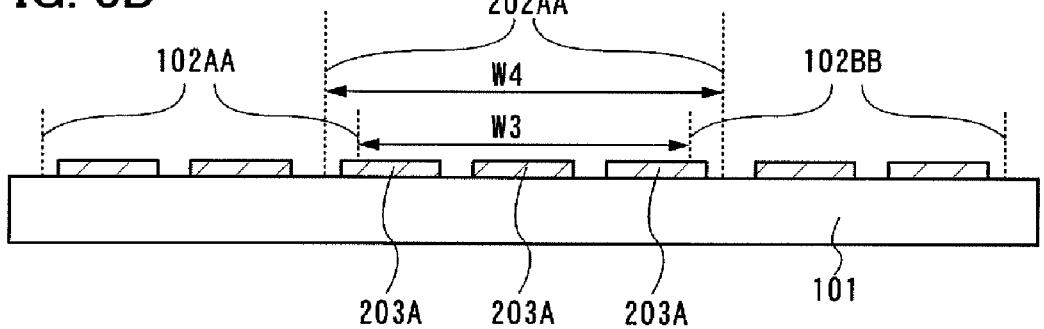

Next, FIGS. 3A to 3D are cross-sectional views of the steps shown in FIGS. 1A and 1B and FIGS. 2A and 2B. FIG. 3A is a cross-sectional view of FIG. 1A. FIG. 3B is a cross-sectional view of FIG. 1B. FIG. 3C is a cross-sectional view of FIG. 2A. FIG. 3D is a cross-sectional view of FIG. 2B.

Note that although one single-crystal semiconductor layer (the single-crystal semiconductor layer 202A) is provided after two single-crystal semiconductor layers (the single-crystal semiconductor layer 102A and the single-crystal semiconductor layer 102B) are provided, the number of single-crystal semiconductor layers to be provided each time is not limited to this. For example, after one single-crystal semiconductor layer is provided and patterned, one single-crystal semiconductor layer may be provided. Alternatively, a plurality of single-crystal semiconductor layers are provided and patterned, a plurality of single-crystal semiconductor layers may be provided.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 2

In this embodiment mode, an example is shown in which arrangement which is different from that in Embodiment Mode 1 is performed.

Figure 4A:
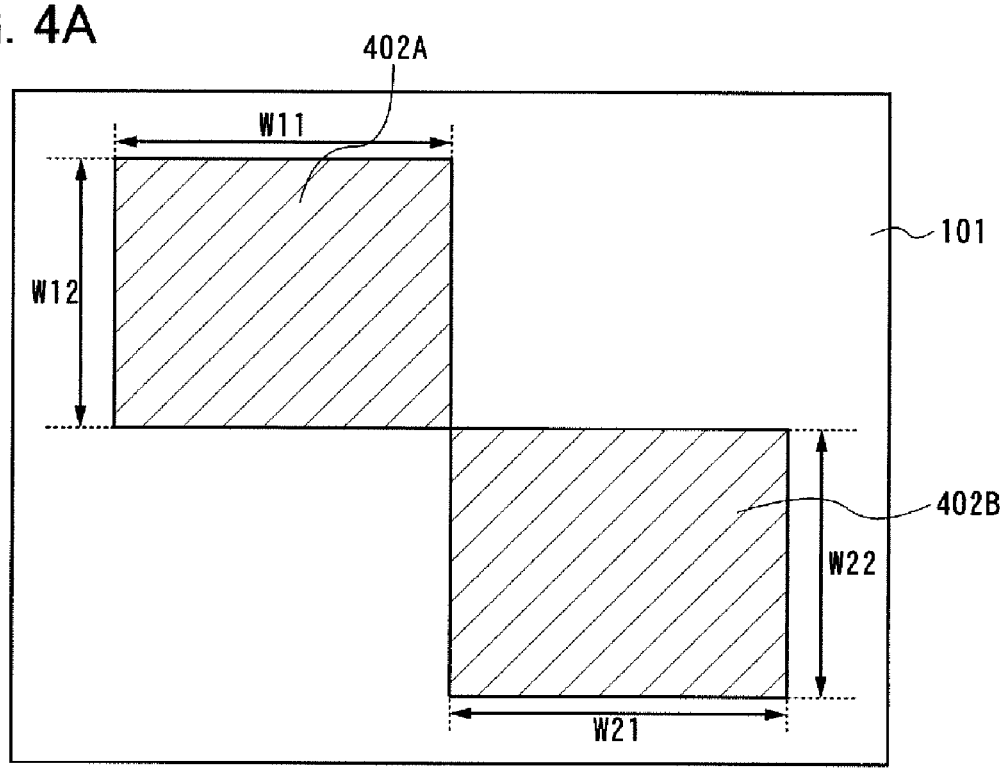
FIGS. 4A and 4B illustrate a method for manufacturing a semiconductor device of the present invention.
Figure 4B:
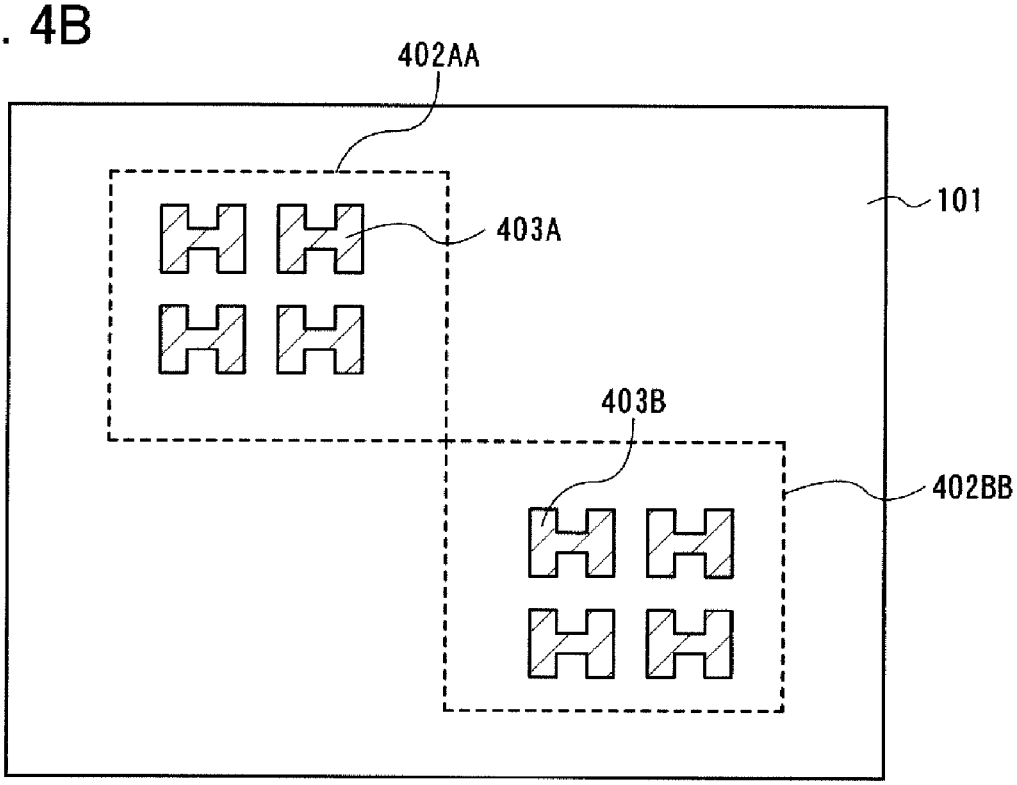

FIGS. 4A and 4B show the case where four single-crystal semiconductor layers are provided. Note that the number of single-crystal semiconductor layers is not limited to four. As shown in FIG. 4A, a single-crystal semiconductor layer 402A and a single-crystal semiconductor layer 402B, which are displaced obliquely, are provided over the insulating substrate 101.

Note that a lower-right portion of the single-crystal semiconductor layer 402A in the diagram and an upper-left portion in the single-crystal semiconductor layer 402B in the diagram are closely provided. Note that the present invention is not limited to this. The lower-right portion of the single-crystal semiconductor layer 402A in the diagram and the upper-left portion in the single-crystal semiconductor layer 402B in the diagram may be spaced apart from each other.

Here, the lateral length of the single-crystal semiconductor layer 402A is denoted by W11 and the longitudinal length of the single-crystal semiconductor layer 402A is denoted by W12. Similarly, the lateral length of the single-crystal semiconductor layer 402B is denoted by W21 and the longitudinal length of the single-crystal semiconductor layer 402B is denoted by W22.

Next, as shown in FIG. 4B, unnecessary portions of the single-crystal semiconductor layer 402A and the single-crystal semiconductor layer 402B are removed by etching so that the single-crystal semiconductor layer 402A and the single-crystal semiconductor layer 402B have predetermined shapes. That is, the single-crystal semiconductor layer 402A and the single-crystal semiconductor layer 402B are processed into island shapes. In other words, the single-crystal semiconductor layer 402A and the single-crystal semiconductor layer 402B are patterned. Then, an island-shaped single-crystal semiconductor layer 403A is obtained in a region 402AA where the single-crystal semiconductor layer 402A is provided, and an island-shaped single-crystal semiconductor layer 403B is obtained in a region 402BB where the single-crystal semiconductor layer 402B is provided.

Figure 5A:
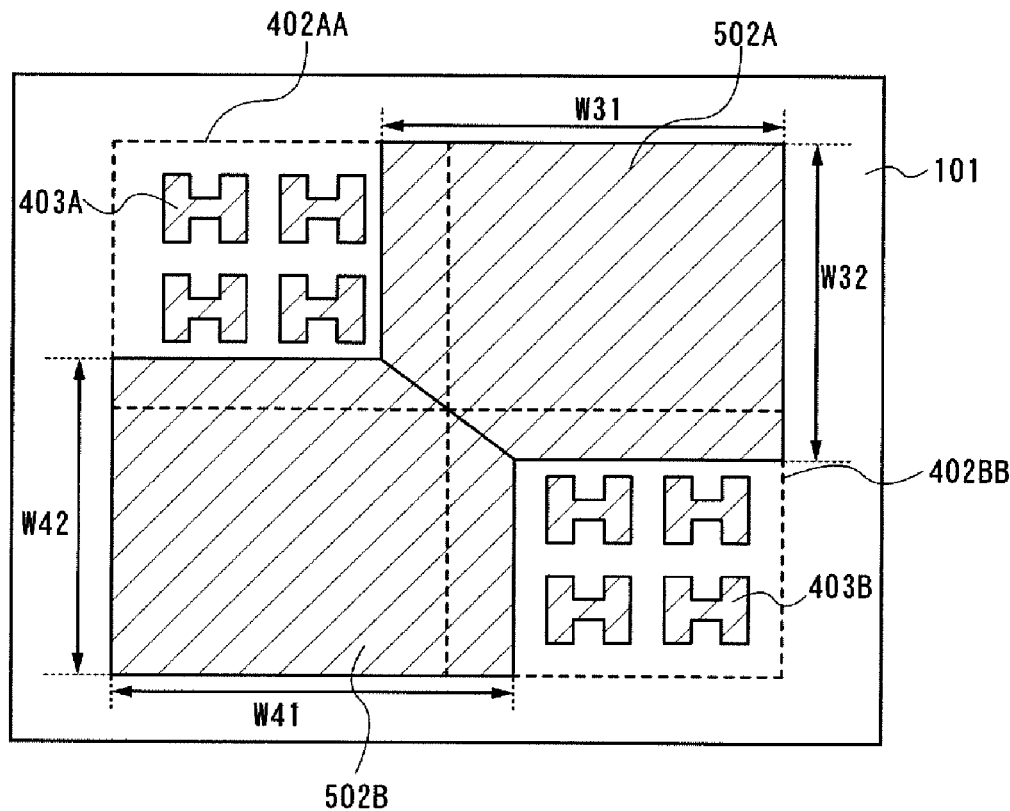
FIGS. 5A and 5B illustrate a method for manufacturing a semiconductor device of the present invention.

Next, as shown in FIG. 5A, a single-crystal semiconductor layer 502A is provided on the right side of the region where the single-crystal semiconductor layer 402A is provided, and a single-crystal semiconductor layer 502B is provided on the left side of the region where the single-crystal semiconductor layer 402B is provided.

Here, it is preferable that part of a lower-left corner of the single-crystal semiconductor layer 502A in the diagram be cut off. Note that the shape of the single-crystal semiconductor layer 502A is not limited to this, and can be similar to the shape of the single-crystal semiconductor layer 402A or the like. Similarly, it is preferable that part of an upper-right corner of the single-crystal semiconductor layer 502B in the diagram be cut off. Note that the shape of the single-crystal semiconductor layer 502B is not limited to this, and can be similar to the shape of the single-crystal semiconductor layer 402A or the like.

Here, the lateral length of the single-crystal semiconductor layer 502A is denoted by W31 and the longitudinal length of the single-crystal semiconductor layer 502A is denoted by W32. Similarly, the lateral length of the single-crystal semiconductor layer 502B is denoted by W41 and the longitudinal length of the single-crystal semiconductor layer 502B is denoted by W42.

In that case, W31 is preferably almost equal to or longer than W21. Alternatively, W32 is preferably almost equal to or longer than W12. Alternatively, W41 is preferably almost equal to or longer than W11. Alternatively, W42 is preferably almost equal to or longer than W22. When the single-crystal semiconductor C layer 502A and the single-crystal semiconductor layer 502B are provided so as to overlap with part of the region 402AA and part of the region 402BB in this manner, a transistor can be provided even at a joint portion where the single-crystal semiconductor layers are provided.

At this time, since the single-crystal semiconductor layer 402A and the single-crystal semiconductor layer 402B have already been formed into island shapes, an extra single-crystal semiconductor layer is removed. Therefore, even when each side of the single-crystal semiconductor layer 502A or the single-crystal semiconductor layer 502B is long, the single-crystal semiconductor layer 502A and the single-crystal semiconductor layer 502B can be provided so as to overlap with part of the region 402AA and part of the region 402BB.

Further, when a corner of the single-crystal semiconductor layer 502A is cut off, the single-crystal semiconductor layer 502A can be provided without overlapping with the single-crystal semiconductor layer 502B even when W31 is longer than W21 or W32 is longer than W12. Similarly, the single-crystal semiconductor layer 502B can be provided without overlapping with the single-crystal semiconductor layer 502A even when W41 is longer than W11 or W42 is longer than W22.

Note that although the single-crystal semiconductor layer 502A and the single-crystal semiconductor layer 502B are provided so as to overlap with part of the region 402AA and part of the region 402BB, the present invention is not limited to this. For example, the single-crystal semiconductor layer 502A and the single-crystal semiconductor layer 502B can be provided so as to overlap with all the region 402AA and all the region 402BB, or can be provided so as not to overlap with the region 402AA and the region 402BB completely.

Further, when there is a defect in the single-crystal semiconductor layer 403A or the single-crystal semiconductor layer 403B, the single-crystal semiconductor layer 403A or the single-crystal semiconductor layer 403B can be recovered by providing the single-crystal semiconductor layer 502A and the single-crystal semiconductor layer 502B.

Figure 5B:
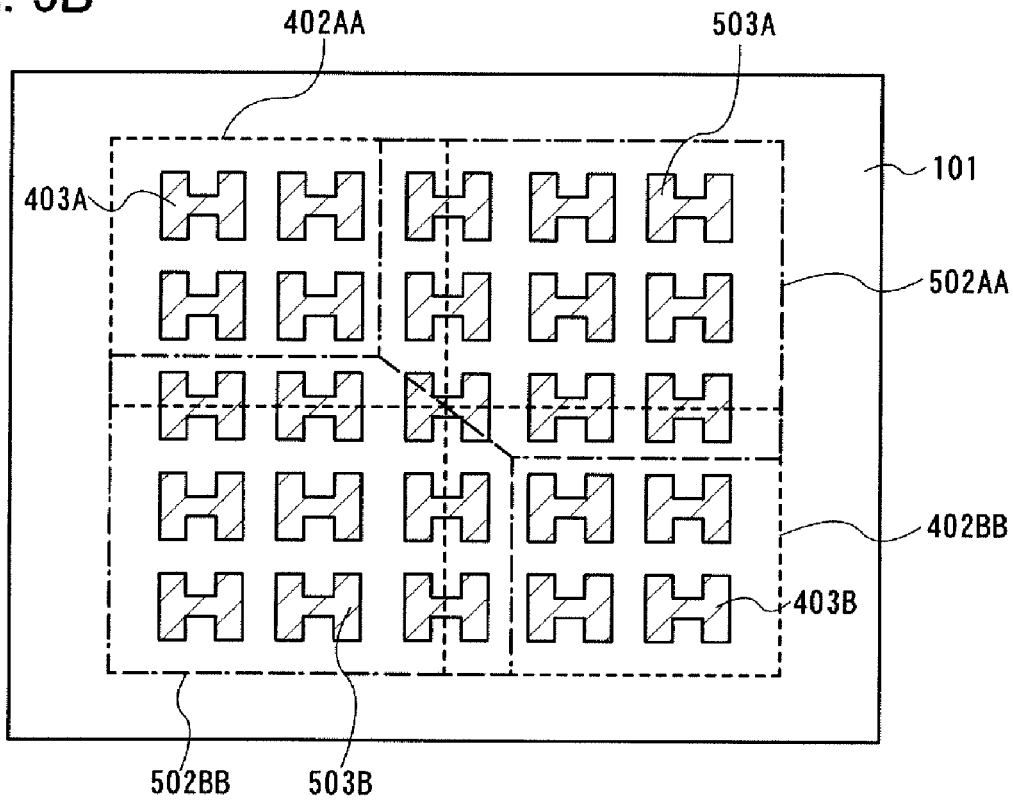

Next, as shown in FIG. 5B, unnecessary portions of the single-crystal semiconductor layer 502A and the single-crystal semiconductor layer 502B are removed by etching so that the single-crystal semiconductor layer 502A and the single-crystal semiconductor layer 502B have predetermined shapes. That is, the single-crystal semiconductor layer 502A and the single-crystal semiconductor layer 502B are processed into island shapes. Then, an island-shaped single-crystal semiconductor layer 503A is obtained in a region 502AA where the single-crystal semiconductor layer 502A is provided, and an island-shaped single-crystal semiconductor layer 503B is obtained in a region 502BB where the single-crystal semiconductor layer 502B is provided.

At this time, when W31 is longer than W21, a transistor can also be formed in a boundary portion between the single-crystal semiconductor layer 502B and another single-crystal semiconductor layer. That is, a transistor can be provided across a portion where the region 502AA and the region 402AA overlap with each other. The single-crystal semiconductor layer 503A is also formed in the portion where the region 502AA and the region 402AA overlap with each other.

Similarly, when W32 is longer than W12, a transistor can be provided across a portion where the region 502AA and the region 402BB overlap with each other. Alternatively, when W41 is longer than W11, a transistor can be provided across a portion where the region 502BB and the region 402AA overlap with each other. Alternatively, when W42 is longer than W22, a transistor can be provided across a portion where the region 502BB and the region 402BB overlap with each other.

Various elements such as a transistor, a diode, and a resistor can be formed by using the island-shaped single-crystal semiconductor layers formed as described above.

Note that although patterning is performed after the single-crystal semiconductor layer 502A and the single-crystal semiconductor layer 502B are provided in FIGS. 5A and 5B, the present invention is not limited to this.

Figure 6A:
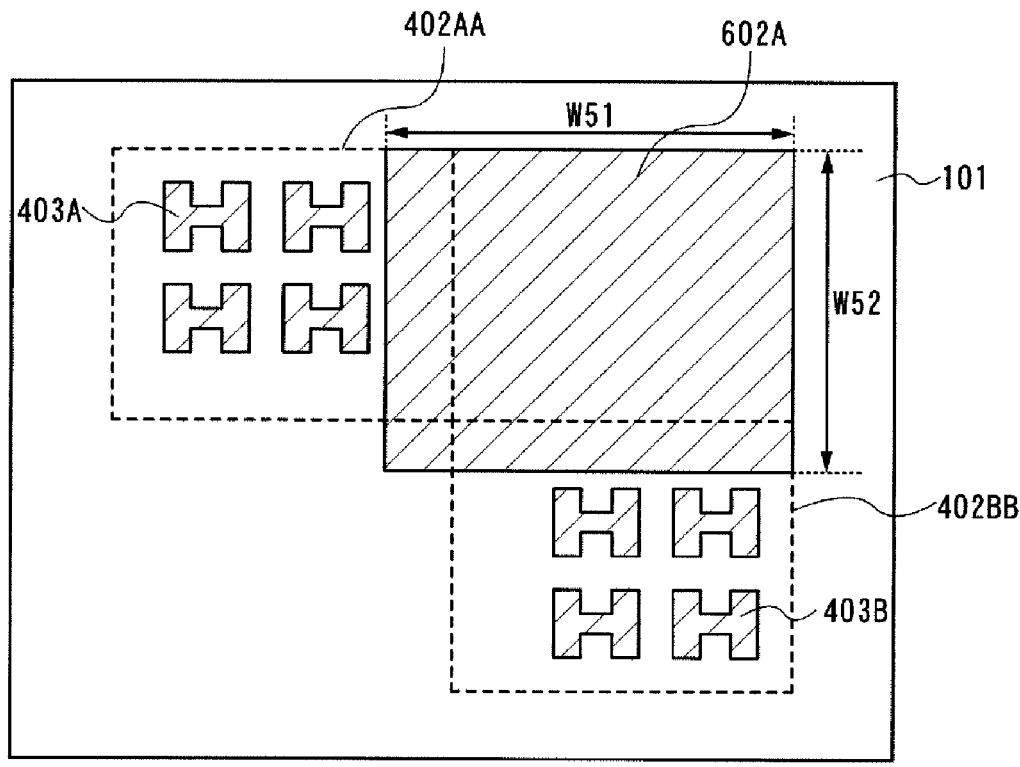
FIGS. 6A and 6B illustrate a method for manufacturing a semiconductor device of the present invention.
Figure 6B:
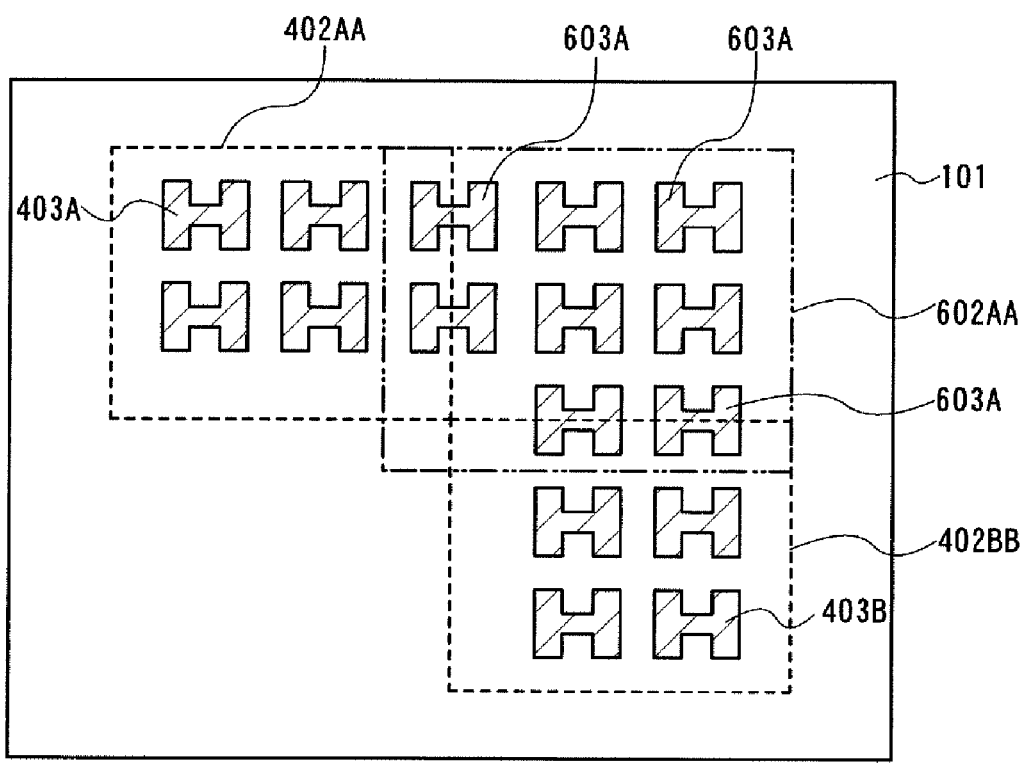

FIGS. 6A and 6B show an example in which a single-crystal semiconductor layer 602A is provided and patterned after the single-crystal semiconductor layer 402A and the single-crystal semiconductor layer 402B are patterned, and then a single-crystal semiconductor layer 602B is provided and patterned.

After the steps in FIGS. 4A and 4B, the single-crystal semiconductor layer 602A is provided on the right side of the region where the single-crystal semiconductor layer 402A is provided or the upper side of the region where the single-crystal semiconductor layer 402B is provided, as shown in FIG. 6A. Here, the lateral width of the single-crystal semiconductor layer 602A is denoted by W51 and the longitudinal width of the single-crystal semiconductor layer 602A is denoted by W52.

In that case, W51 is preferably almost equal to or longer than W21. Alternatively, W52 is preferably almost equal to or longer than W12. With such arrangement, a transistor can be provided even at a joint portion where the single-crystal semiconductor layers are provided.

At this time, since the single-crystal semiconductor layer 402A and the single-crystal semiconductor layer 402B have already been formed into island shapes, an extra single-crystal semiconductor layer is removed. Therefore, even when each side of the single-crystal semiconductor layer 602A is long, the single-crystal semiconductor layer 602A can be provided so as to overlap with part of the region 402AA and part of the region 402BB.

Note that although the single-crystal semiconductor layer 602A is provided so as to overlap with part of the region 402AA and part of the region 402BB, the present invention is not limited to this. For example, the single-crystal semiconductor layer 602A can be provided so as to overlap with all the region 402AA and all the region 402BB, or can be provided so as not to overlap with the region 402AA and the region 402BB completely.

Further, when there is a defect in the single-crystal semiconductor layer 403A or the single-crystal semiconductor layer 403B, the single-crystal semiconductor layer 403A or the single-crystal semiconductor layer 403B can be recovered by providing the single-crystal semiconductor layer 602A.

Next, as shown in FIG. 6B, unnecessary portions of the single-crystal semiconductor layer 602A are removed by etching so that the single-crystal semiconductor layer 602A has a predetermined shape. That is, the single-crystal semiconductor layer 602A is processed into an island shape. Then, an island-shaped single-crystal semiconductor layer 603A is obtained in a region 602AA where the single-crystal semiconductor layer 602A is provided.

At this time, when W51 is longer than W21, a transistor can also be formed in a boundary portion between the single-crystal semiconductor layer and the single-crystal semiconductor layer. That is, a transistor can be provided across a portion where the region 602AA and the region 402AA overlap with each other. The single-crystal semiconductor layer 603A is also formed in the portion where the region 602AA and the region 402AA overlap with each other.

Similarly, when W52 is longer than W12, a transistor can be provided across a portion where the region 602AA and the region 402BB overlap with each other.

Figure 7A:
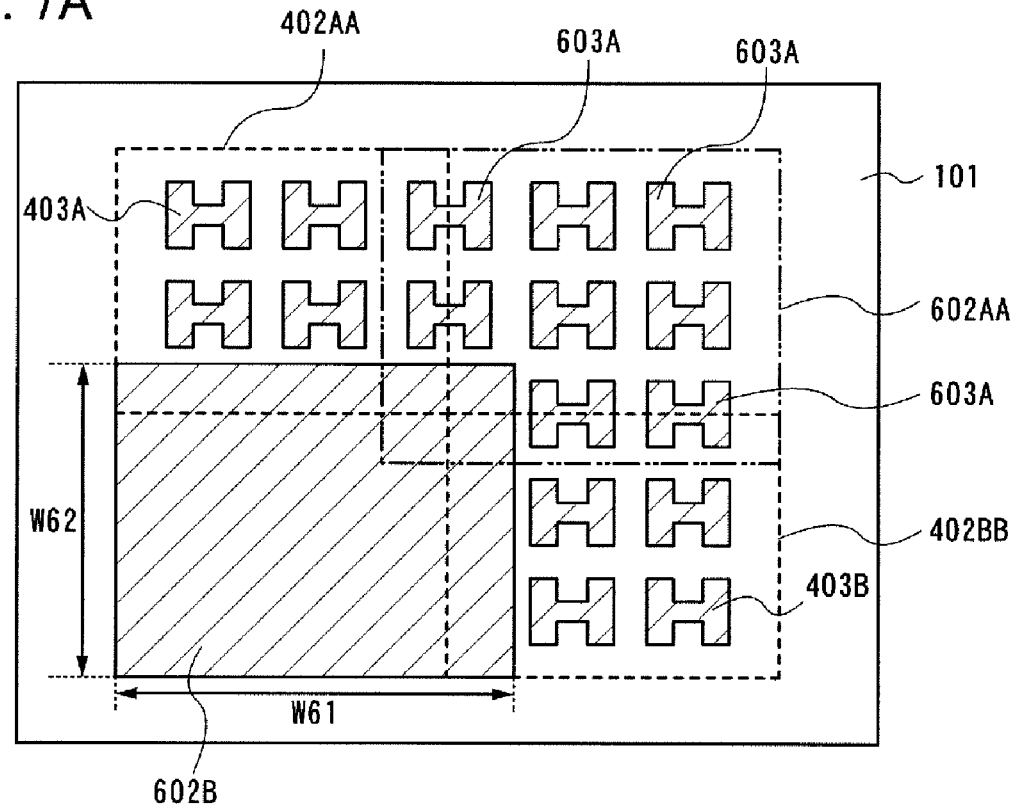
FIGS. 7A and 7B illustrate a method for manufacturing a semiconductor device of the present invention.

Next, as shown in FIG. 7A, the single-crystal semiconductor layer 602B is provided on the downside of the region where the single-crystal semiconductor layer 402A is provided or the left side of the region where the single-crystal semiconductor layer 402B is provided. Here, the lateral width of the single-crystal semiconductor layer 602B is denoted by W61 and the longitudinal width of the single-crystal semiconductor layer 602B is denoted by W62.

In that case, W61 is preferably almost equal to or longer than W11. Alternatively, W62 is preferably almost equal to or longer than W22. With such arrangement, a transistor can be provided even at a joint portion where the single-crystal semiconductor layer is provided.

At this time, since the single-crystal semiconductor layer 402A and the single-crystal semiconductor layer 402B have already been formed into island shapes, an extra single-crystal semiconductor layer is removed. Therefore, even when each side of the single-crystal semiconductor layer 602B is long, the single-crystal semiconductor layer 602B can be provided so as to overlap with part of the region 402AA, part of the region 402BB, and part of the single-crystal semiconductor layer 602A.

Note that although the single-crystal semiconductor layer 602B is provided so as to overlap with part of the region 402AA, part of the region 402BB, and part of the single-crystal semiconductor layer 602A, the present invention is not limited to this. For example, the single-crystal semiconductor layer 602B can be provided so as to overlap with all the region 402AA, all the region 402BB, and all the single-crystal semiconductor layer 602A, or can be provided so as not to overlap with the region 402AA, the region 402BB, and the single-crystal semiconductor layer 602A completely.

Further, when there is a defect in the single-crystal semiconductor layer 403A, the single-crystal semiconductor layer 403B, or the single-crystal semiconductor layer 603A, the single-crystal semiconductor layer 403A, the single-crystal semiconductor layer 403B, or the single-crystal semiconductor layer 603A can be recovered by providing the single-crystal semiconductor layer 602B.

Figure 7B:
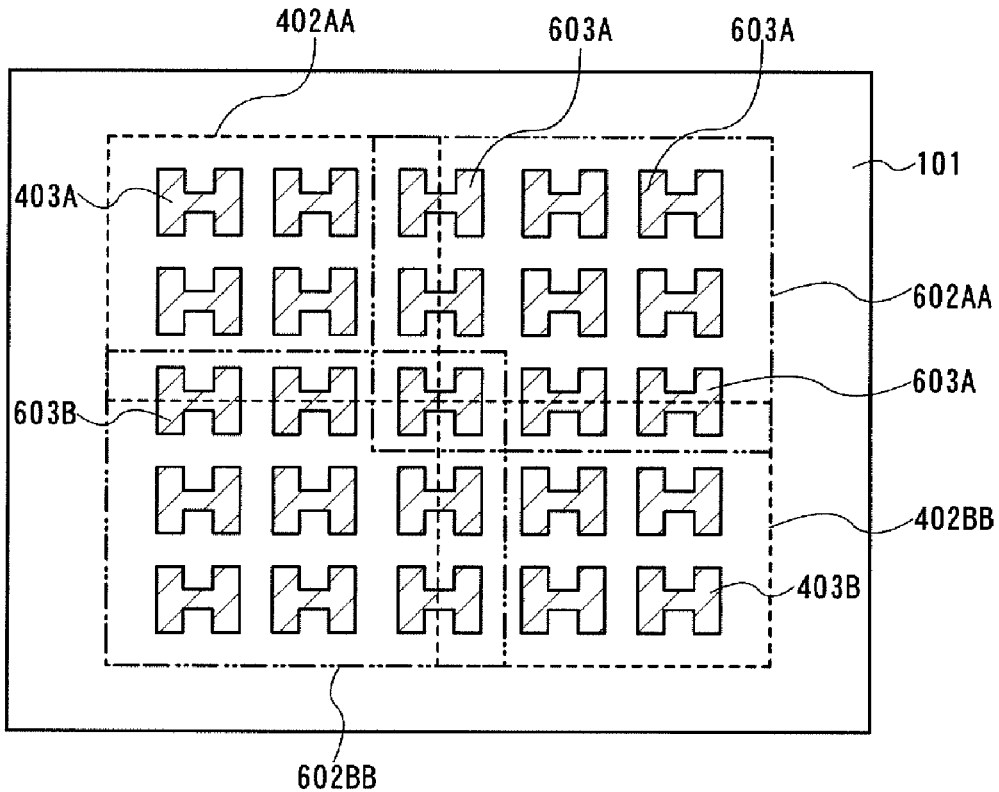

Next, as shown in FIG. 7B, unnecessary portions of the single-crystal semiconductor layer 602B are removed by etching so that the single-crystal semiconductor layer 602B has a predetermined shape. That is, the single-crystal semiconductor layer 602B is processed into an island shape. Then, an island-shaped single-crystal semiconductor layer 603B is obtained in a region 602BB where the single-crystal semiconductor layer 602B is provided.

At this time, when W61 is longer than W11, a transistor can also be formed in a boundary portion between the single-crystal semiconductor layer and the single-crystal semiconductor layer. That is, a transistor can be provided across a portion where the region 602BB and the region 402AA overlap with each other. The single-crystal semiconductor layer 603B is also formed in the portion where the region 602BB and the region 402AA overlap with each other.

Similarly, when W62 is longer than W22, a transistor can be provided across a portion where the region 602BB and the region 402BB overlap with each other.

When the single-crystal semiconductor layer 602A and the single-crystal semiconductor layer 602B are not provided simultaneously, a transistor can also be provided in a portion where the single-crystal semiconductor layer 602A and the single-crystal semiconductor layer 602B overlap with each other.

Various elements such as a transistor, a diode, and a resistor can be formed by using the island-shaped single-crystal semiconductor layers formed as described above.

Note that although two single-crystal semiconductor layers (the single-crystal semiconductor layer 502A and the single-crystal semiconductor layer 502B) or one single-crystal semiconductor layer (the single-crystal semiconductor layer 602A) is provided after two single-crystal semiconductor layers (the single-crystal semiconductor layer 402A and the single-crystal semiconductor layer 402B) are provided, the number of single-crystal semiconductor layers to be provided is not limited to this. Alternatively, although one single-crystal semiconductor layer (the single-crystal semiconductor layer 602A) is provided after two single-crystal semiconductor layers (the single-crystal semiconductor layer 402A and the single-crystal semiconductor layer 402B) are provided and then one single-crystal semiconductor layer (the single-crystal semiconductor layer 602B) is provided, the number of arrangement is not limited to this.

For example, FIGS. 8 to 13 each show the case where a plurality of single-crystal semiconductor layers are provided and patterned after a plurality of single-crystal semiconductor layers are provided and patterned and then a plurality of single-crystal semiconductor layers are further provided and patterned.

Figure 8:
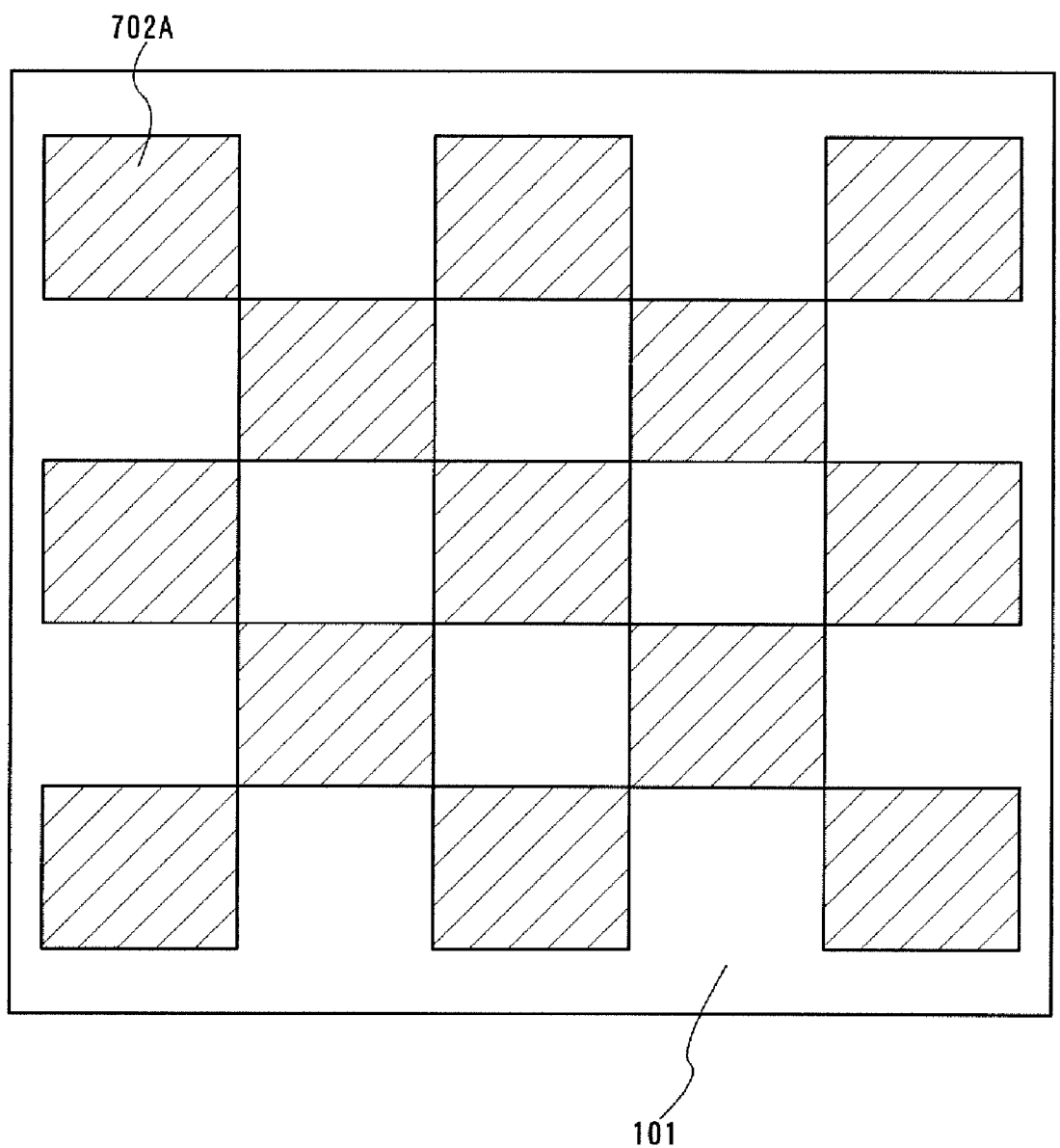
FIG. 8 illustrates a method for manufacturing a semiconductor device of the present invention.
Figure 9:
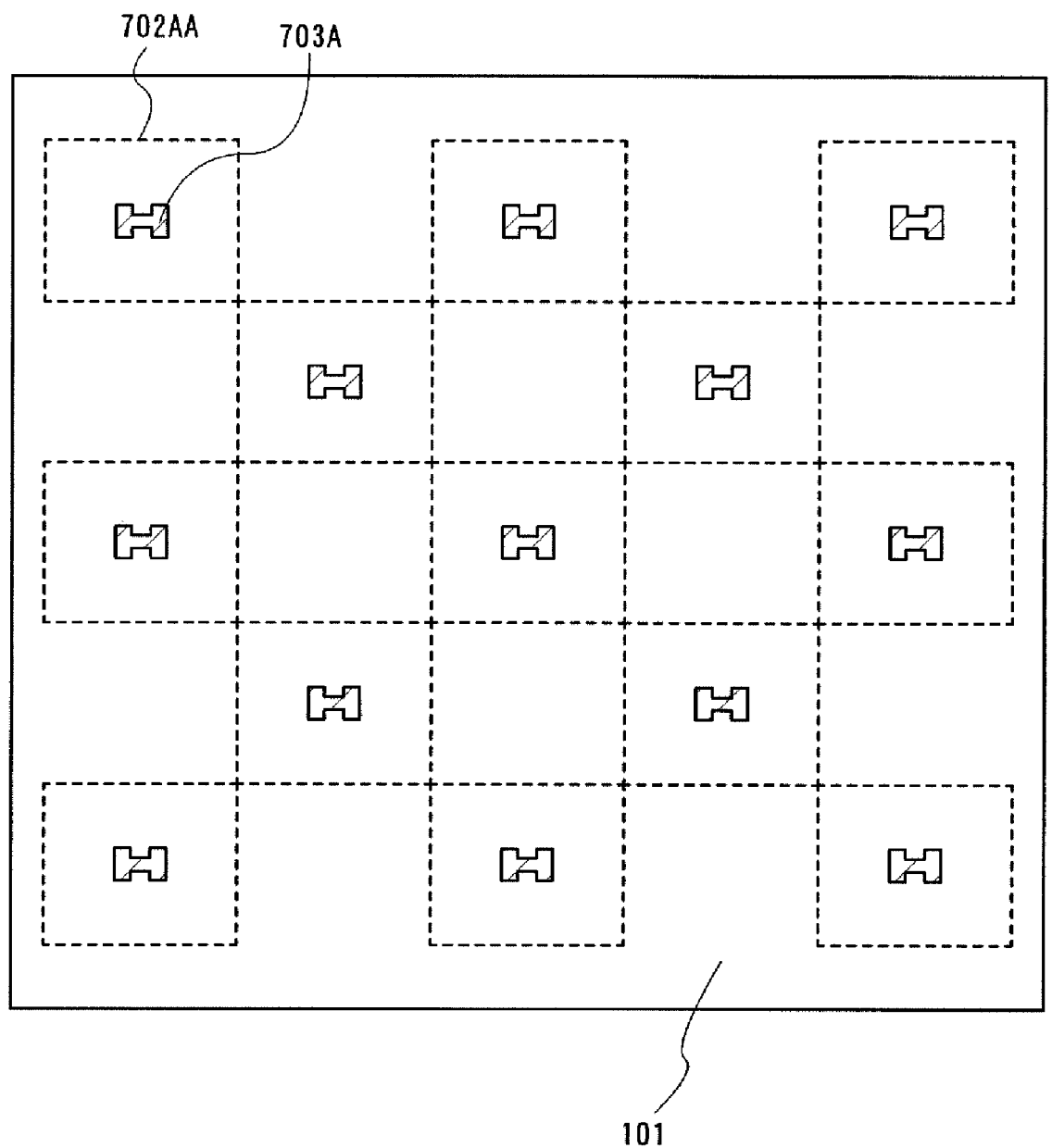
FIG. 9 illustrates a method for manufacturing a semiconductor device of the present invention.

First, as shown in FIG. 8, single-crystal semiconductor layers 702A, which are displaced obliquely, are provided over the insulating substrate 101. Next, as shown in FIG. 9, unnecessary portions of the single-crystal semiconductor layers 702A are removed by etching so that the single-crystal semiconductor layers 702A have predetermined shapes. That is, the single-crystal semiconductor layers 702A are processed into island shapes. Then, island-shaped single-crystal semiconductor layers 703A are obtained in regions 702AA where the single-crystal semiconductor layers 702A are provided.

Figure 10:
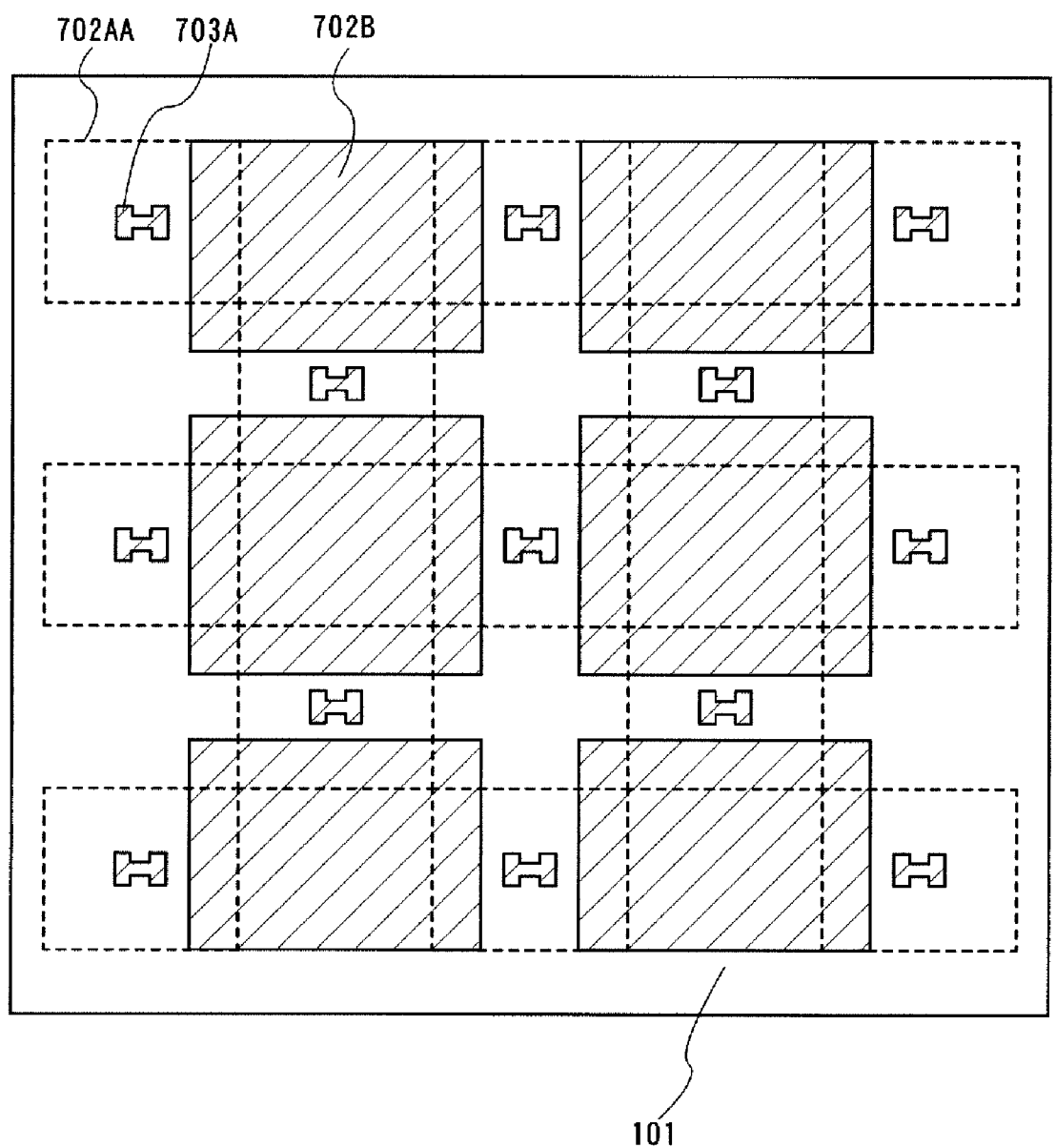
FIG. 10 illustrates a method for manufacturing a semiconductor device of the present invention.
Figure 11:
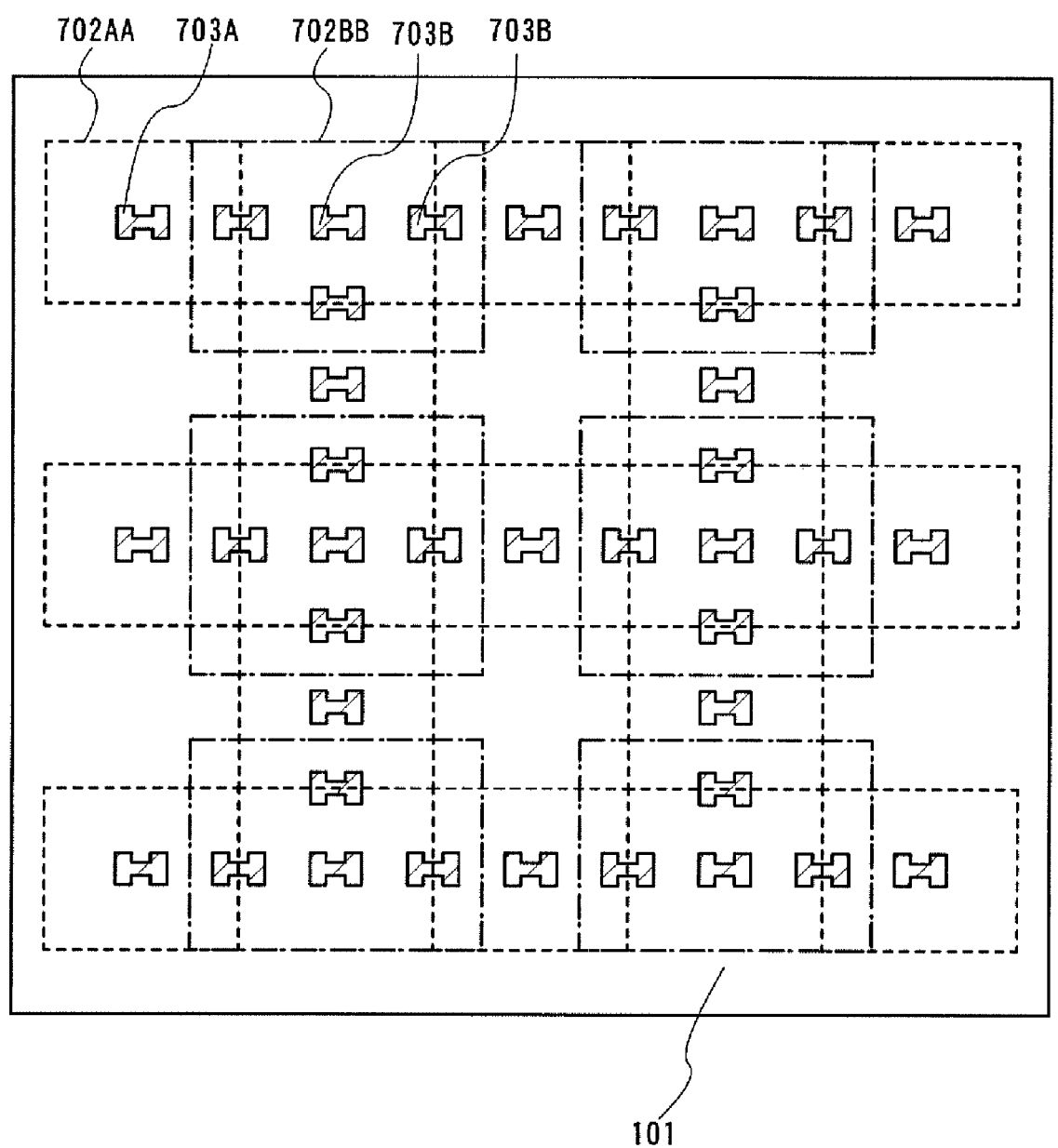
FIG. 11 illustrates a method for manufacturing a semiconductor device of the present invention.

Then, as shown in FIG. 10, single-crystal semiconductor layers 702B are provided so as to overlap with part of the regions 702AA, and unnecessary portions of the single-crystal semiconductor layers 702B are removed by etching so that the single-crystal semiconductor layers 702B have predetermined shapes. Accordingly, as shown in FIG. 11, island-shaped single-crystal semiconductor layers 703B are obtained in regions 702BB where the single-crystal semiconductor layers 702B are provided. Thus, single-crystal semiconductor layers are also obtained in regions where the regions 702AA and the regions 702BB overlap with each other.

Note that although the single-crystal semiconductor layer 702B is provided so as to overlap with part of the region 702AA, the present invention is not limited to this. For example, the single-crystal semiconductor layer 702B can be provided so as to overlap with all the region 702AA, or can be provided so as not to overlap with the region 702AA completely.

Further, when there is a defect in the single-crystal semiconductor layer 703A, the single-crystal semiconductor layer 703A can be recovered by providing the single-crystal semiconductor layer 702B.

Figure 12:
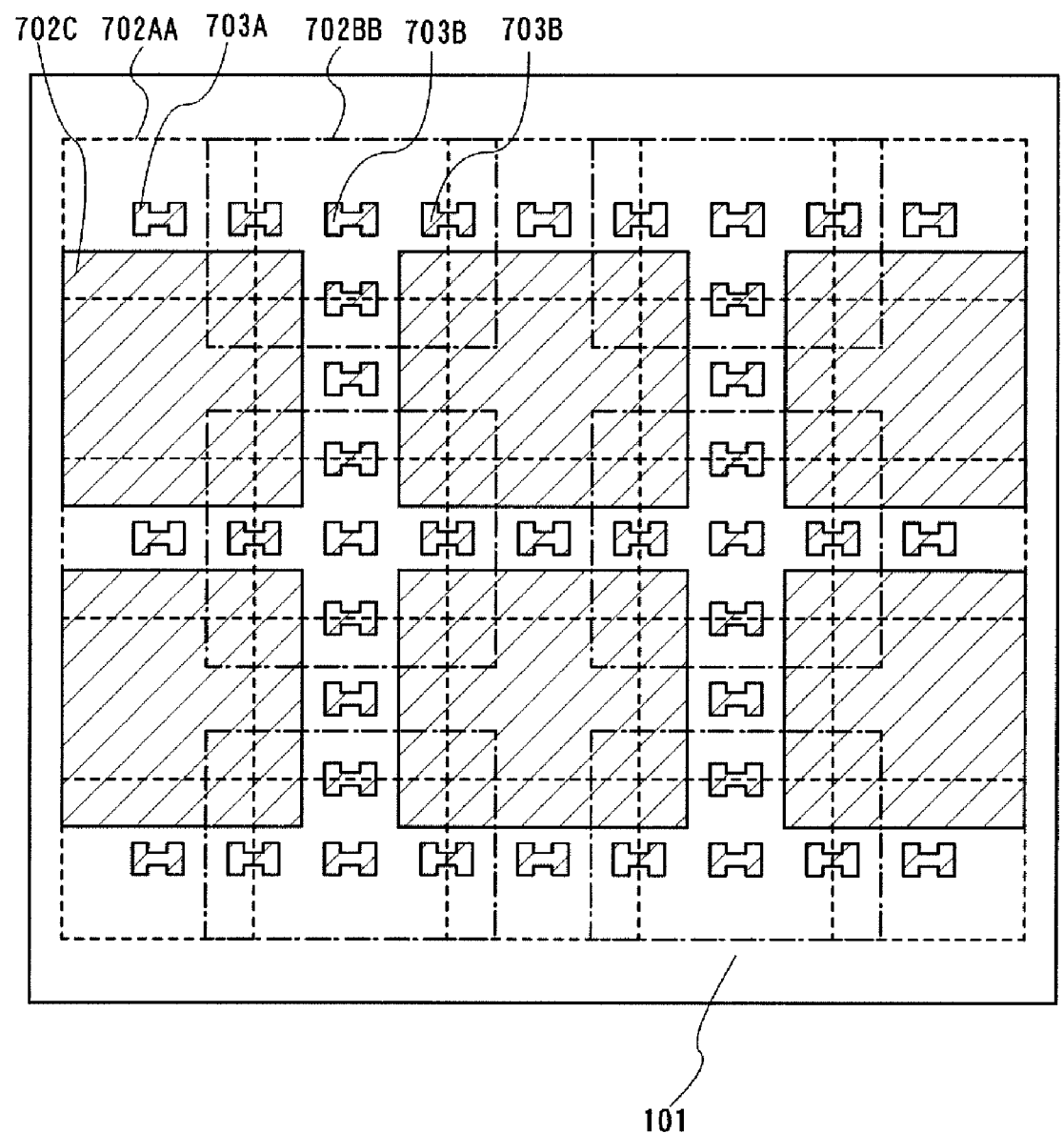
FIG. 12 illustrates a method for manufacturing a semiconductor device of the present invention.
Figure 13:
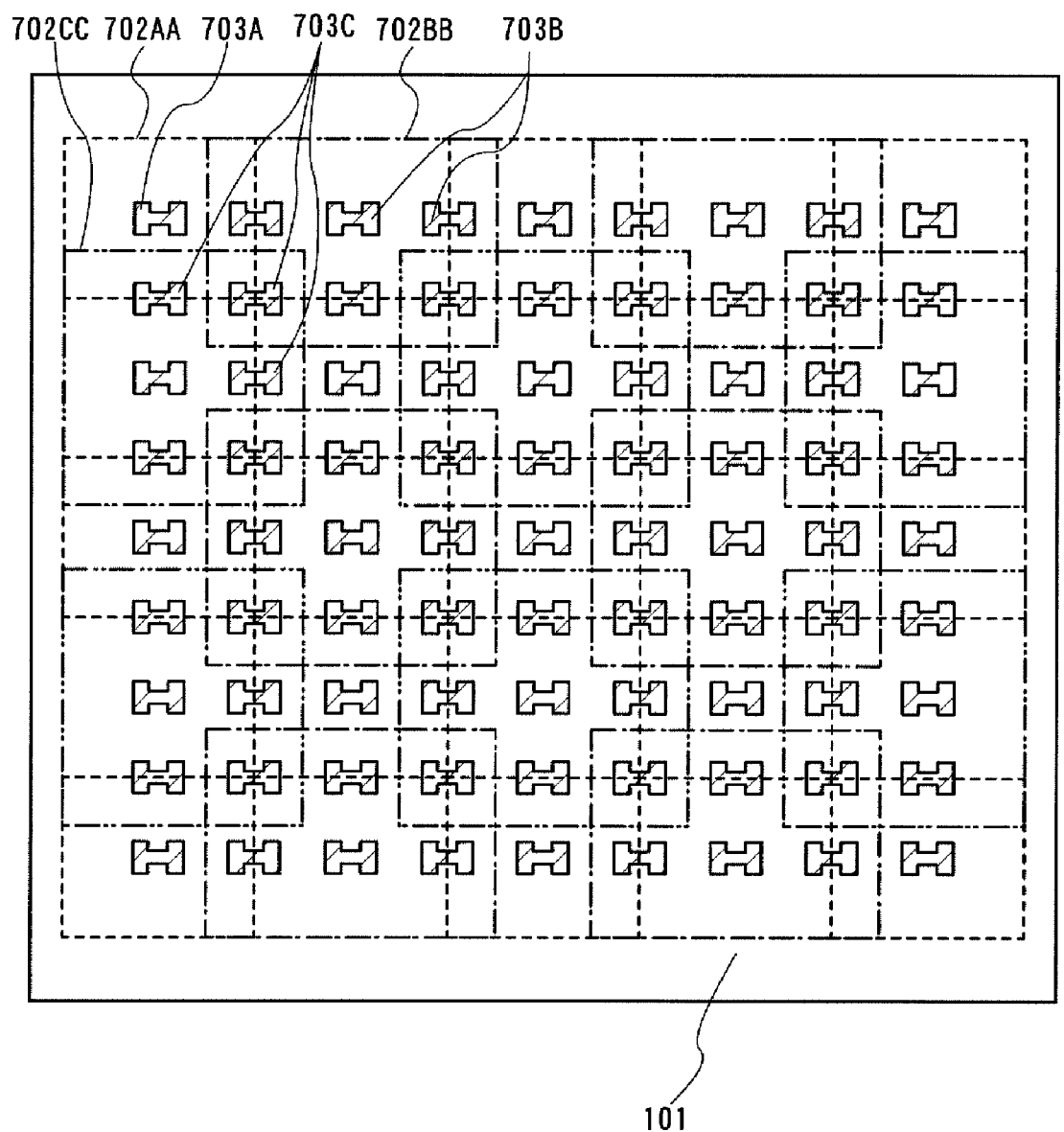
FIG. 13 illustrates a method for manufacturing a semiconductor device of the present invention.

Further, as shown in FIG. 12, single-crystal semiconductor layers 702C are provided so as to overlap with part of the regions 702AA and part of the regions 702BB, and unnecessary portions of the single-crystal semiconductor layers 702C are removed by etching so that the single-crystal semiconductor layers 702C have predetermined shapes. Accordingly, as shown in FIG. 13, island-shaped single-crystal semiconductor layers 703C are obtained in regions 702CC where the single-crystal semiconductor layers 702C are provided. Thus, single-crystal semiconductor layers are also obtained in regions where the regions 702AA and the regions 702CC overlap with each other and the regions 702BB and the regions 702CC overlap with each other.

Note that although the single-crystal semiconductor layer 702C is provided so as to overlap with part of the region 702AA and part of the region 702BB, the present invention is not limited to this. For example, the single-crystal semiconductor layer 702C can be provided so as to overlap with all the region 702AA and all the region 702BB, or can be provided so as not to overlap with the region 702AA and the region 702BB completely.

Further, when there is a defect in the single-crystal semiconductor layer 703A or the single-crystal semiconductor layer 703B, the single-crystal semiconductor layer 703A or the single-crystal semiconductor layer 703B can be recovered by providing the single-crystal semiconductor layer 702C.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 3

Next, a method for manufacturing a single-crystal TFT is described.

Figure 14A:
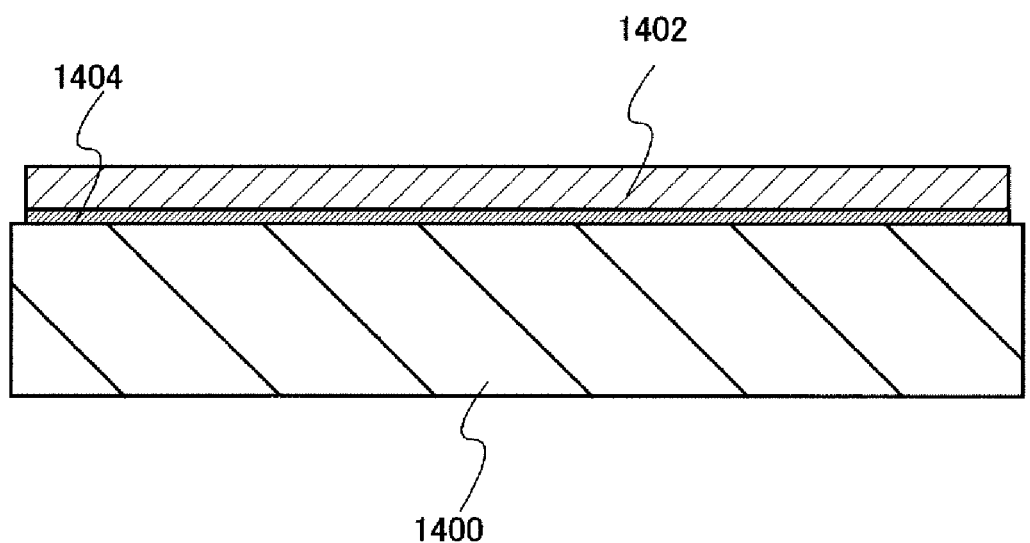
FIGS. 14A and 14B are cross-sectional views illustrating an SOI substrate of the present invention.
Figure 14B:
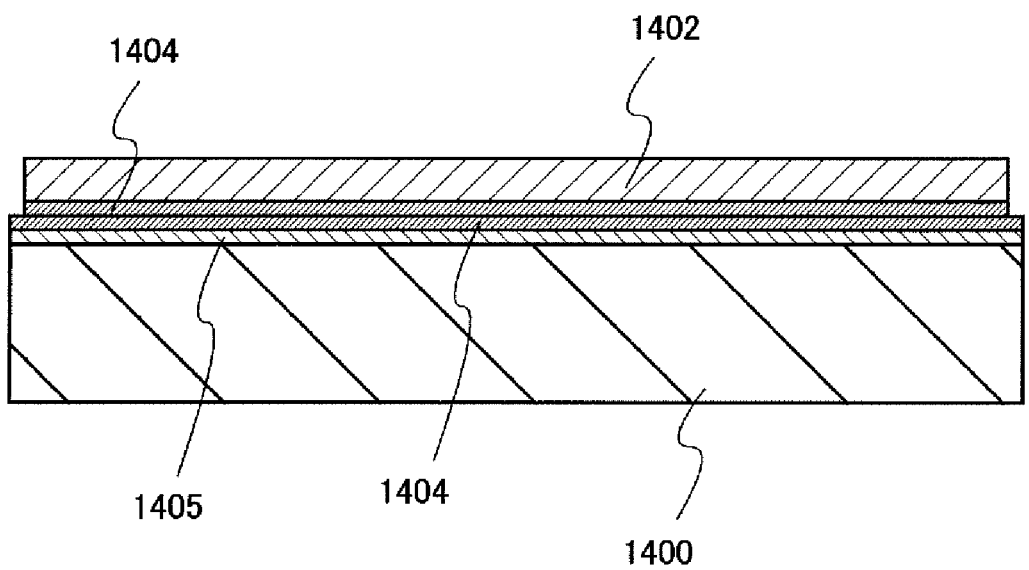

FIGS. 14A and 14B show an SOI substrate of the present invention. In FIG. 14A, a base substrate 1400 is a substrate having an insulating surface or an insulating substrate, and any of various glass substrates which are used in the electronics industry, such as aluminosilicate glass substrates, aluminoborosilicate glass substrates, and barium borosilicate glass substrates can be used. Alternatively, a quartz glass substrate or a semiconductor substrate such as a silicon wafer can be used. An SOI layer 1402 is a single-crystal semiconductor, and single-crystal silicon is typically used. Alternatively, a single-crystal semiconductor layer formed of silicon, germanium, or a compound semiconductor such as gallium arsenide or indium phosphide which can be separated from a single-crystal semiconductor substrate by a separation method of hydrogen ion implantation can be used.

Between the base substrate 1400 and the SOI layer 1402 described above, a bonding layer 1404 which has a smooth surface and forms a hydrophilic surface is provided. A silicon oxide film is suitable for the bonding layer 1404. In particular, a silicon oxide film formed by using an organic silane gas by a chemical vapor deposition method is preferable. As an organic silane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

The bonding layer 1404 which has a smooth surface and forms a hydrophilic surface is provided with a thickness of 5 to 500 nm. With such a thickness, roughness of a surface on which the bonding layer 1404 is formed can be smoothed and smoothness of a growth surface of the film can be ensured. In addition, distortion between a substrate and the SOI layer which are bonded to each other can be reduced. The base substrate 1400 may be provided with a similar silicon oxide film. That is, when the SOI layer 1402 is bonded to the base substrate 1400 which is a substrate having an insulating surface or an insulating substrate, the base substrate 1400 and the SOI layer 1402 can be firmly bonded to each other when the bonding layer 1404 formed of a silicon oxide film which is preferably formed by using organic silane as a material is provided on either one or both surfaces of the base substrate 1400 and the SOI layer 1402 which are to be bonded.

FIG. 14B shows a structure in which the base substrate 1400 is provided with a barrier layer 1405 and the bonding layers 1404. In the case of bonding the SOI layer 1402 to the base substrate 1400, the SOI layer 1402 can be prevented from being contaminated by diffusion of impurities such as mobile ions like alkali metal or alkaline earth metal from a glass substrate which is used as the base substrate 1400. A bonding layer 1404 on the base substrate 1400 side may be provided as appropriate.

Figure 15A:
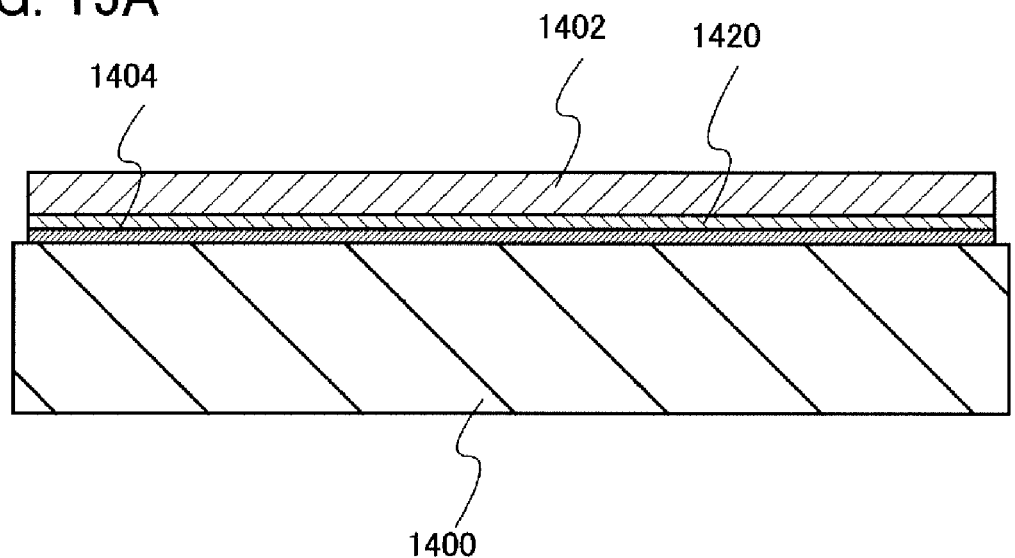
FIGS. 15A and 15B are cross-sectional views illustrating an SOI substrate of the present invention.

FIG. 15A shows a structure in which a nitrogen-containing insulating layer 1420 is provided between the SOI layer 1402 and the bonding layer 1404. The nitrogen-containing insulating layer 1420 is formed by stacking one or a plurality of films selected from a silicon nitride film, a silicon nitride oxide film, and a silicon oxynitride film. For example, the nitrogen-containing insulating layer 1420 can be formed by stacking a silicon oxynitride film and a silicon nitride oxide film from the SOI layer 1402 side. The bonding layer 1404 is provided in order to form a bond with the base substrate 1400, whereas the nitrogen-containing insulating layer 1420 is preferably provided in order to prevent the SOI layer 1402 from being contaminated by diffusion of impurities such as mobile ions or moisture.

Note that here, a silicon oxynitride film corresponds to a film which contains much oxygen than nitrogen, and in the case where measurement is performed using Rutherford backscattering spectrometry (RBS) and hydrogen forward scattering (HFS), includes oxygen, nitrogen, silicon, and hydrogen at concentrations ranging from 50 to 70 at. %, 0.5 to 15 at. %, 25 to 35 at. %, and 0.1 to 10 at. %, respectively. Further, a silicon nitride oxide film corresponds to a film which contains much nitrogen than oxygen and includes oxygen, nitrogen, silicon, and hydrogen at concentrations ranging from 5 to 30 at. %, 20 to 55 at. %, 25 to 35 at. %, and 10 to 30 at. %, respectively, in the case where measurement is performed using RBS and HFS. Note that percentages of nitrogen, oxygen, silicon, and hydrogen fall within the ranges given above if the total number of atoms contained in the silicon oxynitride film or the silicon nitride oxide film is defined as 100 at. %.

Figure 15B:
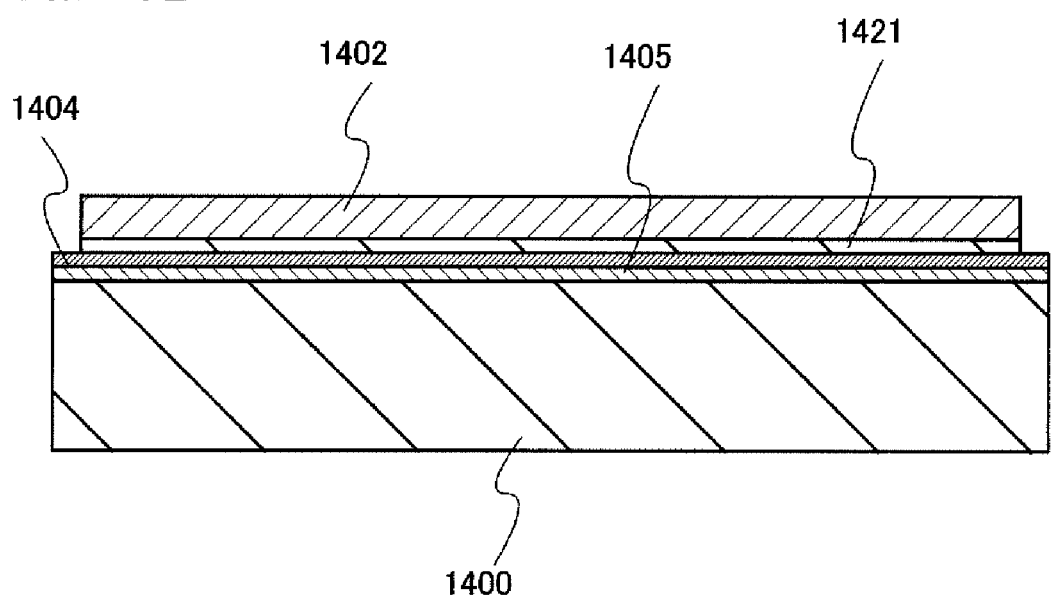

FIG. 15B shows a structure in which the base substrate 1400 is provided with the bonding layer 1404. Between the base substrate 1400 and the bonding layer 1404, the barrier layer 1405 is preferably provided. The barrier layer 1405 is provided in order to prevent the SOI layer 1402 from being contaminated by diffusion of impurities such as mobile ions like alkali metal or alkaline earth metal from a glass substrate which is used as the base substrate 1400. In addition, the SOI layer 1402 is provided with a silicon oxide film 1421. This silicon oxide film 1421 forms a bond with the bonding layer 1404 to fix the SOI layer 1402 over the base substrate 1400. The silicon oxide film 1421 is preferably formed by thermal oxidation. Alternatively, in a manner similar to that of the bonding layer 1404, the silicon oxide film 1421 may be formed by using TEOS by a chemical vapor deposition method. Further alternatively, as the silicon oxide film 1421, chemical oxide can be used. Chemical oxide can be formed by, for example, performing treatment on a surface of a semiconductor substrate by using ozone-containing water. Chemical oxide is preferable because it reflects flatness of the surface of the semiconductor substrate.

A method for manufacturing such an SOI substrate is described with reference to FIGS. 16A to 16C and FIG. 17.

Figure 16A:
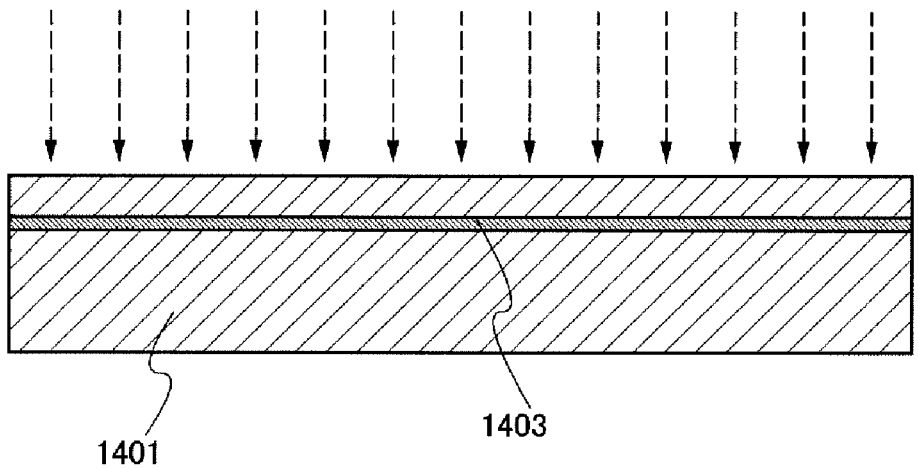
FIGS. 16A to 16C are cross-sectional views illustrating an SOI substrate of the present invention.

A semiconductor substrate 1401 shown in FIG. 16A is cleaned, and ions which are accelerated by an electric field are added to reach a predetermined depth from the surface of the semiconductor substrate 1401 to form a weakened layer 1403. Ions are added in consideration of the thickness of an SOI layer which is to be transferred to a base substrate. The thickness of the SOI layer is 5 to 500 nm, preferably 10 to 200 nm. Accelerating voltage for adding ions to the semiconductor substrate 1401 is set in consideration of such a thickness. The weakened layer 1403 is formed by adding ions of hydrogen, helium, or halogen typified by fluorine. In this case, it is preferable to add one kind of ions or plural kinds of ions of different mass numbers consisting of a single kind of atoms. In the case of adding hydrogen ions, the hydrogen ions preferably include $H^+$, $H_2^+$, and $H_3^+$ ions with a high proportion of $H_3^+$ ions. With a high proportion of $H_3^+$ ions, addition efficiency can be increased and addition time can be shortened. With such a structure, separation can be easily performed.

Since it is necessary to add ions at a high dose, the surface of the semiconductor substrate 1401 is roughened in some cases. Therefore, a protective film against addition of ions may be provided on a surface to which ions are added by using a silicon nitride film, a silicon nitride oxide film, or the like with a thickness of 50 to 200 nm.

Figure 16B:
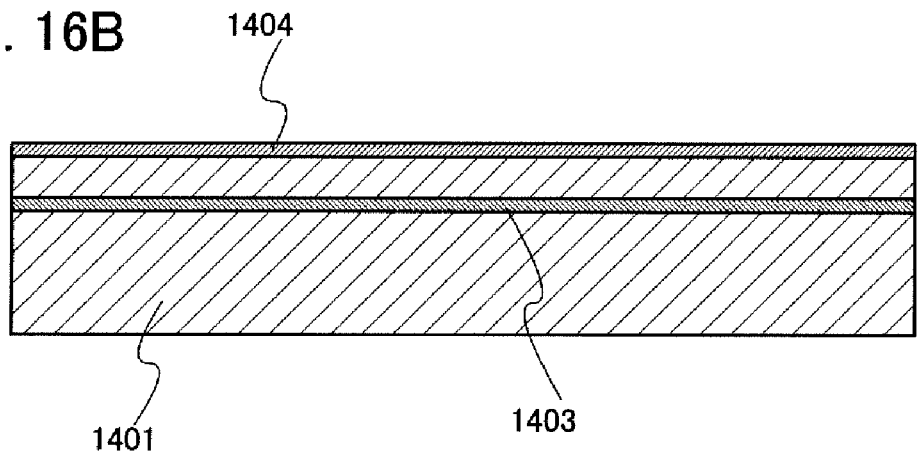

Next, as shown in FIG. 16B, a silicon oxide film is formed over a surface to which the base substrate is bonded as a bonding layer 1404. As the silicon oxide film, a silicon oxide film formed by using an organic silane gas by a chemical vapor deposition method as described above is preferably used. Alternatively, a silicon oxide film formed by using a silane gas by a chemical vapor deposition method can be used. In film formation by a chemical vapor deposition method, film formation temperature at, for example, 350° C. or lower, at which degassing of the weakened layer 1403 formed in a single-crystal semiconductor substrate does not occur, is used. Heat treatment for separating an SOI layer from a single-crystal or polycrystalline semiconductor substrate is performed at a higher temperature than the film formation temperature.

Figure 16C:
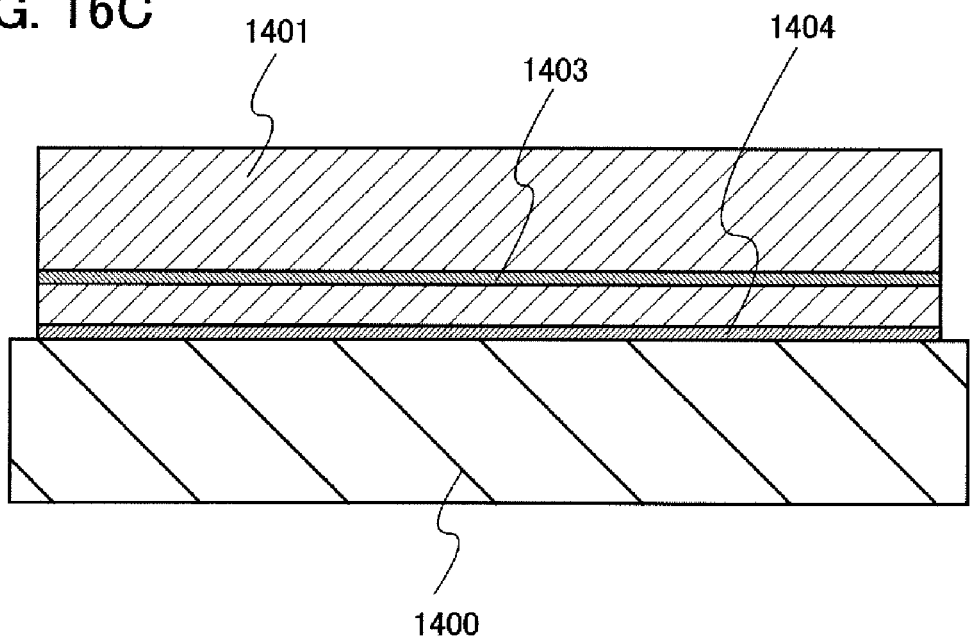

FIG. 16C shows a mode in which a surface of the base substrate 1400 and a surface of the semiconductor substrate 1401, on which the bonding layer 1404 is formed, are disposed in contact to be bonded to each other. The surfaces which are to be bonded are cleaned sufficiently. Then, when the base substrate 1400 and the bonding layer 1404 are disposed in contact, a bond is formed. This bond is formed by Van der Waals force. When the base substrate 1400 and the semiconductor substrate 1401 are pressed against each other, a stronger bond can be formed by hydrogen bonding.

In order to form a favorable bond, the surfaces which are to form a bond may be activated. For example, the surfaces which are to form a bond are irradiated with an atomic beam or an ion beam. When an atomic beam or an ion beam is used, an inert gas neutral atom beam or inert gas ion beam of argon or the like can be used. Alternatively, plasma irradiation or radical treatment is performed. With such a surface treatment, a bond between different kinds of materials can be easily formed even at a temperature of 200 to 400° C.

After the base substrate 1400 and the semiconductor substrate 1401 are bonded to each other with the bonding layer 1404 interposed therebetween, heat treatment or pressure treatment is preferably performed. When heat treatment or pressure treatment is performed, bonding strength can be increased. Temperature of heat treatment is preferably lower than or equal to the upper temperature limit of the base substrate 1400. Pressure treatment is performed so that pressure is applied in a perpendicular direction to the bonded surface, in consideration of pressure resistance of the base substrate 1400 and the semiconductor substrate 1401.

Figure 17:
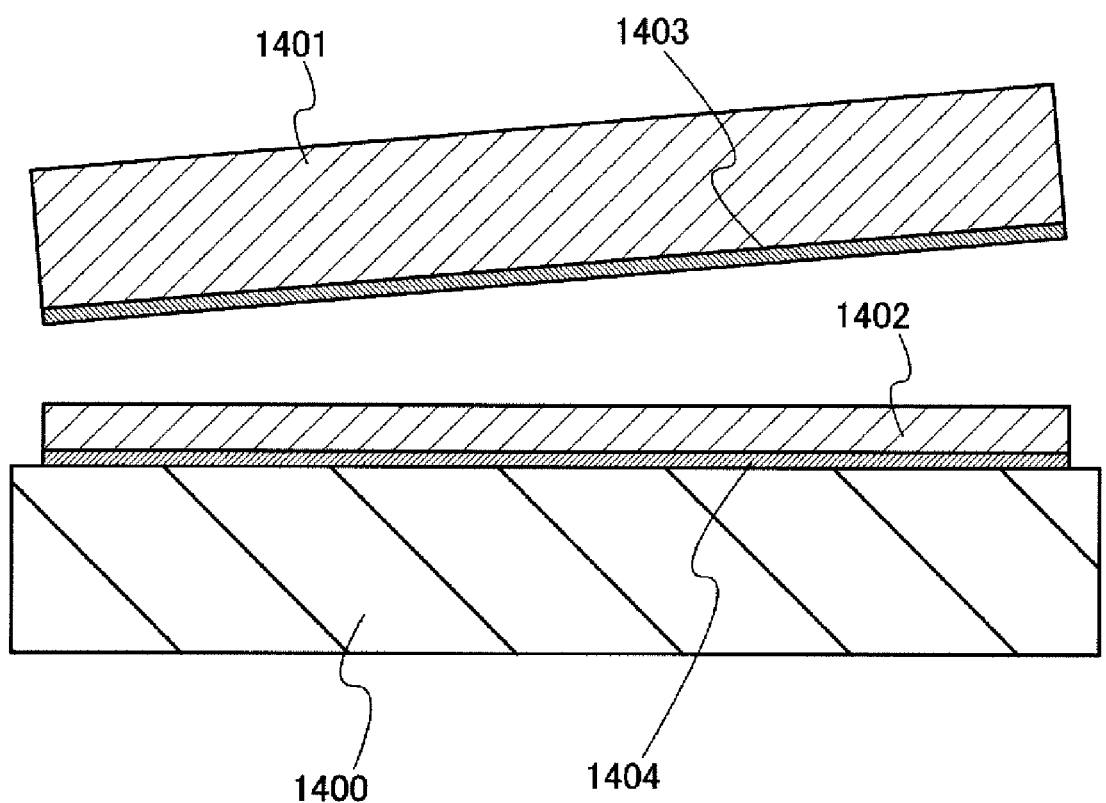
FIG. 17 is a cross-sectional view illustrating an SOI substrate of the present invention.

In FIG. 17, after the base substrate 1400 and the semiconductor substrate 1401 are bonded to each other, heat treatment is performed to separate the semiconductor substrate 1401 from the base substrate 1400 with the weakened layer 1403 used as a cleavage plane. The heat treatment is preferably performed at a temperature ranging from the film formation temperature of the bonding layer 1404 to the upper temperature limit of the base substrate 1400. When the heat treatment is performed at, for example, 400 to 600° C., the volume of fine voids formed in the weakened layer 1403 is changed, so that cleavage can be performed along the weakened layer 1403. Since the bonding layer 1404 is bonded to the base substrate 1400, the SOI layer 1402 having the same crystallinity as the semiconductor substrate 1401 remains over the base substrate 1400.

Figure 18A:
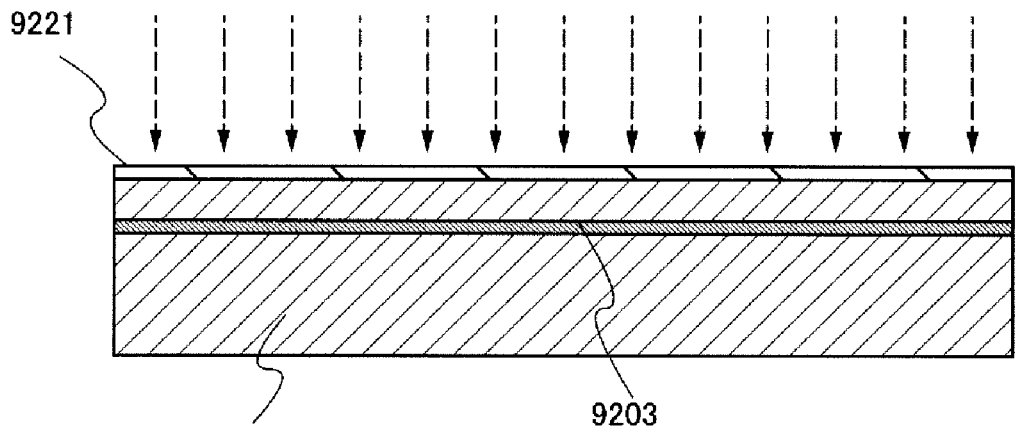
FIGS. 18A to 18C are cross-sectional views illustrating an SOI substrate of the present invention.
Figure 18B:
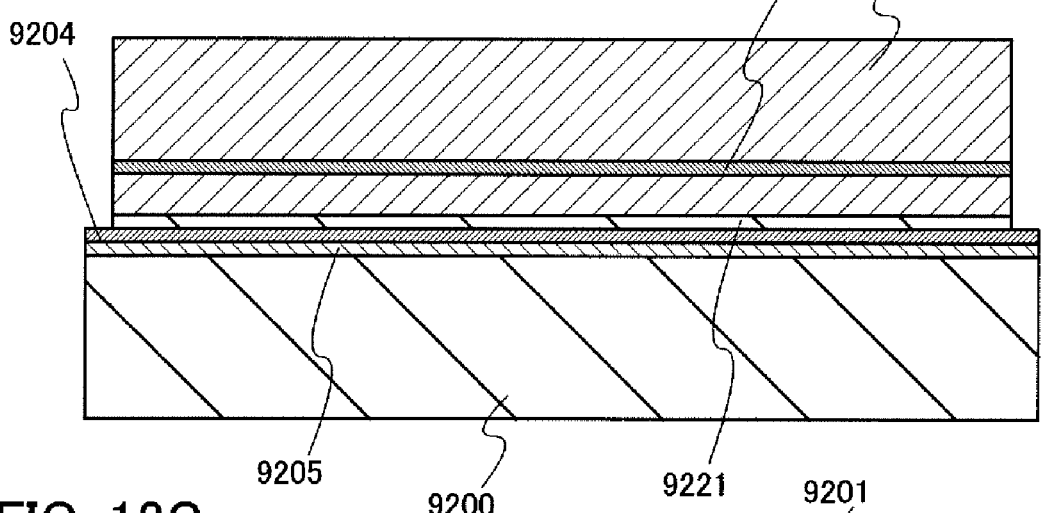
Figure 18C:
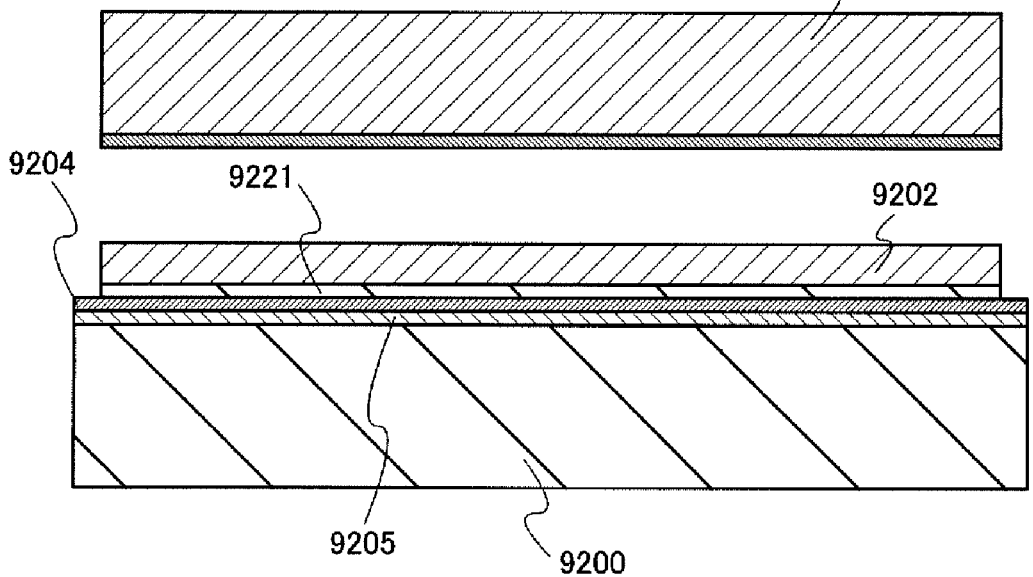

FIGS. 18A to 18C show steps of forming an SOI layer with a bonding layer provided on the base substrate 1400 side. FIG. 18A shows a step in which ions which are accelerated by an electric field are added to the semiconductor substrate 1401 which is provided with the silicon oxide film 1421 to reach a predetermined depth to form the weakened layer 1403. Addition of ions of hydrogen, helium, or a halogen typified by fluorine is performed in a manner similar to that of FIG. 18A. When the silicon oxide film 1421 is formed on the surface of the semiconductor substrate 1401, the surface of the semiconductor substrate 1401 can be prevented from being damaged by ion doping and from losing its flatness.

FIG. 18B shows a step in which a surface of the base substrate 1400 provided with the barrier layer 1405 and the bonding layer 1404 and the surface of the semiconductor substrate 1401, on which the silicon oxide film 1421 is formed, are disposed in contact to be bonded. A bond is formed when the bonding layer 1404 over the base substrate 1400 is disposed in contact with the silicon oxide film 1421 formed on the semiconductor substrate 1401.

After that, as shown in FIG. 18C, the semiconductor substrate 1401 is separated. Heat treatment for separating the semiconductor substrate 1401 is performed in a manner similar to that of FIG. 17. In this manner, the SOI substrate shown in FIG. 15B can be obtained.

In this manner, in accordance with this mode, even if a substrate with an upper temperature limit of 700° C. or lower, such as a glass substrate, is used as the base substrate 1400, the SOI layer 1402 having strong adhesiveness of a bonded portion can be obtained. As the base substrate 1400, any of various glass substrates which are used in the electronics industry and are referred to as non-alkali glass substrates, such as aluminosilicate glass substrates, aluminoborosilicate glass substrates, and barium borosilicate glass substrates can be used. That is, a single-crystal semiconductor layer can be formed over a substrate which is longer than one meter on a side. When such a large-area substrate is used, not only a display device such as a liquid crystal display but also a semiconductor integrated circuit can be manufactured.

With such a method, a single-crystal semiconductor layer can be provided over a glass substrate. Such a method can be used when the single-crystal semiconductor layer 102A and the single-crystal semiconductor layer 102B are provided in FIG. 1A, when the single-crystal semiconductor layer 202A is provided in FIG. 2A, when the single-crystal semiconductor layer 402A and the single-crystal semiconductor layer 402B are provided in FIG. 4A, when the single-crystal semiconductor layer 502A and the single-crystal semiconductor layer 502B are provided in FIG. 5A, when the single-crystal semiconductor layer 602A is provided in FIG. 6A, or when the single-crystal semiconductor layer 602B is provided in FIG. 7A, for example.

Figure 19A:
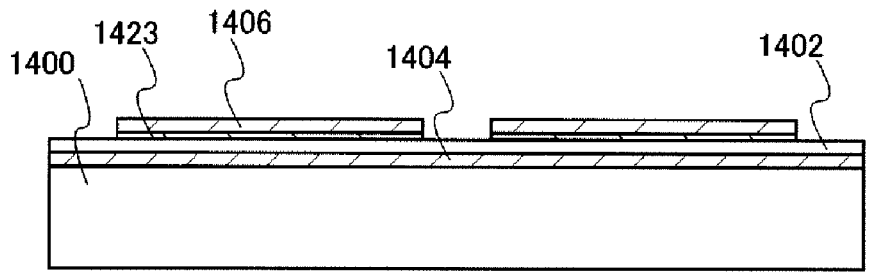
FIGS. 19A to 19E are cross-sectional views illustrating a transistor of the present invention.

Subsequently, a semiconductor device using an SOI substrate is described with reference to FIGS. 19A to 19E and FIGS. 20A and 20B. In FIG. 19A, the SOI layer 1402 is provided over the base substrate 1400 with the bonding layer 1404 interposed therebetween. Over the SOI layer 1402, a silicon nitride layer 1423 and a silicon oxide layer 1406 are formed in accordance with an element formation region. The silicon oxide layer 1406 is used as a hard mask when the SOI layer 1402 is etched for element isolation. The silicon nitride layer 1423 functions as an etching stopper.

The thickness of the SOI layer 1402 is 5 to 500 nm, preferably 10 to 200 nm. The thickness of the SOI layer 1402 can be set as appropriate by controlling the depth of the weakened layer 1403 shown in FIGS. 16A to 16C. In order to control the threshold voltage, a p-type impurity such as boron, aluminum, or gallium is added to the SOI layer 1402. For example, boron may be added as a p-type impurity at a concentration of $5 \times 10^{17}$ to $1 \times 10^{18}$ cm$^{-3}$.

Figure 19B:
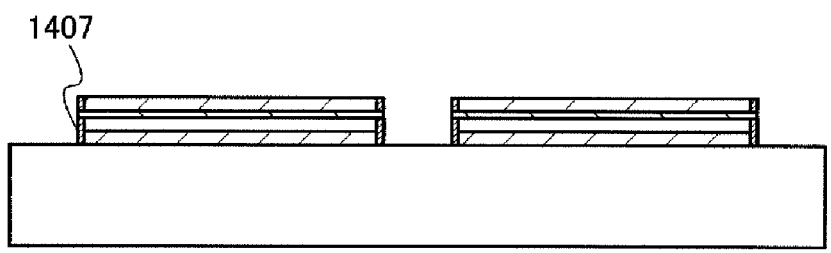

FIG. 19B shows a step of etching the SOI layer 1402 and the bonding layer 1404 by using the silicon oxide layer 1406 as a mask. Exposed end surfaces of the SOI layer 1402 and the bonding layer 1404 are nitrided by plasma treatment. By this nitridation treatment, a silicon nitride layer 1407 is formed at least at a peripheral end portion of the SOI layer 1402. The silicon nitride layer 1407 has insulating properties and has an effect of preventing leakage current from flowing through an end surface of the SOI layer 1402. In addition, since the silicon nitride layer 1407 has resistance to oxidation, it can prevent an oxide film from growing from the end surface into a bird's beak between the SOI layer 1402 and the bonding layer 1404.

After element isolation of the SOI layer (silicon layer) is performed in this manner, the silicon layer is provided over the substrate again. The method shown in FIG. 16C, FIG. 17, or FIGS. 18A to 18C is used as a method for providing the silicon layer over the substrate. Then, element isolation of the SOI layer (silicon layer) is performed again by using the method shown in FIGS. 19A and 19B. By repeating these steps, the manufacturing methods shown in FIGS. 1A to 13 can be realized.

Figure 19C:
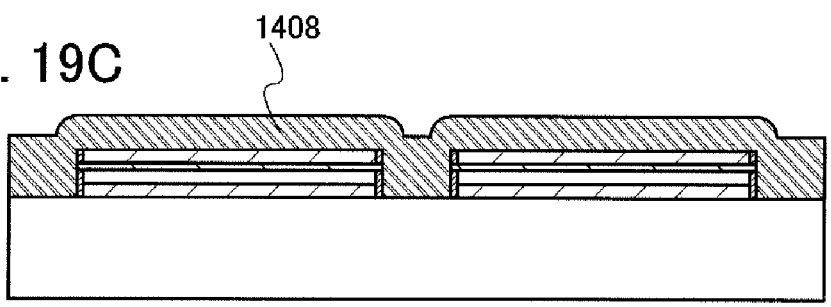

FIG. 19C shows a step of depositing an element isolation insulating layer 1408. As the element isolation insulating layer 1408, a silicon oxide film is deposited by using TEOS by a chemical vapor deposition method. The element isolation insulating layer 1408 is deposited thickly so that the SOI layer 1402 is buried.

Figure 19D:
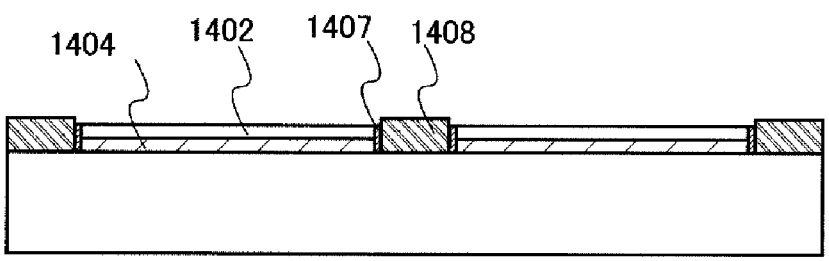

FIG. 19D shows a step of removing the element isolation insulating layer 1408 to expose the silicon nitride layer 1423. This removing step can be performed by dry etching, or may be performed by chemical mechanical polishing. The silicon nitride layer 1423 functions as an etching stopper. The element isolation insulating layer 1408 remains so as to be embedded between the SOI layers 1402. After that, the silicon nitride layer 1423 is removed.

Figure 19E:
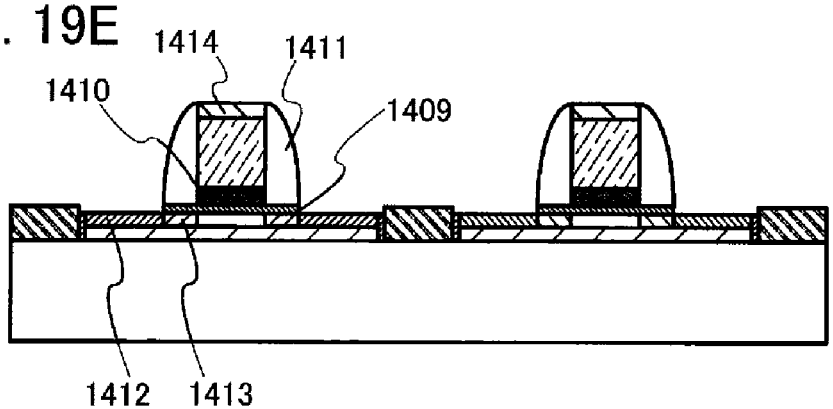

In FIG. 19E, after the SOI layer 1402 is exposed, a gate insulating layer 1409, a gate electrode 1410, and a sidewall insulating layer 1411 are formed, and a first impurity region 1412 and a second impurity region 1413 are formed. An insulating layer 1414 is formed using silicon nitride and is used as a hard mask when the gate electrode 1410 is etched.

Figure 20A:
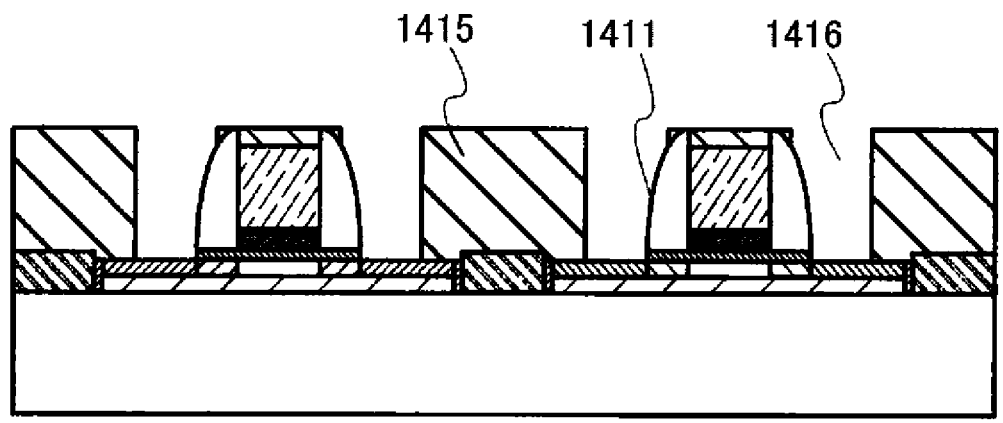
FIGS. 20A and 20B are cross-sectional views illustrating a transistor of the present invention.

In FIG. 20A, an interlayer insulating layer 1415 is formed. As the interlayer insulating layer 1415, a borophosphosilicate glass (BPSG) film is formed and then planarized by reflow. Alternatively, a silicon oxide film may be formed by using TEOS and then planarized by chemical mechanical polishing. In planarization treatment, the insulating layer 1414 over the gate electrode 1410 functions as an etching stopper. A contact hole 1416 is formed in the interlayer insulating layer 1415. The contact hole 1416 is formed in a self-aligned manner by utilizing the sidewall insulating layer 1411.

Figure 20B:
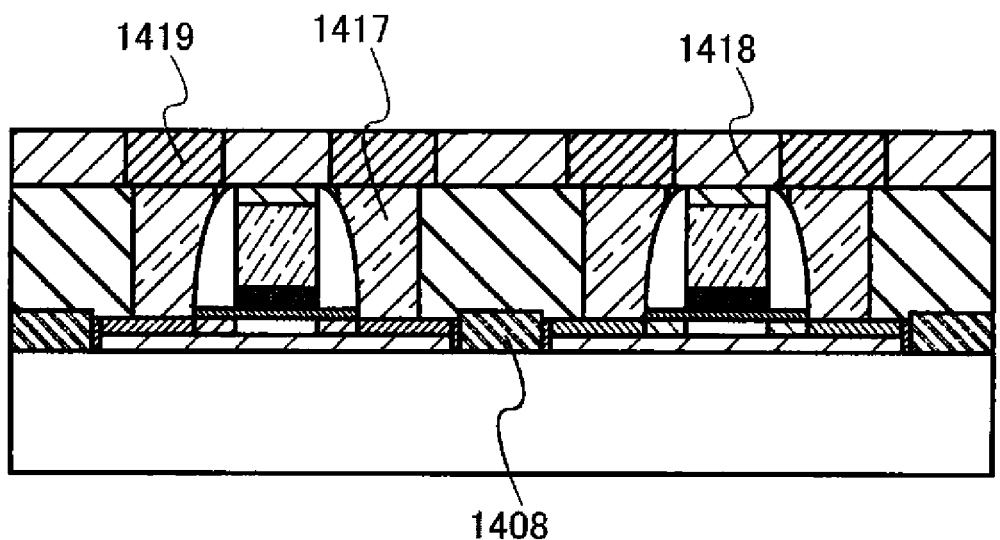

After that, as shown in FIG. 20B, a contact plug 1417 is formed by using tungsten hexafluoride by CVD. Further, an insulating layer 1418 is formed; an opening is formed in accordance with the contact plug 1417; and a wiring 1419 is provided. The wiring 1419 is formed by using aluminum or an aluminum alloy and is provided with upper and lower metal films of molybdenum, chromium, titanium, or the like as barrier metal films.

In this manner, a field effect transistor can be manufactured by using the SOI layer 1402 which is bonded to the base substrate 1400. Since the SOI layer 1402 in accordance with this mode is a single-crystal semiconductor with uniform crystal orientation, high-performance field-effect transistors which are uniform can be obtained. That is, variation in values of important transistor characteristics, such as the threshold voltage and mobility can be suppressed, so that high performance such as high mobility can be achieved.

Note that a wiring, an electrode, a conductive layer, a conductive film, a terminal, a via, a plug, and the like are preferably formed of one or more elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O); or a compound or an alloy material including one or more of the aforementioned elements (e.g., indium tin oxide (ITO), indium zinc oxide (IZO), indium tin oxide containing silicon oxide (ITSO), zinc oxide (ZnO), tin oxide (SnO), cadmium tin oxide (CIO), aluminum neodymium (Al—Nd), magnesium silver (Mg—Ag), or molybdenum-niobium (Mo—Nb)); a substance in which these compounds are combined; or the like. Alternatively, they are preferably formed to contain a substance including a compound (silicide) of silicon and one or more of the aforementioned elements (e.g., aluminum silicon, molybdenum silicon, or nickel silicide); or a compound of nitrogen and one or more of the aforementioned elements (e.g., titanium nitride, tantalum nitride, or molybdenum nitride).

Note that silicon (Si) may contain an n-type impurity (such as phosphorus) or a p-type impurity (such as boron). When silicon contains the impurity, the conductivity is increased, and a function similar to a general conductor can be realized. Accordingly, such silicon can be utilized easily as a wiring, an electrode, or the like.

In addition, silicon having a variety of crystallinity, such as single-crystal silicon, polycrystalline silicon, or microcrystalline silicon can be used. Alternatively, silicon having no crystallinity, such as amorphous silicon can be used. When single-crystal silicon or polycrystalline silicon is used, resistance of a wiring, an electrode, a conductive layer, a conductive film, a terminal, or the like can be reduced. When amorphous silicon or microcrystalline silicon is used, a wiring or the like can be formed by a simple process.

Aluminum and silver have high conductivity, and thus can reduce signal delay. Moreover, since aluminum and silver can be easily etched, they are easily patterned and can be minutely processed.

Copper has high conductivity, and thus can reduce signal delay. When copper is used, a stacked-layer structure is preferably employed to improve adhesion.

Molybdenum and titanium are preferable because even if molybdenum or titanium is in contact with an oxide semiconductor (e.g., indium tin oxide (ITO) or indium zinc oxide (IZO)) or silicon, molybdenum or titanium does not cause defects. Moreover, molybdenum and titanium are preferable because they are easily etched and have high heat resistance.

Tungsten is preferable because it has advantages such as high heat resistance.

Neodymium is preferable because it has advantages such as high heat resistance. In particular, an alloy of neodymium and aluminum is preferable because heat resistance is increased and aluminum dose not easily cause hillocks.

Silicon is preferable because it can be formed at the same time as a semiconductor layer included in a transistor and has high heat resistance.

Since indium tin oxide (ITO), indium zinc oxide (IZO), indium tin oxide containing silicon oxide (ITSO), zinc oxide (ZnO), silicon (Si), tin oxide (SnO), and cadmium tin oxide (CTO) have light-transmitting properties, they can be used for a portion which transmits light. For example, they can be used for a pixel electrode or a common electrode.

IZO is preferable because it is easily etched and processed. In etching IZO, a residue is hardly left. Accordingly, when IZO is used for a pixel electrode, defects (such as short circuit or orientation disorder) of a liquid crystal element or a light-emitting element can be reduced.

Note that a wiring, an electrode, a conductive layer, a conductive film, a terminal, a via, a plug, or the like may have a single-layer structure or a multi-layer structure. By employing a single-layer structure, each manufacturing process of a wiring, an electrode, a conductive layer, a conductive film, a terminal, or the like can be simplified, the number of days for a process can be reduced, and cost can be reduced. Alternatively, by employing a multi-layer structure, a wiring, an electrode, and the like with high quality can be formed while an advantage of each material is utilized and a disadvantage thereof is reduced. For example, when a low-resistant material (e.g., aluminum) is included in a multi-layer structure, reduction in resistance of a wiring can be realized. As another example, when a stacked-layer structure in which a low heat-resistant material is interposed between high heat-resistant materials is employed, heat resistance of a wiring, an electrode, and the like can be increased, utilizing advantages of the low heat-resistance material. For example, it is preferable to employ a stacked-layer structure in which a layer containing aluminum is interposed between layers containing molybdenum, titanium, neodymium, or the like.

When wirings, electrodes, or the like are in direct contact with each other, they adversely affect each other in some cases. For example, one wiring or one electrode is mixed into a material of another wiring or another electrode and changes its properties, and thus, an intended function cannot be obtained in some cases. As another example, when a high-resistant portion is formed, a problem may occur so that it cannot be normally formed. In such cases, a reactive material is preferably interposed by or covered with a non-reactive material in a stacked-layer structure. For example, when ITO and aluminum are connected, titanium, molybdenum, or an alloy of neodymium is preferably interposed between ITO and aluminum. As another example, when silicon and aluminum are connected, titanium, molybdenum, or an alloy of neodymium is preferably interposed between silicon and aluminum.

Note that a wiring refers to a portion including a conductor. A wiring may extend linearly or be made to be short without extension. Therefore, an electrode is included in a wiring.

Note that a carbon nanotube may be used for a wiring, an electrode, a conductive layer, a conductive film, a terminal, a via, a plug, or the like. Since a carbon nanotube has a light-transmitting property, it can be used for a portion which transmits light. For example, a carbon nanotube can be used for a pixel electrode or a common electrode.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode. Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 4

In this embodiment mode, a peripheral portion of a liquid crystal panel is described.

FIG. 21 shows an example of a liquid crystal display device including a so-called edge-light type backlight unit 1001 and a liquid crystal panel 1007. An edge-light type corresponds to a type in which a light source is provided at an end of a backlight unit and fluorescence of the light source is emitted from the entire light-emitting surface. The edge-light type backlight unit is thin and can save power.

The backlight unit 1001 includes a diffusion plate 1002, a light guide plate 1003, a reflection plate 1004, a lamp reflector 1005, and a light source 1006.

The light source 1006 has a function of emitting light as necessary. For example, as the light source 1006, a cold cathode fluorescent lamp, a hot cathode fluorescent lamp, a light-emitting diode, an inorganic EL element, an organic EL element, or the like is used.

FIGS. 22A, 22B, 22C, and 22D each show a detailed structure of the edge-light type backlight unit. Note that description of a diffusion plate, a light guide plate, a reflection plate, and the like is omitted.

Figure 22A:
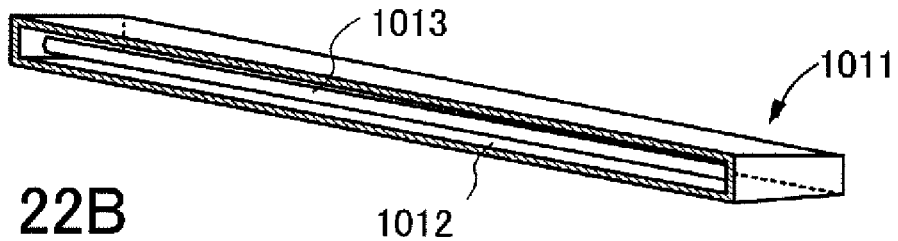
FIGS. 22A to 22D are cross-sectional views each illustrating a liquid crystal display device of the present invention.

A backlight unit 1011 shown in FIG. 22A has a structure in which a cold cathode fluorescent lamp 1013 is used as a light source. In addition, a lamp reflector 1012 is provided to efficiently reflect light from the cold cathode fluorescent lamp 1013. Such a structure is often used for a large display device because luminance of light from the cold cathode fluorescent lamp 1013 is high.

Figure 22B:
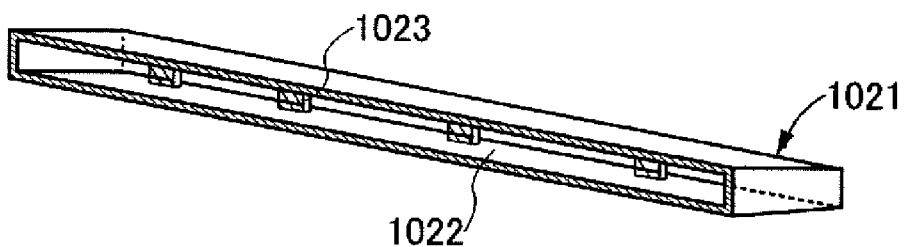

A backlight unit 1021 shown in FIG. 22B has a structure in which light-emitting diodes (LEDs) 1023 are used as light sources. For example, the light-emitting diodes (LEDs) 1023 which emit white light are provided at predetermined intervals. In addition, a lamp reflector 1022 is provided to efficiently reflect light from the light-emitting diodes (LEDs) 1023.

Figure 22C:
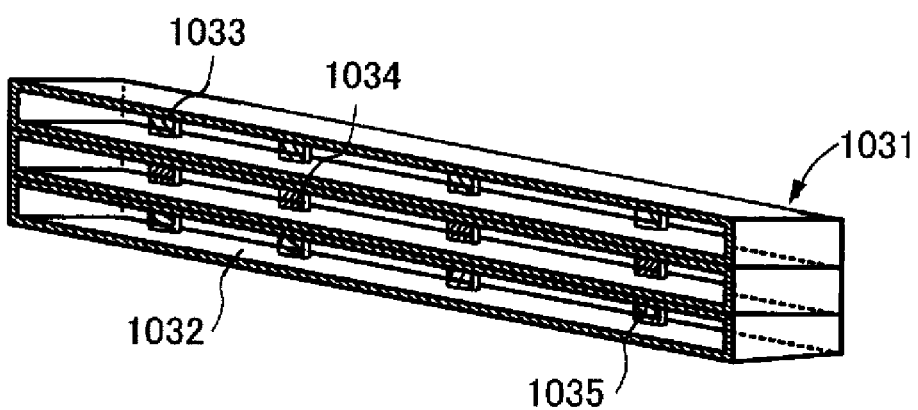

A backlight unit 1031 shown in FIG. 22C has a structure in which light-emitting diodes (LEDs) 1033, light-emitting diodes (LEDs) 1034, and light-emitting diodes (LEDs) 1035 of R, G, and B are used as light sources. The light-emitting diodes (LEDs) 1033, the light-emitting diodes (LEDs) 1034, and the light-emitting diodes (LEDs) 1035 of R, G, and B are each provided at predetermined intervals. When the light-emitting diodes (LEDs) 1033, the light-emitting diodes (LEDs) 1034, and the light-emitting diodes (LEDs) 1035 of R, G, and B are used, color reproductivity can be improved. In addition, a lamp reflector 1032 is provided to efficiently reflect light from the light-emitting diodes.

Figure 22D:
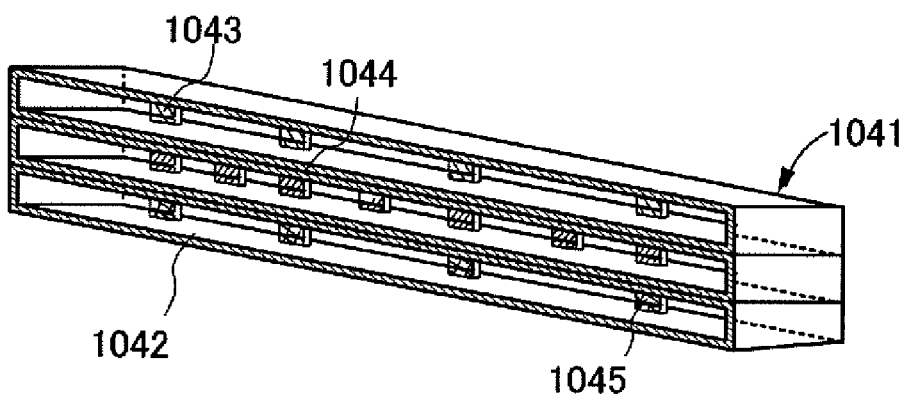

A backlight unit 1041 shown in FIG. 22D has a structure in which light-emitting diodes (LEDs) 1043, light-emitting diodes (LEDs) 1044, and light-emitting diodes (LEDs) 1045 of R, G, and B are used as light sources. For example, among the light-emitting diodes (LEDs) 1043, the light-emitting diodes (LEDs) 1044, and the light-emitting diodes (LEDs) 1045 of R, G, and B, a plurality of the light-emitting diodes of a color with low emission intensity (e.g., green) are provided. When the light-emitting diodes (LEDs) 1043, the light-emitting diodes (LEDs) 1044, and the light-emitting diodes (LEDs) 1045 of R, G, and B are used, color reproductivity can be improved. In addition, a lamp reflector 1042 is provided to efficiently reflect light from the light-emitting diodes.

Figure 25:
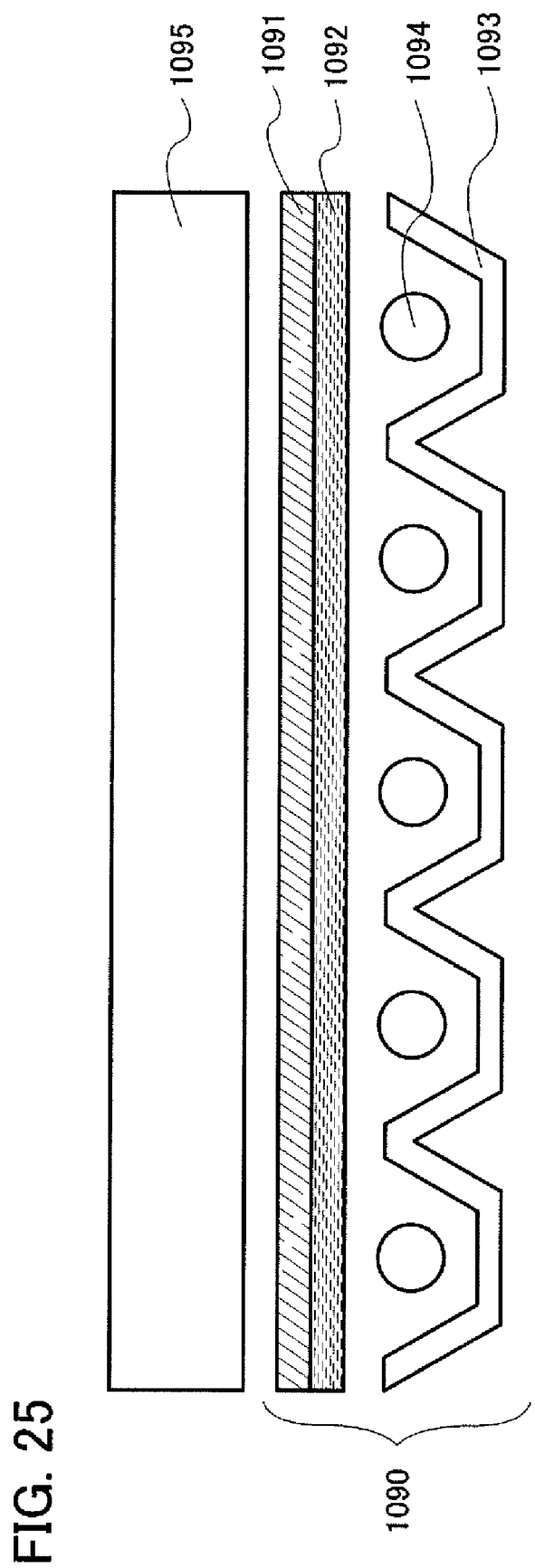
FIG. 25 is a cross-sectional view illustrating a liquid crystal display device of the present invention.

FIG. 25 shows an example of a liquid crystal display device including a so-called direct-type backlight unit and a liquid crystal panel. A direct type corresponds to a type in which a light source is provided directly under a light-emitting surface and fluorescence of the light source is emitted from the entire light-emitting surface. The direct-type backlight unit can efficiently utilize the amount of emitted light.

A backlight unit 1090 includes a diffusion plate 1091, a light-shielding plate 1092, a lamp reflector 1093, and a light source 1094. When a liquid crystal panel 1095 is added, a liquid crystal display device is completed.

The light source 1094 has a function of emitting light as necessary. For example, as the light source 1094, a cold cathode fluorescent lamp, a hot cathode fluorescent lamp, a light-emitting diode, an inorganic EL element, an organic EL element, or the like is used.

Figure 23:
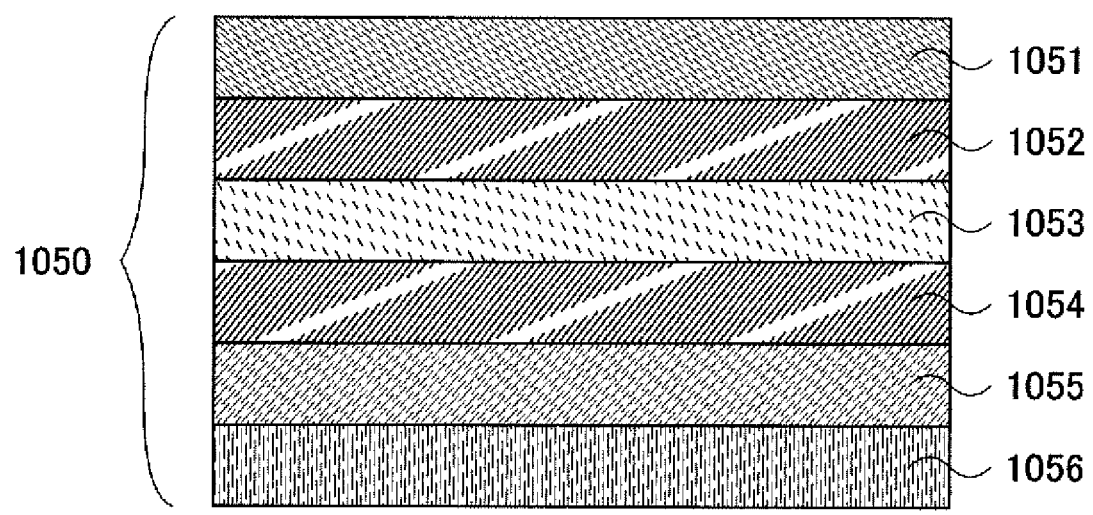
FIG. 23 is a cross-sectional view illustrating a liquid crystal display device of the present invention.

FIG. 23 shows an example of a structure of a polarizing plate (also referred to as a polarizing film).

A polarizing film 1050 includes a protective film 1051, a substrate film 1052, a PVA polarizing film 1053, a substrate film 1054, an adhesive layer 1055, and a mold release film 1056.

When the PVA polarizing film 1053 is sandwiched by films to be base materials (the substrate film 1052 and the substrate film 1054) from both sides, reliability can be improved. Note that the PVA polarizing film 1053 may be sandwiched by triacetylcellulose (TAC) films with high light-transmitting properties and high durability. Note that each of the substrate films and the TAC films function as protective films of polarizer included in the PVA polarizing film 1053.

The adhesive layer 1055 which is to be attached to a glass substrate of the liquid crystal panel is attached to one of the substrate films (the substrate film 1054). Note that the adhesive layer 1055 is formed by applying an adhesive to one of the substrate films (the substrate film 1054). The mold release film 1056 (a separate film) is provided to the adhesive layer 1055.

The protective film 1051 is provided to the other of the substrates films (the substrate film 1052).

A hard coating scattering layer (an anti-glare layer) may be provided on a surface of the polarizing film 1050. Since the surface of the hard coating scattering layer has minute unevenness formed by AG treatment and has an anti-glare function which scatters external light, reflection of external light in the liquid crystal panel can be prevented. Surface reflection can also be prevented.

Note that treatment in which plurality of optical thin film layers having different refractive indexes are layered (also referred to as anti-reflection treatment or AR treatment) may be performed on the surface of the polarizing film 1050. The plurality of layered optical thin film layers having different refractive indexes can reduce reflectivity on the surface by an interference effect of light.

Figure 24A:
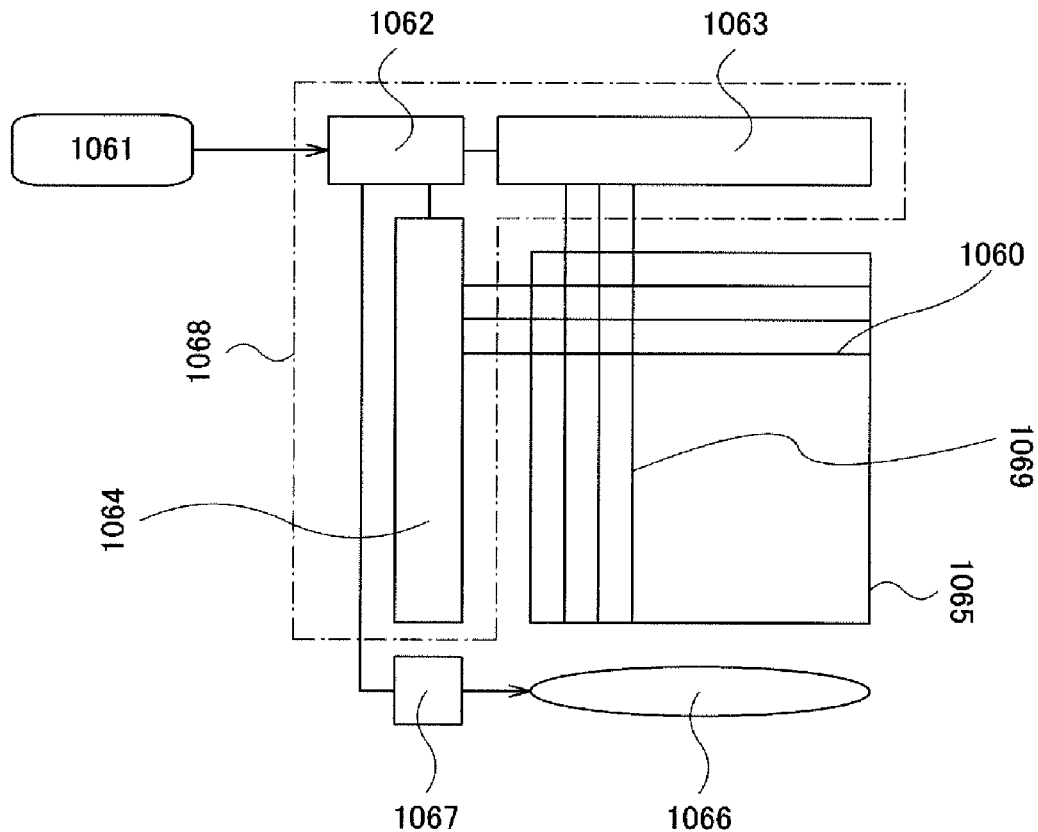
FIGS. 24A to 24C each illustrate a structure of a liquid crystal display device of the present invention.
Figure 24B:
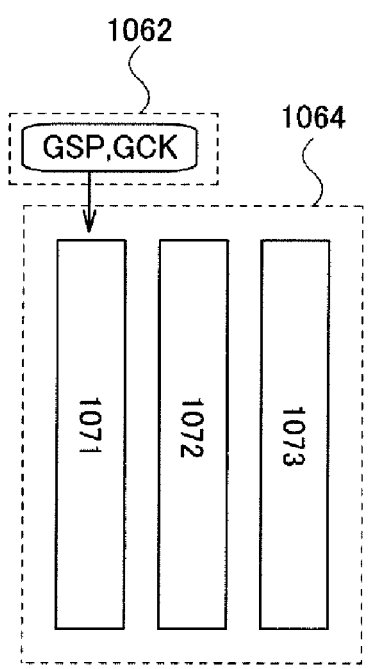
Figure 24C:
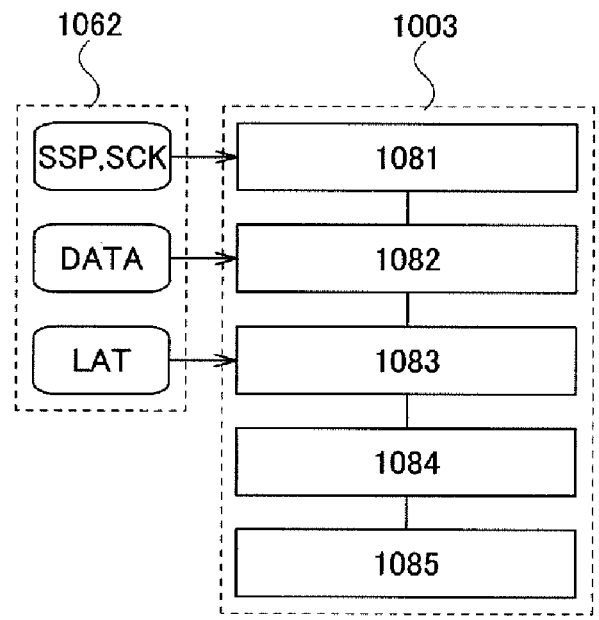

FIGS. 24A to 24C each show an example of a system block of the liquid crystal display device.

In a pixel portion 1065, signal lines 1069 which extend from a signal line driver circuit 1063 are provided. In addition, in the pixel portion 1065, scan lines 1060 which extend from a scan line driver circuit 1064 are also provided. In addition, a plurality of pixels are arranged in matrix in cross regions of the signal lines 1069 and the scan lines 1060. Note that each of the plurality of pixels includes a switching element. Therefore, voltage for controlling inclination of liquid crystal molecules can be separately input to each of the plurality of pixels. A structure in which a switching element is provided in each cross region in this manner is referred to as an active matrix type. Note that the present invention is not limited to such an active matrix type and a structure of a passive matrix type may be used. Since the passive matrix type does not have a switching element in each pixel, a process is simple.

A driver circuit portion 1068 includes a control circuit 1062, the signal line driver circuit 1063, and the scan line driver circuit 1064. An image signal 1061 is input to the control circuit 1062. The signal line driver circuit 1063 and the scan line driver circuit 1064 are controlled by the control circuit 1062 in accordance with this image signal 1061. Therefore, the control circuit 1062 inputs a control signal to each of the signal line driver circuit 1063 and the scan line driver circuit 1064. Then, in accordance with this control signal, the signal line driver circuit 1063 inputs a video signal to each of the signal lines 1069 and the scan line driver circuit 1064 inputs a scan signal to each of the scan lines 1060. Then, the switching element included in the pixel is selected in accordance with the scan signal and the video signal is input to a pixel electrode of the pixel.

Note that the control circuit 1062 also controls a power source 1067 in accordance with the image signal 1061. The power source 1067 includes a unit for supplying power to a lighting unit 1066. As the lighting unit 1066, an edge-light type backlight unit or a direct-type backlight unit can be used. Note that a front light may be used as the lighting unit 1066. A front light corresponds to a plate-like lighting unit including a luminous body and a light conducting body, which is attached to the front surface side of a pixel portion and illuminates the whole area. When such a lighting unit is used, the pixel portion can be uniformly illuminated at low power consumption.

As shown in FIG. 24B, the scan line driver circuit 1064 includes a shift register 1071, a level shifter 1072, and a circuit functioning as a buffer 1073. A signal such as a gate start pulse (GSP) or a gate clock signal (GCK) is input to the shift register 20441.

As shown in FIG. 24C, the signal line driver circuit 1063 includes a shift register 1081, a first latch 1082, a second latch 1083, a level shifter 1084, and a circuit functioning as a buffer 1085. The circuit functioning as the buffer 1085 corresponds to a circuit which has a function of amplifying a weak signal and includes an operational amplifier or the like. A signal such as a source start pulse (SSP) is input to the level shifter 1084 and data (DATA) such as a video signal is input to the first latch 1082. A latch (LAT) signal can be temporally held in the second latch 1083 and is simultaneously input to the pixel portion 1065. This is referred to as line sequential driving. Therefore, when a pixel is used in which not line sequential driving but dot sequential driving is performed, the second latch can be omitted.

For example, when a transistor which is formed by any of the manufacturing methods in Embodiment Modes 1 to 3 is used for each circuit of the system block of the liquid crystal display device in FIGS. 24A to 24C, a liquid crystal display device which is larger, easily operates normally, and has excellent current characteristics can be obtained.

Note that in this embodiment mode, various liquid crystal panels can be used for the liquid crystal panel. For example, a structure in which a liquid crystal layer is sealed between two substrates can be used as the liquid crystal panel. A transistor, a capacitor, a pixel electrode, an alignment film, or the like is formed over one of the substrates. A polarizing plate, a retardation plate, or a prism sheet may be provided on the surface opposite to a top surface of the one of the substrates. A color filter, a black matrix, a counter electrode, an alignment film, or the like is provided on the other of the substrates. A polarizing plate or a retardation plate may be provided on the surface opposite to a top surface of the other of the substrates. The color filter and the black matrix may be formed over the top surface of the one of the substrates. Note that three-dimensional display can be performed by providing a slit (a grid) on the top surface side of the one of the substrates or the surface opposite to the top surface side of the one of the substrates.

Each of the polarizing plate, the retardation plate, and the prism sheet can be provided between the two substrates. Alternatively, each of the polarizing plate, the retardation plate, and the prism sheet can be integrated with one of the two substrates.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 5

In this embodiment mode, a pixel structure and an operation of a pixel which can be applied to a liquid crystal display device are described.

In this embodiment mode, as an operation mode of a liquid crystal element, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antifeferroelectric liquid crystal) mode, or the like can be used.

Figure 26A:
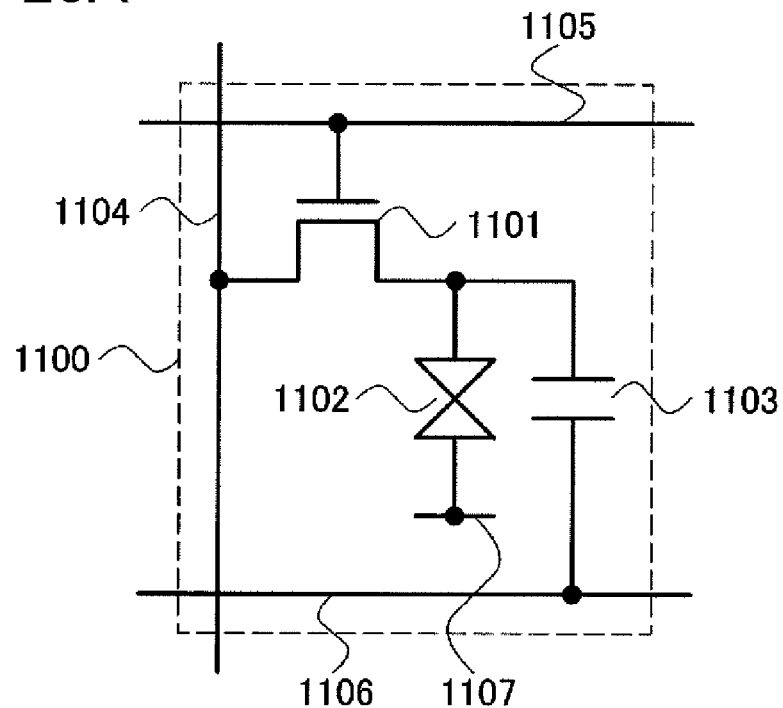
FIGS. 26A and 26B are circuit diagrams each illustrating a pixel of the present invention.

FIG. 26A shows an example of a pixel structure which can be applied to the liquid crystal display device.

A pixel 1100 includes a transistor 1101, a liquid crystal element 1102, and a capacitor 1103. A gate of the transistor 1101 is connected to a wiring 1105. A first terminal of the transistor 1101 is connected to a wiring 1104. A second terminal of the transistor 1101 is connected to a first electrode of the liquid crystal element 1102 and a first electrode of the capacitor 1103. A second electrode of the liquid crystal element 1102 corresponds to a counter electrode 1107. A second electrode of the capacitor 1103 is connected to a wiring 1106.

The wiring 1104 functions as a signal line. The wiring 1105 functions as a scan line. The wiring 1106 functions as a capacitor line. The transistor 1101 functions as a switch. The capacitor 1103 functions as a storage capacitor.

It is acceptable as long as the transistor 1101 functions as a switch, and the transistor 1101 may be either a P-channel transistor or an N-channel transistor.

Figure 26B:
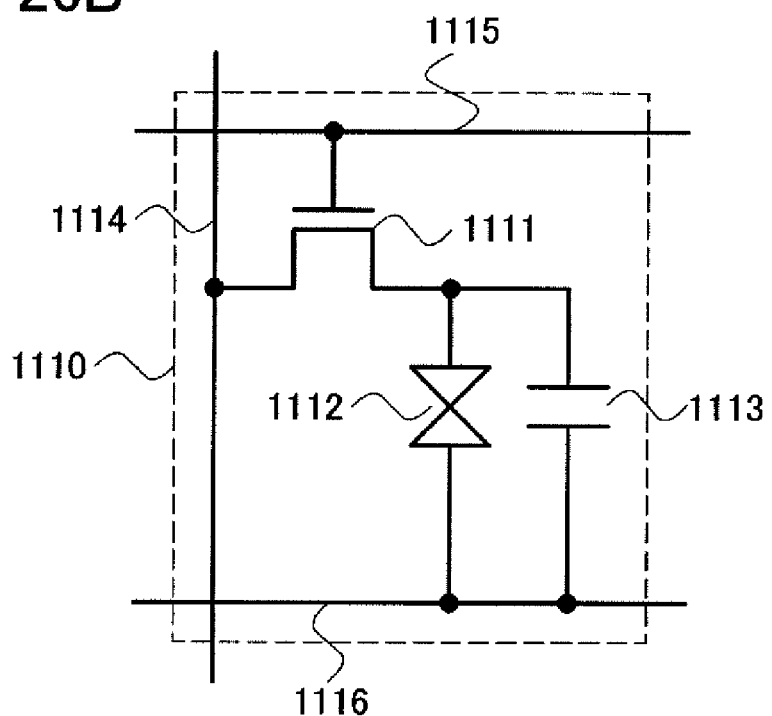

FIG. 26B shows an example of a pixel structure which can be applied to the liquid crystal display device. In particular, FIG. 26B shows an example of a pixel structure which can be applied to a liquid crystal display device suitable for a horizontal electric field mode (including an IPS mode and an FFS mode).

A pixel 1110 includes a transistor 1111, a liquid crystal element 1112, and a capacitor 1113. A gate of the transistor 1111 is connected to a wiring 1115. A first terminal of the transistor 1111 is connected to a wiring 1114. A second terminal of the transistor 1111 is connected to a first electrode of the liquid crystal element 1112 and a first electrode of the capacitor 1113. A second electrode of the liquid crystal element 1112 is connected to a wiring 1116. A second electrode of the capacitor 1113 is connected to the wiring 1116.

The wiring 1114 functions as a signal line. The wiring 1115 functions as a scan line. The wiring 1116 functions as a capacitor line. The transistor 1111 functions as a switch. The capacitor 1113 functions as a storage capacitor.

It is acceptable as long as the transistor 1111 functions as a switch, and the transistor 1111 may be either a P-channel transistor or an N-channel transistor.

Figure 27:
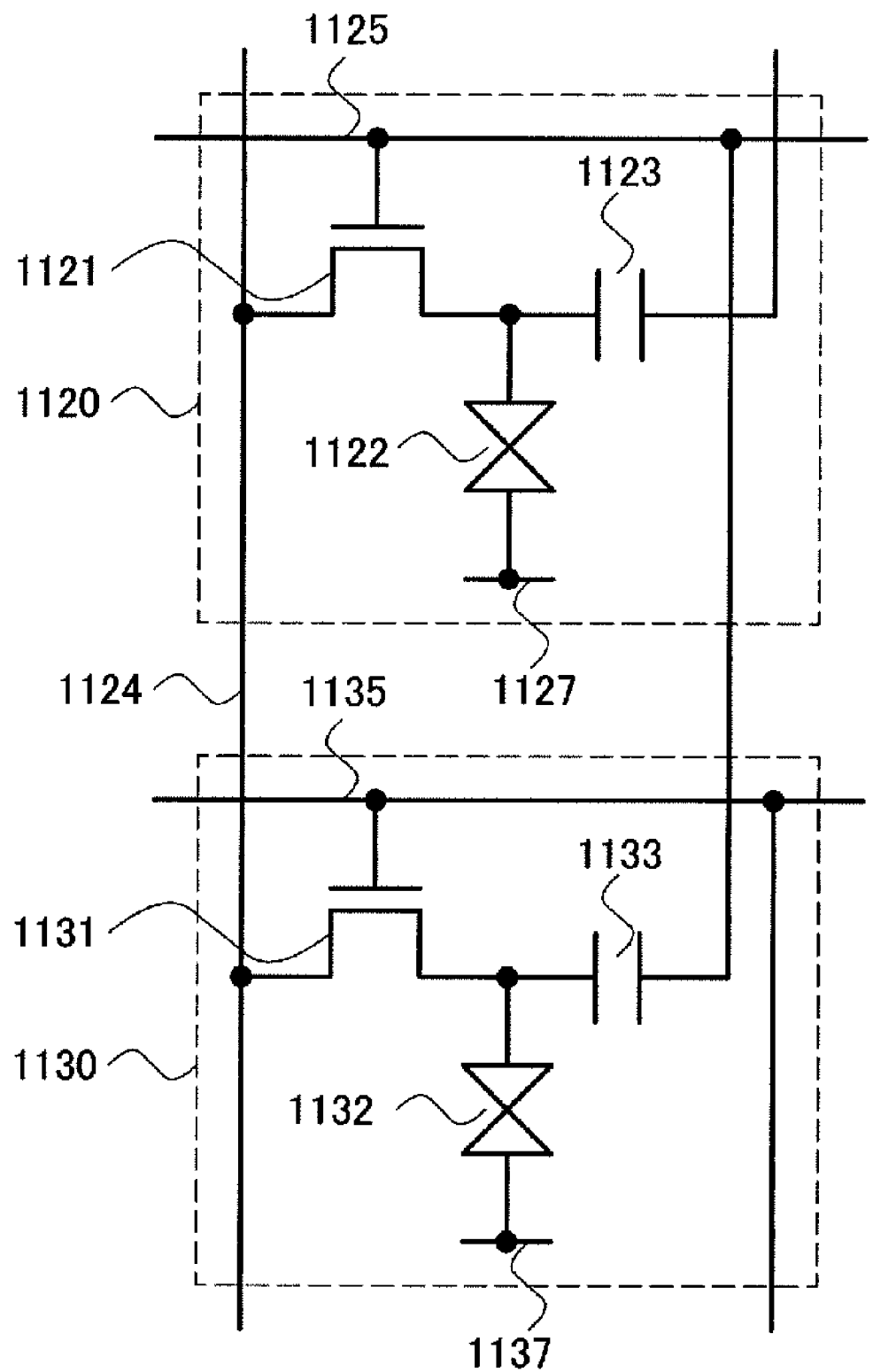
FIG. 27 is a circuit diagram illustrating a pixel of the present invention.

FIG. 27 shows an example of a pixel structure which can be applied to the liquid crystal display device. In particular, FIG. 27 shows an example of a pixel structure in which the aperture ratio of a pixel can be increased by reducing the number of wirings.

FIG. 27 shows two pixels which are provided in the same column direction (a pixel 1120 and a pixel 1130). For example, when the pixel 1120 is provided in an N-th row, the pixel 1130 is provided in an (N+1)th row.

A pixel 1120 includes a transistor 1121, a liquid crystal element 1122, and a capacitor 1123. A gate of the transistor 1121 is connected to a wiring 1125. A first terminal of the transistor 1121 is connected to a wiring 1124. A second terminal of the transistor 1121 is connected to a first electrode of the liquid crystal element 1122 and a first electrode of the capacitor 1123. A second electrode of the liquid crystal element 1122 corresponds to a counter electrode 1127. A second electrode of the capacitor 1123 is connected to a wiring which is the same as a wiring connected to a gate of a transistor of the previous row.

A pixel 1130 includes a transistor 1131, a liquid crystal element 1132, and a capacitor 1133. A gate of the transistor 1131 is connected to a wiring 1135. A first terminal of the transistor 1131 is connected to the wiring 1124. A second terminal of the transistor 1131 is connected to a first electrode of the liquid crystal element 1132 and a first electrode of the capacitor 1133. A second electrode of the liquid crystal element 1132 corresponds to a counter electrode 1137. A second electrode of the capacitor 1133 is connected to the wiring which is the same as the wiring connected to the gate of the transistor of the previous row (the wiring 1125).

The wiring 1124 functions as a signal line. The wiring 1125 functions as a scan line of the N-th row. The wiring 1125 also functions as a capacitor line of the (N+1)th row. The transistor 1121 functions as a switch. The capacitor 1123 functions as a storage capacitor.

The wiring 1135 functions as a scan line of the (N+1)th row. The wiring 1135 also functions as a capacitor line of the (N+2)th row. The transistor 1131 functions as a switch. The capacitor 1133 functions as a storage capacitor.

It is acceptable as long as each of the transistor 1121 and the transistor 1131 functions as a switch, and each of the transistor 1121 and the transistor 1031 may be either a P-channel transistor or an N-channel transistor.

Figure 28:
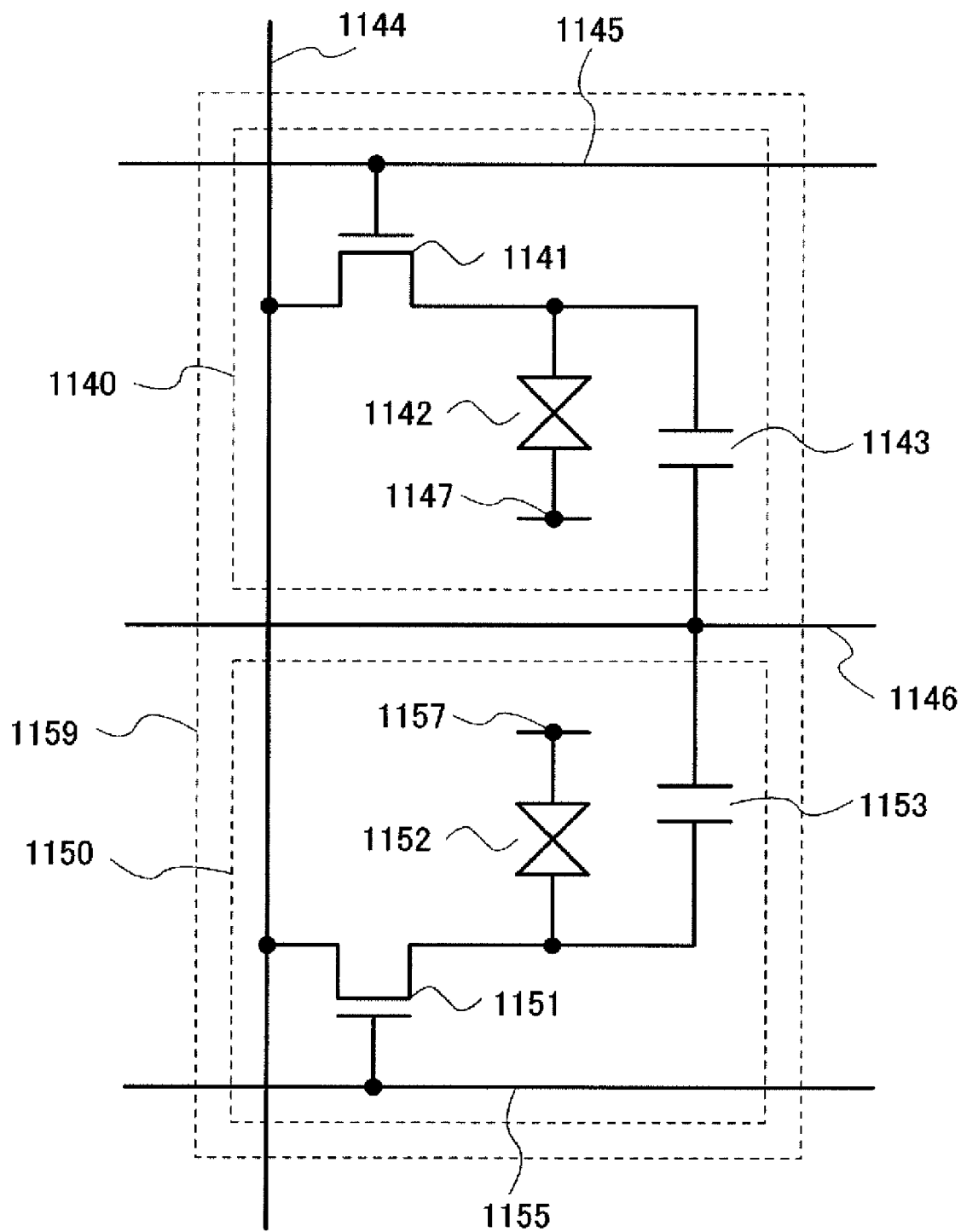
FIG. 28 is a circuit diagram illustrating a pixel of the present invention.

FIG. 28 shows an example of a pixel structure which can be applied to the liquid crystal display device. In particular, FIG. 28 shows an example of a pixel structure in which the viewing angle can be improved by using a subpixel.

A pixel 1159 includes a subpixel 1140 and a subpixel 1150. Although the case in which the pixel 1159 includes two subpixels is described, the pixel 1159 may include three or more subpixels.

The subpixel 1140 includes a transistor 1141, a liquid crystal element 1142, and a capacitor 1143. A gate of the transistor 1141 is connected to a wiring 1145. A first terminal of the transistor 1141 is connected to a wiring 1144. A second terminal of the transistor 1141 is connected to a first electrode of the liquid crystal element 1142 and a first electrode of the capacitor 1143. A second electrode of the liquid crystal element 1142 corresponds to a counter electrode 1147. A second electrode of the capacitor 1143 is connected to a wiring 1146.

The subpixel 1150 includes a transistor 1151, a liquid crystal element 1152, and a capacitor 1153. A gate of the transistor 1151 is connected to a wiring 1155. A first terminal of the transistor 1151 is connected to the wiring 1144. A second terminal of the transistor 1151 is connected to a first electrode of the liquid crystal element 1152 and a first electrode of the capacitor 1153. A second electrode of the liquid crystal element 1152 corresponds to a counter electrode 1157. A second electrode of the capacitor 1153 is connected to the wiring 1146.

The wiring 1144 functions as a signal line. The wiring 1145 functions as a scan line. The wiring 1155 functions as a signal line. The wiring 1146 functions as a capacitor line. Each of the transistor 1141 and the transistor 1151 functions as a switch. Each of the capacitor 1143 and the capacitor 1153 functions as a storage capacitor.

It is acceptable as long as each of the transistor 1141 and the transistor 1151 functions as a switch, and each of the transistor 1141 and the transistor 1151 may be either a P-channel transistor or an N-channel transistor.

A video signal input to the subpixel 1140 may be a value which is different from that of a video signal input to the subpixel 1150. In this case, the viewing angle can be widened because alignment of liquid crystal molecules of the liquid crystal element 1142 and alignment of liquid crystal molecules of the liquid crystal element 1152 can be varied from each other.

For example, when a transistor which is formed by any of the manufacturing methods in Embodiment Modes 1 to 3 is used for each circuit of the system block of the liquid crystal display device in FIGS. 24A to 24C, a liquid crystal display device which is larger, easily operates normally, and has excellent current characteristics can be obtained.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 6

In this embodiment mode, a structure and an operation of a pixel in a display device are described.

Figures 29A, 29B:
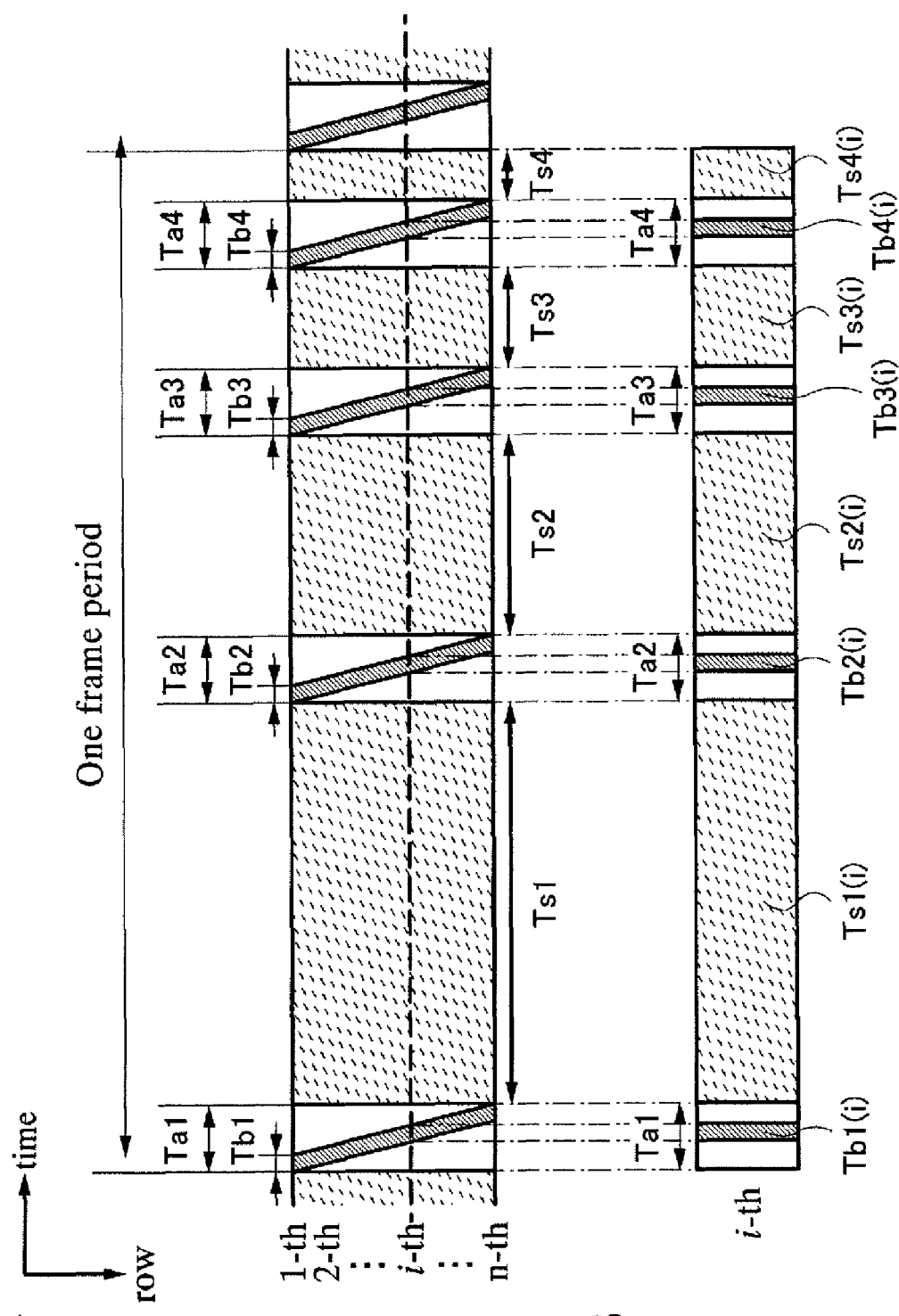
FIGS. 29A and 29B illustrating a method for driving a display device of the present invention.

FIGS. 29A and 29B are timing charts showing an example of digital time gray scale driving. The timing chart of FIG. 29A shows a driving method in the case where a signal writing period (an address period) to a pixel and a light-emitting period (a sustain period) are separated.

One frame period refers to a period for fully displaying an image for one display region. One frame period includes a plurality of subframe periods, and one subframe period includes an address period and a sustain period. Address periods $T_a1$ to $T_a4$ indicate time for writing signals to pixels in all rows, and periods Tb1 to Tb4 indicate time for writing signals to pixels in one row (or one pixel). Sustain periods $T_s1$ to $T_s4$ indicate time for maintaining a lighting state or a non-lighting state in accordance with a video signal written to the pixel, and a ratio of the length of the sustain periods is set to satisfy $T_s1:T_s2:T_s3:T_s4=2^3:2^2:2^1:2^0=8:4:2:1$. A gray scale is expressed depending on in which sustain period light emission is performed.

Here, an i-th pixel row are described with reference to FIG. 29B. First, in the address period $T_a1$, pixel selection signals are sequentially input to scan lines from a first row, and the pixel in the i-th row is selected in a period $T_b1$ (i) in the address period $T_a1$. Then, while the pixel in the i-th row is selected, a video signal is input to the pixel in the i-th row from a signal line. Then, when the video signal is written to the pixel in the i-th row, the pixel in the i-th row maintains the signal until a signal is input again. Lighting and non-lighting of the pixel in the i-th row in the sustain period $T_s1$ are controlled by the written video signal. Similarly, in the address periods $T_a2$, $T_a3$, and $T_a4$, a video signal is input to the pixel in the i-th row, and lighting and non-lighting of the pixel in the i-th row in the sustain periods $T_s2$, $T_s3$, and $T_s4$ are controlled by the video signal. Then, in each subframe period, a pixel to which a signal for not lighting in the address period and for lighting when the sustain period starts after the address period ends is written is lit.

Note that here, the case where a 4-bit gray scale is expressed is described here; however, the number of bits and the number of gray scales are not limited thereto. Note that lighting is not needed to be performed in order of $T_s1$, $T_s2$, $T_s3$, and $T_s4$, and the order may be random or light may be emitted by dividing the whole period into a plurality of periods. The ratio of lighting time of $T_s1$, $T_s2$, $T_s3$, and $T_s4$ is not needed to be a power of two, and may be the same length or slightly different from a power of two.

Next, a driving method in the case where a period for writing a signal to a pixel (an address period) and a light-emitting period (a sustain period) are not separated is described. That is, a pixel in a row in which a writing operation of a video signal is completed maintains the signal until another signal is written to the pixel (or the signal is erased). A period between the writing operation and writing of another signal to the pixel is referred to as data holding time. In the data holding time, the pixel is lit or not lit in accordance with the video signal written to the pixel. The same operations are performed until the last row, and the address period ends. Then, an operation proceeds to a signal writing operation of the next subframe period sequentially from a row in which the data holding time ends.

As described above, in the case of a driving method in which a pixel is lit or not lit in accordance with a video signal written to the pixel immediately after the signal writing operation is completed and the data holding time starts, the data holding time cannot be made shorter. This is because signals cannot be input to two rows at the same time even when the data holding time is made to be shorter than the address period, so that address periods need to be prevented from overlapping. Accordingly, it becomes difficult to perform high-level gray scale display.

Figure 30A:
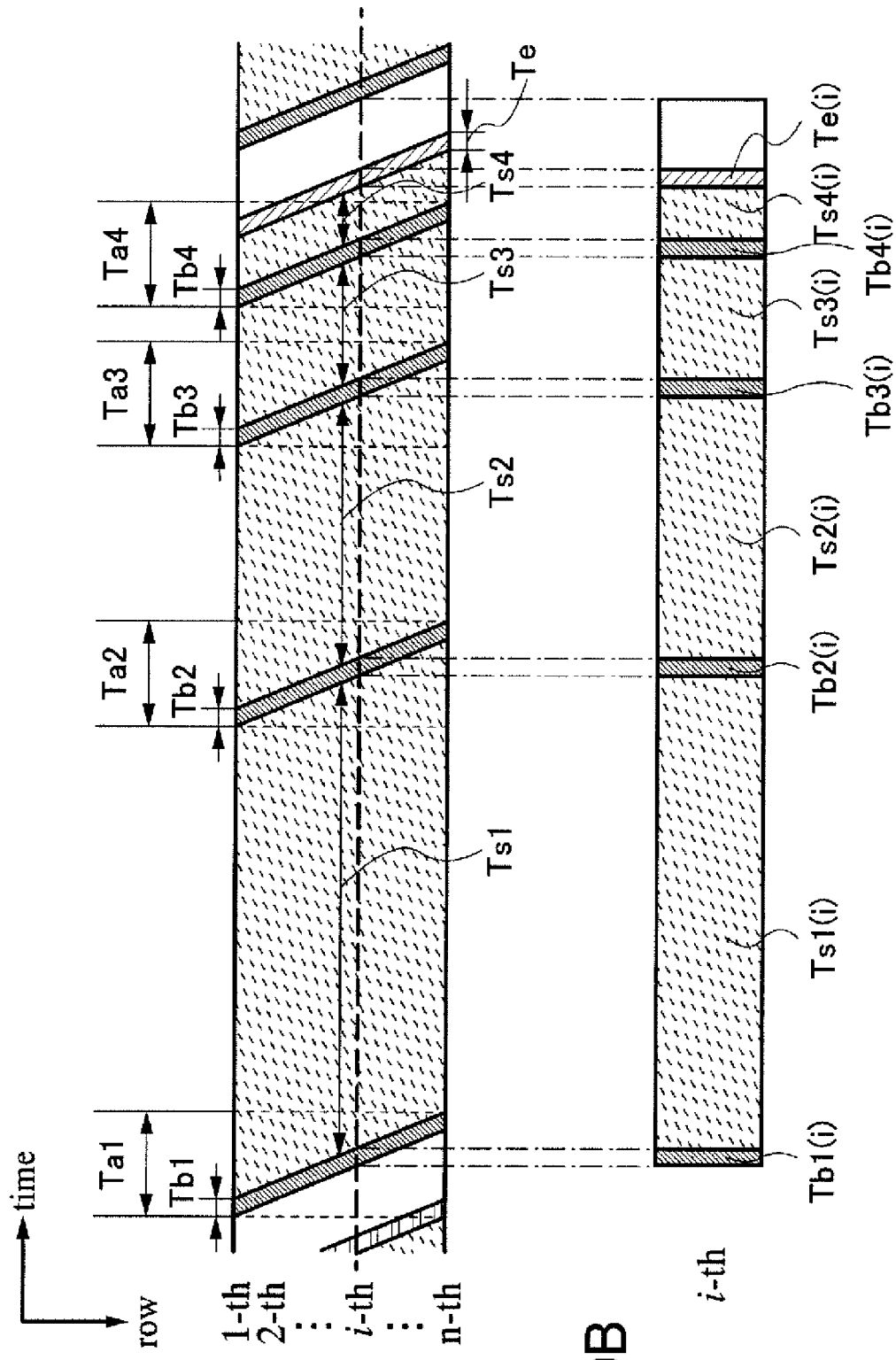
FIGS. 30A and 30B illustrating a method for driving a display device of the present invention.
Figure 30B:
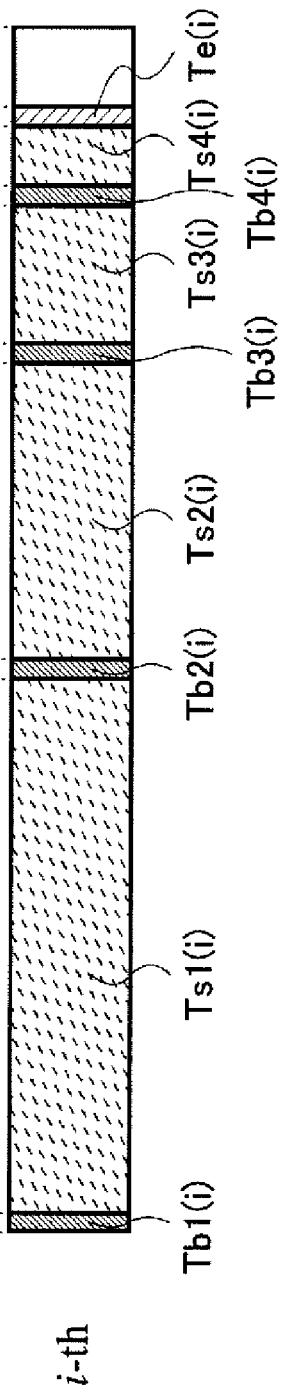

Thus, the data holding time which is shorter than the address period is set by providing an erasing period. A driving method in the case where the data holding time which is shorter than the address period is set by providing an erasing period is shown in FIG. 30A.

Here, the i-th pixel row is described with reference to FIG. 96B. In the address period $T_a1$, pixel scan signals are input to scan lines from a first row, and a pixel is selected. Then, in the period $T_b1(i)$, while the pixel in the i-th row is selected, a video signal is input to the pixel in the i-th row. Then, when the video signal is written to the pixel in the i-th row, the pixel in the i-th row maintains the signal until a signal is input again. Lighting and non-lighting of the pixel in the i-th row in a sustain period $T_s1(i)$ are controlled by the written video signal. That is, the pixel in the i-th row is lit or not lit in accordance with the video signal written to the pixel immediately after the writing operation of the video signal to the i-th row is completed. Similarly, in the address periods $T_a2$, $T_a3$, and $T_a4$, a video signal is input to the pixel in the i-th row, and lighting and non-lighting of the pixel in the i-th row in the sustain periods $T_s2$, $T_s3$, and $T_s4$ are controlled by the video signal. The end of a sustain period $T_s4(i)$ is set by the start of an erasing operation. This is because the pixel is forced to be not lit regardless of the video signal written to the pixel in the i-th row in an erasing time $T_e(i)$ in the i-th row. That is, the data holding time of the pixel in the i-th row ends when the erasing time $T_e(i)$ starts.

Thus, when data holding time which is shorter than an address period is set without separating the address period and a sustain period, a display device with a high-level gray scale and a high duty ratio (a ratio of a lighting period in one frame period) can be provided. Therefore, since instantaneous luminance of a pixel in the sustain period can be lowered and current flowing through a display element can be reduced, reliability of the display element can be improved.

Note that here, the case where a 4-bit gray scale is expressed is described here; however, the number of bits and the number of gray scales are not limited thereto. Note that lighting is not needed to be performed in order of $T_s1$, $T_s2$, $T_s3$, and $T_s4$, and the order may be random or light may be emitted by dividing the whole period into a plurality of periods. The ratio of lighting time of $T_s1$, $T_s2$, $T_s3$, and $T_s4$ is not needed to be a power of two, and may be the same length or slightly different from a power of two.

Next, a structure and an operation of a pixel to which digital time gray scale driving can be applied are described.

Figure 31:
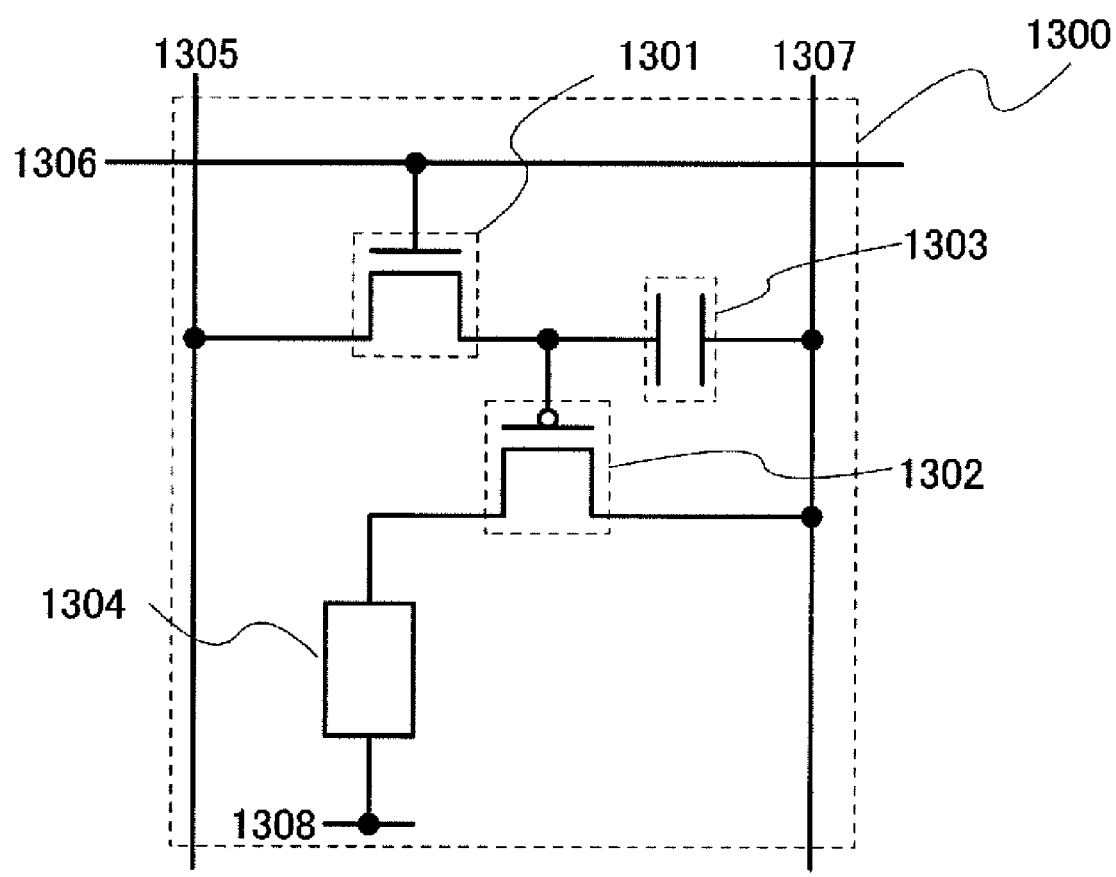
FIG. 31 is a circuit diagram illustrating a pixel of the present invention.

FIG. 31 shows an example of a pixel structure to which digital time gray scale driving can be applied.

A pixel 1300 includes a switching transistor 1301, a driving transistor 1302, a light-emitting element 1304, and a capacitor 1303. A gate of the switching transistor 1301 is connected to a scan line 1306. A first electrode (one of a source electrode and a drain electrode) of the switching transistor 1301 is connected to a signal line 1305. A second electrode (the other of the source electrode and the drain electrode) of the switching transistor 1301 is connected to a gate of the driving transistor 1302. The gate of the driving transistor 1302 is connected to a power supply line 1307 through the capacitor 1303. A first electrode of the driving transistor 1302 is connected to the power supply line 1307. A second electrode of the driving transistor 1302 is connected to a first electrode (a pixel electrode) of the light-emitting element 1304. A second electrode of the light-emitting element 1304 corresponds to a common electrode 1308.

Note that the second electrode (the common electrode 1308) of the light-emitting element 1304 is set to have a low power supply potential. A low power supply potential refers to a potential satisfying (the low power supply potential)<(a high power supply potential) based on the high power supply potential set to the power supply line 1307. As the low power supply potential, GND, 0 V, or the like may be set, for example. In order to make the light-emitting element 1304 emit light by applying a potential difference between the high power supply potential and the low power supply potential to the light-emitting element 1304 so that current is supplied to the light-emitting element 1304, each of the potentials is set so that the potential difference between the high power supply potential and the low power supply potential is equal to or higher than forward threshold voltage.

Note that the capacitor 1303 can be omitted by using gate capacitance of the driving transistor 1302 as a substitute for the capacitor 1303. The gate capacitance of the driving transistor 1302 may be formed in a region where a source region, a drain region, an LDD region, or the like overlaps with a gate electrode. Alternatively, the gate capacitance of the driving transistor 1302 may be formed between a channel region and the gate electrode.

Here, in the case of a voltage-input voltage driving method, a video signal is input to the gate of the driving transistor 1302 so that the driving transistor 1302 is in either of two states of being sufficiently turned on and turned off. That is, the driving transistor 1302 operates in a linear region.

Note that when the video signal by which the driving transistor 1302 operates in a saturation region is input, current can be supplied to the light-emitting element 1304. When the light-emitting element 1304 is an element, luminance of which is determined in accordance with current, luminance decay due to deterioration of the light-emitting element 1304 can be suppressed. Further, when the video signal is an analog signal, current in accordance with the video signal can be supplied to the light-emitting element 1304. In this case, analog gray scale driving can be performed.

Next, a structure and an operation of a pixel called a threshold voltage compensation pixel are described. A threshold voltage compensation pixel can be applied to digital time gray scale driving and analog gray scale driving.

Figure 32:
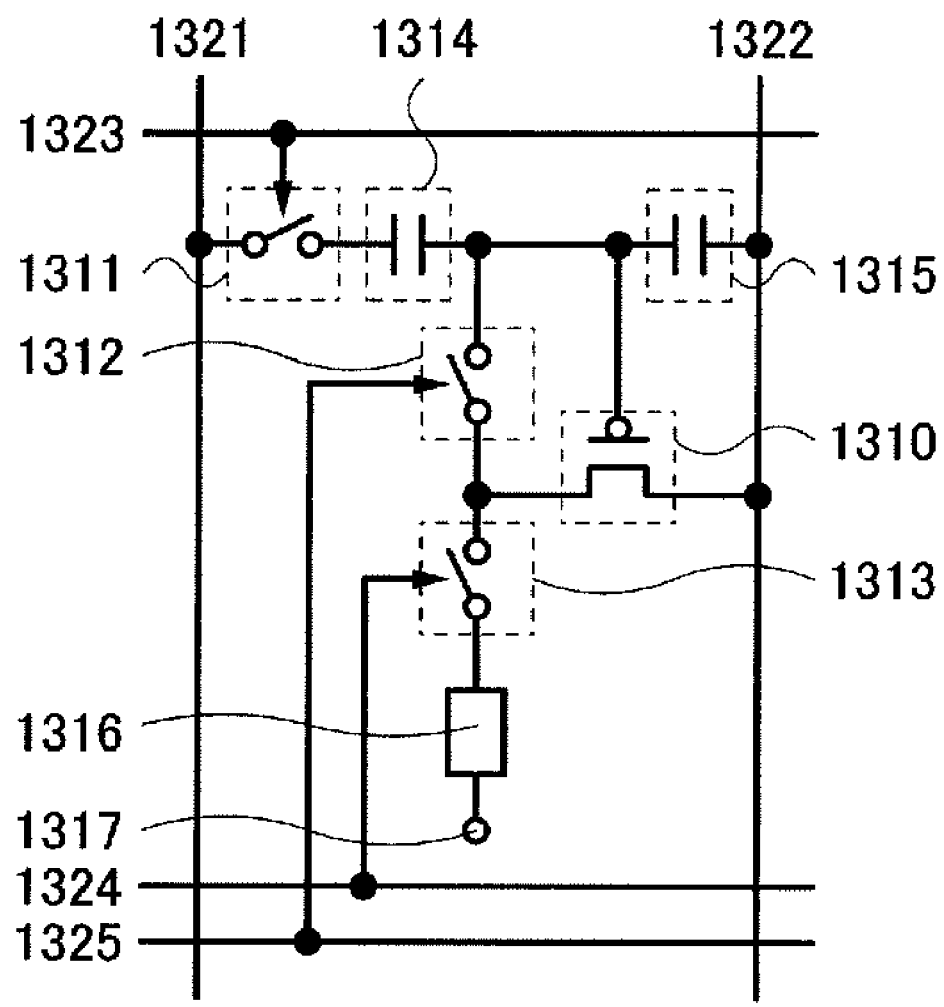
FIG. 32 is a circuit diagram illustrating a pixel of the present invention.

FIG. 32 shows an example of a structure of a pixel called a threshold voltage compensation pixel.

The pixel shown in FIG. 32 includes a driving transistor 1310, a first switch 1311, a second switch 1312, a third switch 1313, a first capacitor 1314, a second capacitor 1315, and a light-emitting element 1316. A gate of the driving transistor 1310 is connected to a signal line 1321 through the first capacitor 1314 and the first switch 1311 in that order. Further, the gate of the driving transistor 1310 is connected to a power supply line 1322 through the second capacitor 1315. A first electrode of the driving transistor 1310 is connected to the power supply line 1322. A second electrode of the driving transistor 1310 is connected to a first electrode of the light-emitting element 1316 through the third switch 1313. Further, the second electrode of the driving transistor 1310 is connected to the gate of the driving transistor 1310 through the second switch 1312. A second electrode of the light-emitting element 1316 corresponds to a common electrode 1317. Note that on/off of the first switch 1311, the second switch 1312, and the third switch 1313 is controlled by a signal input to a first scan line 1323, a signal input to a second scan line 1324, and a signal input to a third scan line 1325, respectively.

Note that a pixel structure of the present invention is not limited to the pixel structure shown in FIG. 32. For example, a switch, a resistor, a capacitor, a transistor, a logic circuit, or the like may be added to the pixel shown in FIG. 32. For example, the second switch 1312 may include a P-channel transistor or an N-channel transistor, the third switch 1313 may include a transistor with polarity different from that of the second switch 1312, and the second switch 1312 and the third switch 1313 may be controlled by the same scan line.

A structure and an operation of a pixel called a current input pixel are described. A current input pixel can be applied to digital gray scale driving and analog gray scale driving.

Figure 33:
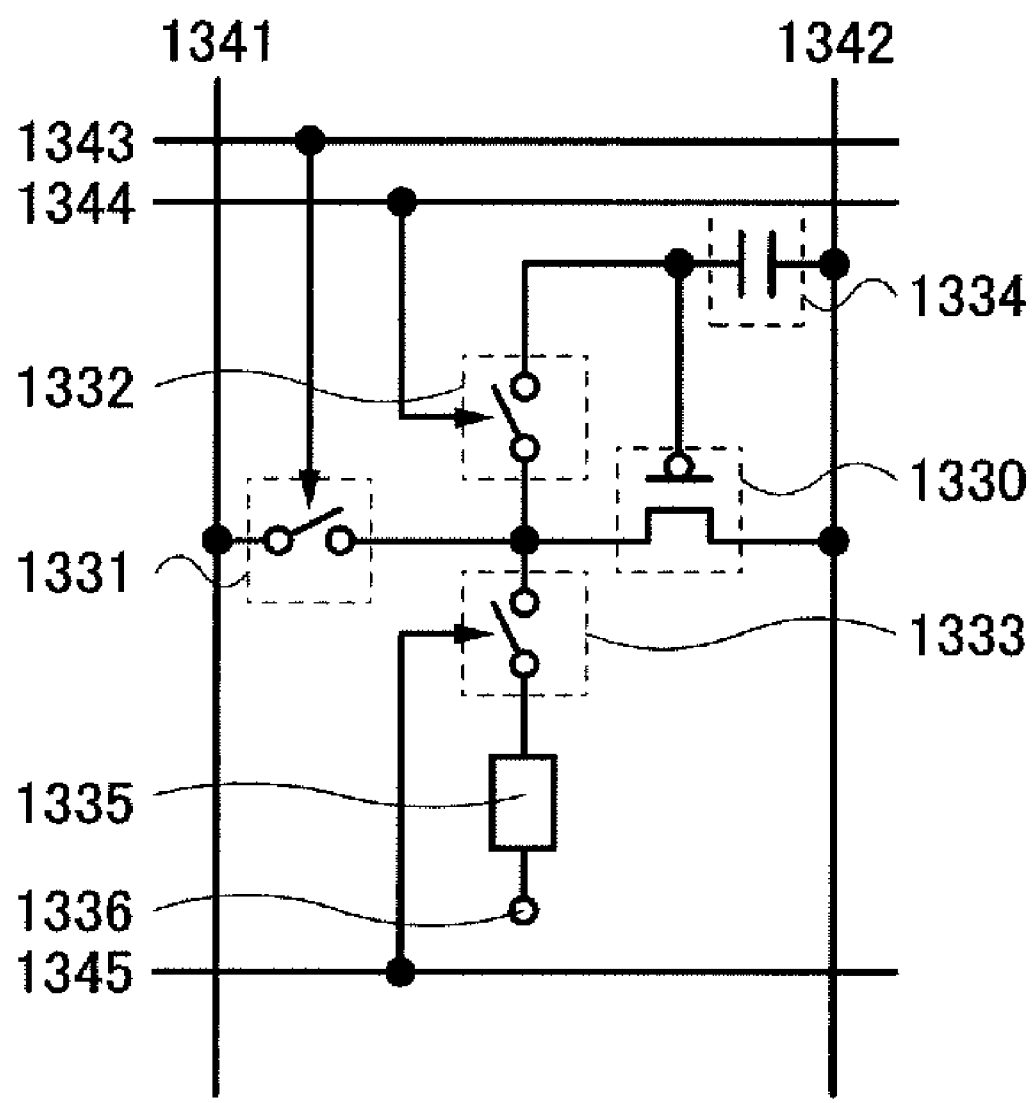
FIG. 33 is a circuit diagram illustrating a pixel of the present invention.

FIG. 33 shows an example of a structure of a current input pixel.

The pixel shown in FIG. 33 includes a driving transistor 1330, a first switch 1331, a second switch 1332, a third switch 1333, a capacitor 1334, and a light-emitting element 1335. A gate of the driving transistor 1330 is connected to a signal line 1341 through the second switch 1332 and the first switch 1331 in this order. Further, the gate of the driving transistor 1330 is connected to a power supply line 1342 through the capacitor 1334. A first electrode of the driving transistor 1330 is connected to the power supply line 1342. A second electrode of the driving transistor 1330 is connected to the signal line 1341 through the first switch 1331. Further, the second electrode of the driving transistor 1330 is connected to a first electrode of the light-emitting element 1335 through the third switch 1333. A second electrode of the light-emitting element 1335 corresponds to a common electrode 1336. Note that on/off of the first switch 1331, the second switch 1332, and the third switch 1333 is controlled by a signal input to a first scan line 1343, a signal input to a second scan line 1344, and a signal input to a third scan line 1345, respectively.

Note that the present invention is not limited to the pixel structure shown in FIG. 33. For example, a switch, a resistor, a capacitor, a transistor, a logic circuit, or the like may be added to the pixel shown in FIG. 33. For example, the first switch 1331 may include a P-channel transistor or an N-channel transistor, the second switch 1332 may include a transistor with the same polarity as that of the first switch 1331, and the first switch 1331 and the second switch 1332 may be controlled by the same scan line. The second switch 1332 may be provided between the gate of the driving transistor 1330 and the signal line 1341.

For example, when a transistor which is formed by any of the manufacturing methods in Embodiment Modes 1 to 3 is used for each circuit of the system block of the liquid crystal display device in FIGS. 24A to 24C, a display device which is larger, easily operates normally, and has excellent current characteristics can be obtained.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 7

In this embodiment mode, a pixel structure of a display device is described. In particular, a pixel structure of a display device using an organic EL element is described.

Figure 34A:
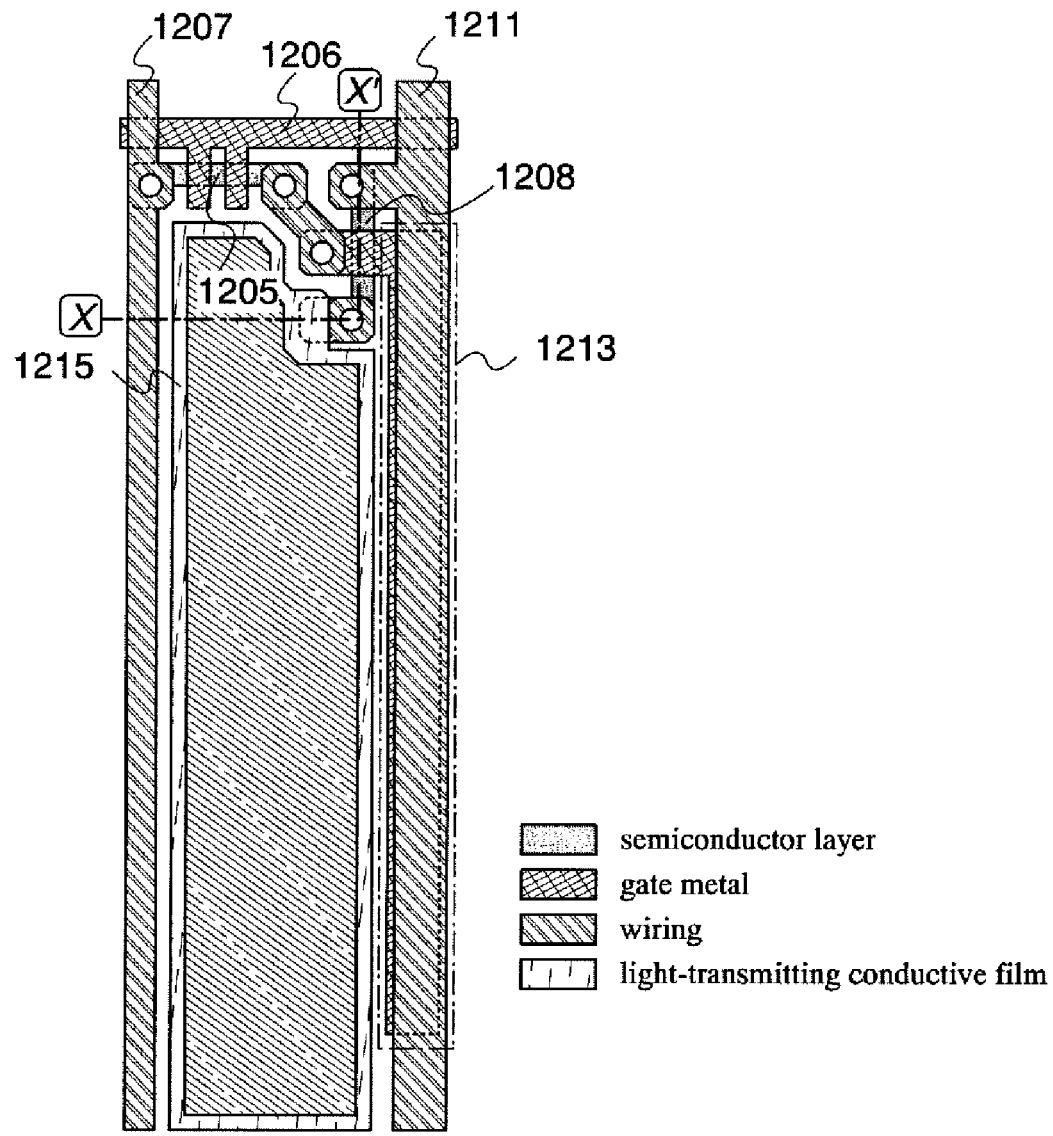
FIG. 34A is a top view of a pixel of the present invention.
Figure 34B:
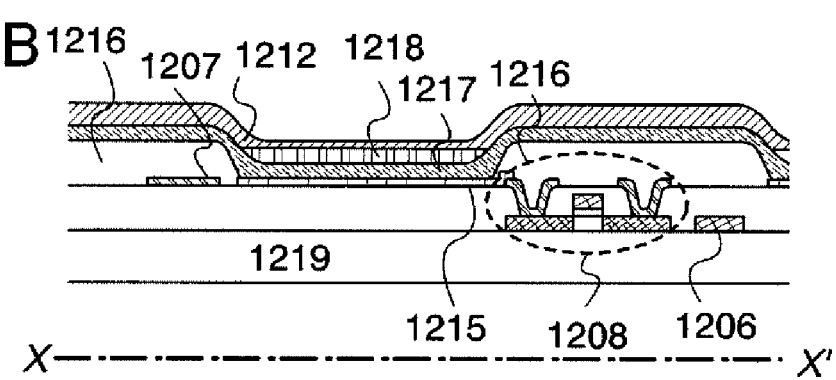
FIG. 34B is a cross-sectional view of a pixel of the present invention.

FIG. 34A shows an example of a top plan view (a layout diagram) of a pixel including two transistors. FIG. 34B shows an example of a cross-sectional view taken along X-X' in FIG. 34A.

FIGS. 34A and 34B show a first transistor 1205, a first wiring 1206, a second wiring 1207, a second transistor 1208, a third wiring 1211, a counter electrode 1212, a capacitor 1213, a pixel electrode 1215, a partition wall 1216, an organic conductive film 1217, an organic thin film 1218, and a substrate 1219. Note that it is preferable that the first transistor 1205 be used as a switching transistor, the first wiring 1206 as a gate signal line, the second wiring 1207 as a source signal line, the second transistor 1208 as a driving transistor, and the third wiring 1211 as a current supply line.

A gate electrode of the first transistor 1205 is electrically connected to the first wiring 1206. One of a source electrode and a drain electrode of the first transistor 1205 is electrically connected to the second wiring 1207. The other of the source electrode and the drain electrode of the first transistor 1205 is electrically connected to a gate electrode of the second transistor 1208 and one of electrodes of the capacitor 1213. Note that the gate electrode of the first transistor 1205 includes a plurality of gate electrodes. Accordingly, leakage current in the off state of the first transistor 1205 can be reduced.

One of a source electrode and a drain electrode of the second transistor 1208 is electrically connected to the third wiring 1211, and the other of the source electrode and the drain electrode of the second transistor 1208 is electrically connected to the pixel electrode 1215. Accordingly, current flowing through the pixel electrode 1215 can be controlled by the second transistor 1208.

The organic conductive film 1217 is provided over the pixel electrode 1215, and the organic thin film 1218 (organic compound layer) is provided thereover. The counter electrode 1212 is provided over the organic thin film 1218 (organic compound layer). Note that the counter electrode 1212 may be formed over the entire surface so as to be connected to all the pixels in common, or may be patterned using a shadow mask or the like.

Light emitted through the organic thin film 1218 (organic compound layer) is transmitted through either the pixel electrode 1215 or the counter electrode 1212.

In FIG. 34B, the case where light is emitted to the pixel electrode side, that is, a side on which the transistor and the like are formed is referred to as bottom emission; and the case where light is emitted to the counter electrode side is referred to as top emission.

In the case of bottom emission, it is preferable that the pixel electrode 1215 be formed of a light-transmitting conductive film. On the other hand, in the case of top emission, it is preferable that the counter electrode 1212 be formed of a light-transmitting conductive film.

In a light-emitting device for color display, EL elements having respective light emission colors of R, G, and B may be separately formed, or an EL element with a single color may be formed over the entire surface and light emission of R, G, and B may be obtained by using a color filter.

Note that the structures shown in FIGS. 34A and 34B are examples, and various structures can be employed for a pixel layout, a cross-sectional structure, a stacking order of electrodes of an EL element, and the like, other than the structures shown in FIGS. 34A and 34B. Further, for a light-emitting layer, various elements such as a crystalline element such as an LED, and an element formed using an inorganic thin film as well as the element formed using the organic thin film shown in the drawing can be used.

For example, when a transistor which is formed by any of the manufacturing methods in Embodiment Modes 1 to 3 is used for each circuit of the system block of the liquid crystal display device in FIGS. 24A to 24C, a display device which is larger, easily operates normally, and has excellent current characteristics can be obtained.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 8

In this embodiment mode, examples of electronic devices are described.

Figure 35:
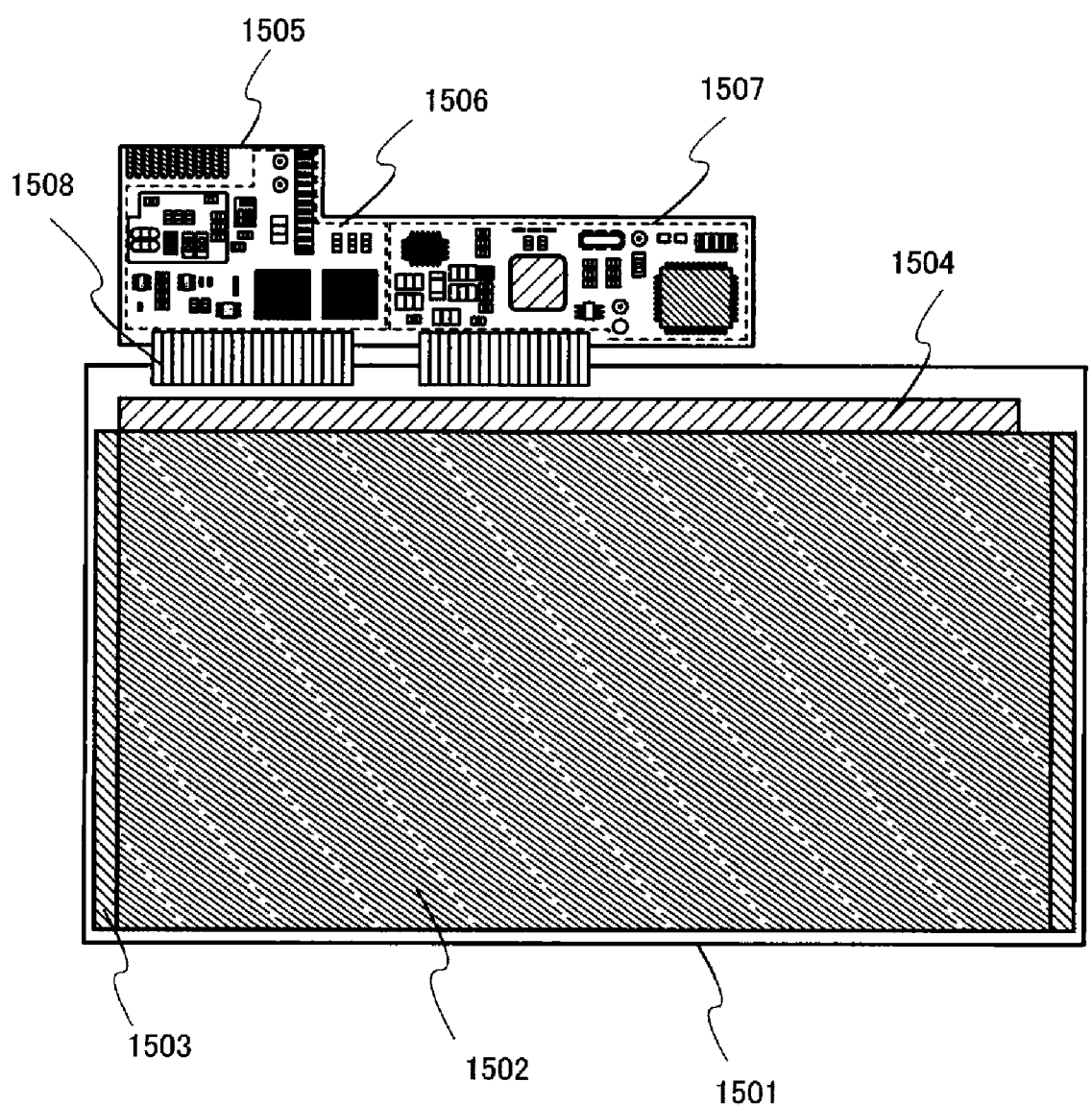
FIG. 35 illustrates an electronic device of the present invention.

FIG. 35 shows a display panel module in which a display panel 1501 and a circuit board 1505 are combined. The display panel 1501 includes a pixel portion 1502, a scan line driver circuit 1503, and a signal line driver circuit 1504. The circuit board 1505 is provided with a control circuit 1506, a signal dividing circuit 1507, and the like, for example. The display panel 1501 and the circuit board 1505 are connected by a connection wiring 1508. As the connection wiring 1508, an FPC or the like can be used.

Figure 36:
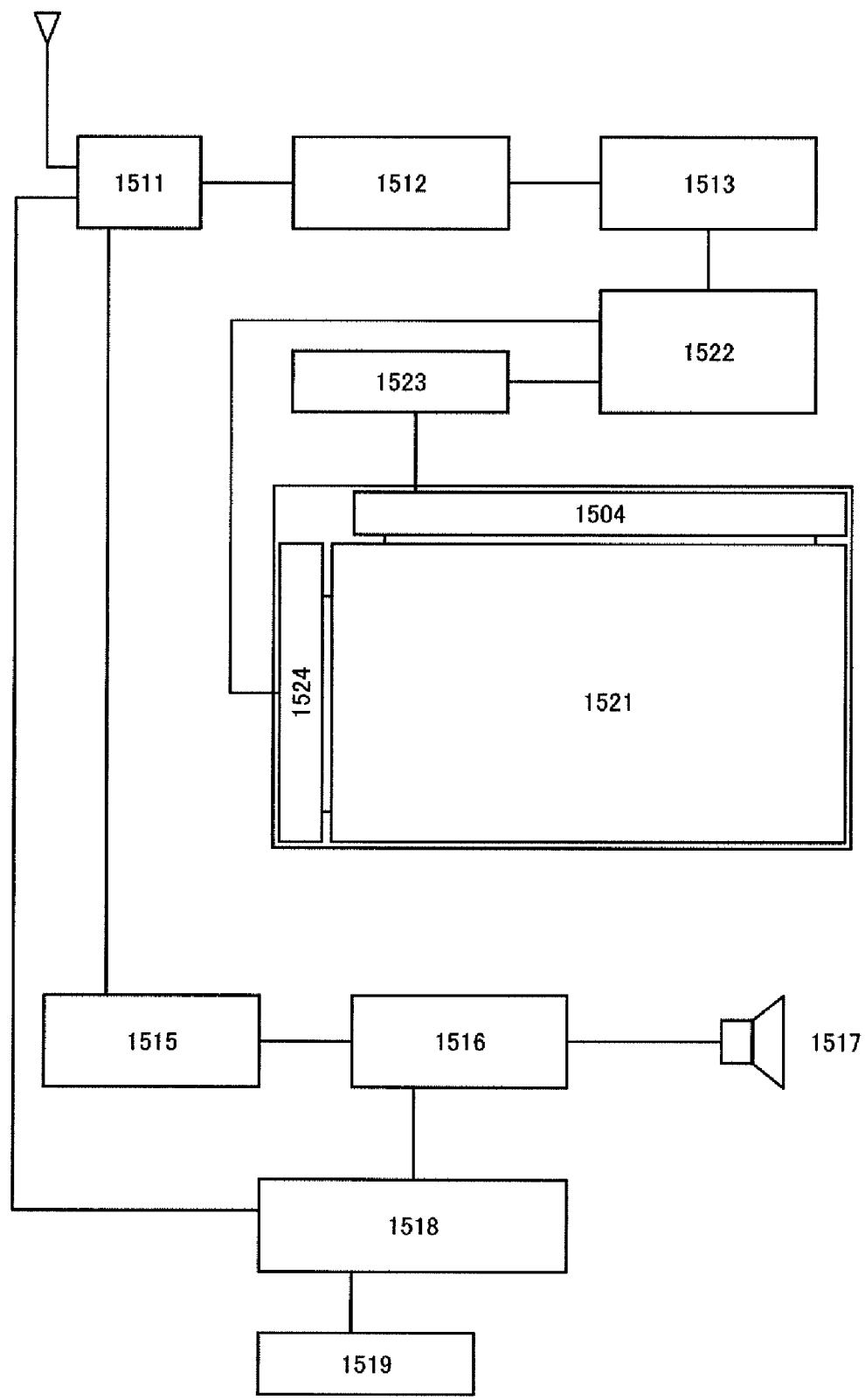
FIG. 36 illustrates an electronic device of the present invention.

FIG. 36 is a block diagram showing a main structure of a television receiver. A tuner 1511 receives a video signal and an audio signal. The video signal is processed by a video signal amplifier circuit 1512, a video signal processing circuit 1513 for converting a signal output from the video signal amplifier circuit 1512 into a color signal corresponding to each color of red, green, and blue, and a control circuit 1522 for converting the video signal into a signal which meets input specifications of a driver circuit. The control circuit 1522 outputs signals to a scan line driver circuit 1524 and a signal line driver circuit 1504. The scan line driver circuit 1524 and the signal line driver circuit 1504 drive a display panel 1521. In the case of digital driving, a structure may be used in which a signal dividing circuit 1523 is provided on the signal line side and an input digital signal is divided into m (m is a positive integer) pieces to be supplied.

Among the signals received by the tuner 1511, the audio signal is transmitted to an audio signal amplifier circuit 1515, and output thereof is supplied to a speaker 1517 through an audio signal processing circuit 1516. A control circuit 1518 receives control information on a receiving station (reception frequency) and sound volume from an input portion 1519 such as an operation switch or an operation key, and transmits a signal to the tuner 1511 or the audio signal processing circuit 1516.

Figure 37A:
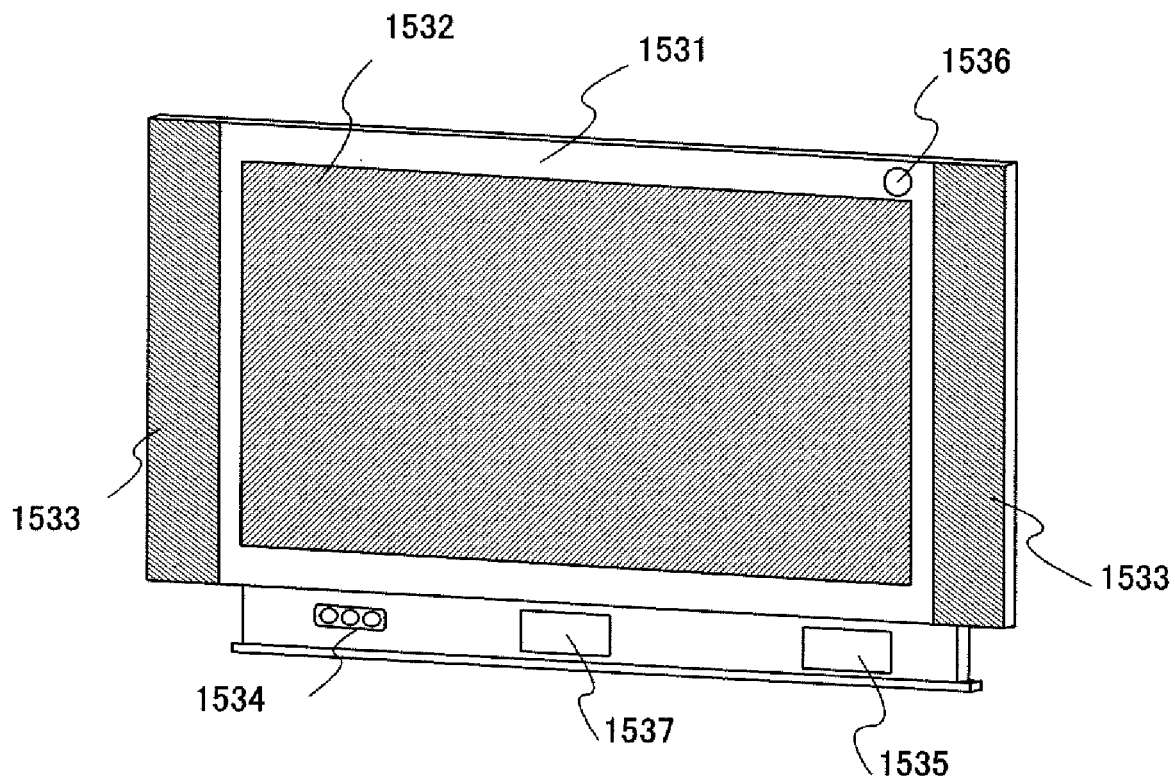
FIGS. 37A and 37B each illustrate an electronic device of the present invention.

FIG. 37A shows a television receiver incorporated with a display panel module which is different from that of FIG. 36. In FIG. 37A, a display screen 1532 stored in a housing 1531 is formed using the display panel module. Note that speakers 1533, input means (operation switches 1534, a connection terminal 1535, a sensor 1536 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 1537), and the like may be provided as appropriate.

Figure 37B:
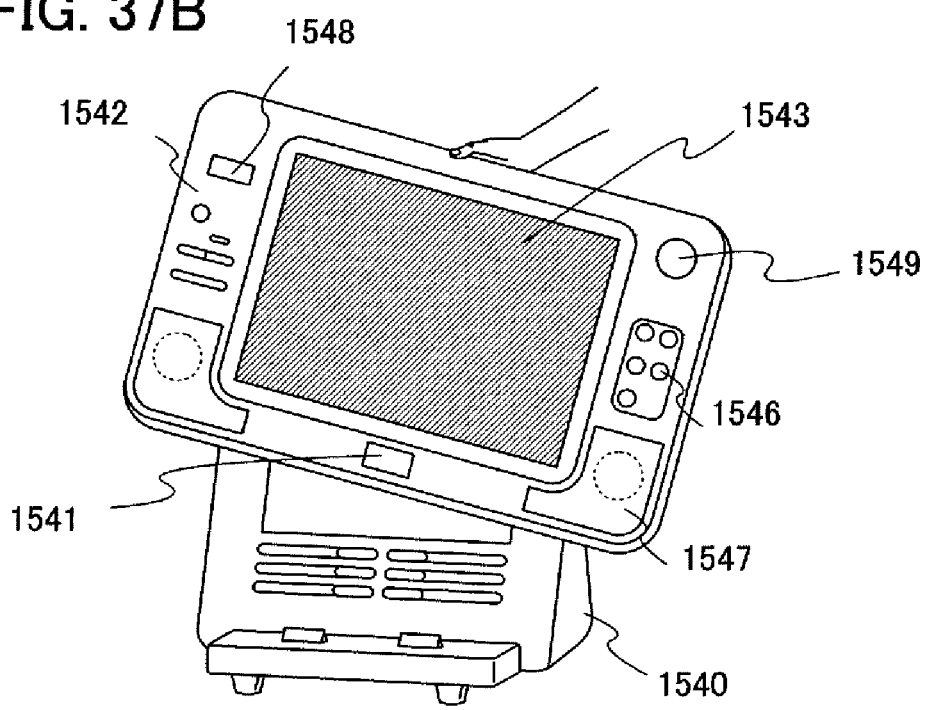

FIG. 37B shows a television receiver, only a display of which can be carried wirelessly. The television receiver includes a display portion 1543, speaker portions 1547, input means (operation switches 1546, a connection terminal 1548, a sensor 1549 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 1541), and the like as appropriate. A battery and a signal receiver are incorporated in a housing 1542. The battery drives the display portion 1543, the speaker portions 1547, the sensor 1549, and a microphone 1541. Electricity can be repeatedly stored in the battery by a charger 1540. The charger 1540 can transmit and receive a video signal and can transmit the video signal to the signal receiver of the display. The device shown in FIG. 37B is controlled by the operation keys 1546. Alternatively, the device shown in FIG. 37B can transmit a signal to the charger 1540 by operating the operation keys 1546. That is, the device may be an image audio two-way communication device. Further alternatively, the device shown in FIG. 37B can transmit a signal to the charger 1540 by operating the operation keys 1546, and can control communication of another electronic device when the electronic device is made to receive a signal which can be transmitted from the charger 1540. That is, the device may be a general-purpose remote control device. Note that the contents (or may be part of the contents) described in each drawing of this embodiment mode can be applied to the display portion 1543.

Next, a structural example of a mobile phone is described with reference to FIG. 38.

A display panel 1562 is incorporated in a housing 1550 so as to be detachable. The shape and the size of the housing 1550 can be changed as appropriate in accordance with the size of the display panel 1562. The housing 1550 to which the display panel 1562 is fixed is fitted into a printed circuit board 1551 and is assembled as a module.

The display panel 1562 is connected to the printed wiring board 1551 through an FPC 1563. The printed wiring board 1551 is provided with a speaker 1552, a microphone 1553, a transmitting/receiving circuit 1554, a signal processing circuit 1555 including a CPU, a controller, and the like, and a sensor 1561 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray). Such a module, operation keys 1556, a battery 1557, and an antenna 1560 are combined and stored in a housing 1559. A pixel portion of the display panel 1562 is provided so as to be seen from an opening window formed in the housing 1559.

In the display panel 1562, the pixel portion and part of peripheral driver circuits (a driver circuit having low operation frequency among a plurality of driver circuits) may be formed over the same substrate by using transistors, and another part of the peripheral driver circuits (a driver circuit having high operation frequency among the plurality of driver circuits) may be formed over an IC chip. The IC chip may be mounted on the display panel 1562 by COG (chip on glass). Alternatively, the IC chip may be connected to a glass substrate by using TAB (tape automated bonding) or a printed circuit board. With such a structure, power consumption of the mobile phone can be reduced, so that operation time of the mobile phone per charge can be extended. In addition, cost of the mobile phone can be reduced.

Figure 38:
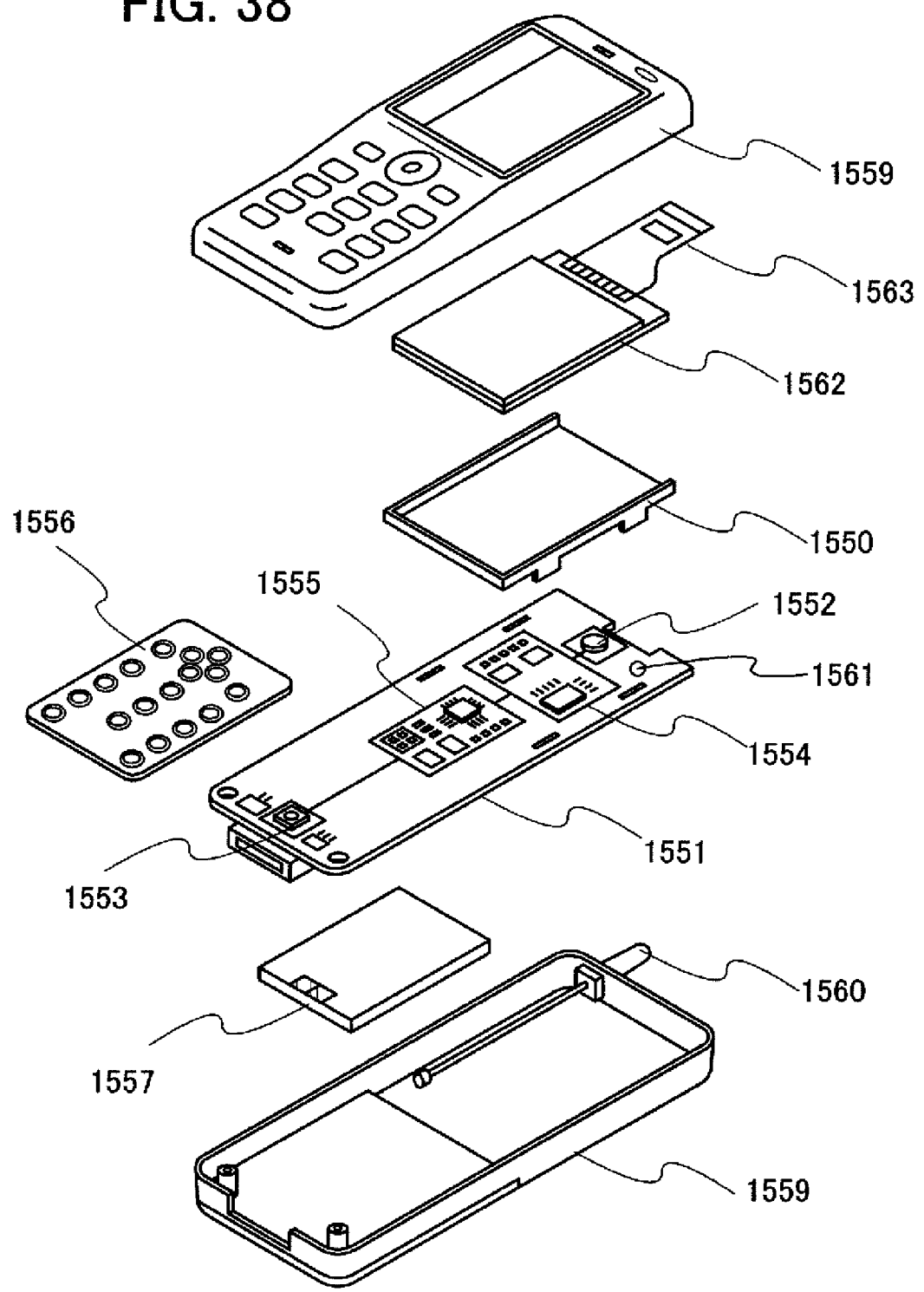
FIG. 38 illustrates an electronic device of the present invention.

The mobile phone shown in FIG. 38 has various functions such as a function of displaying a variety of information (e.g., a still image, a moving image, and a text image); a function of displaying a calendar, a date, time, or the like on a display portion; a function of operating or editing the information displayed on the display portion; a function of controlling processing by a variety of software (programs); a wireless communication function; a function of communicating with another mobile phone, a fixed phone, or an audio communication device by using the wireless communication function; a function of connecting with a variety of computer networks by using the wireless communication function; a function of transmitting or receiving a variety of data by using the wireless communication function; a function of operating a vibrator in accordance with incoming call, reception of data, or an alarm; and a function of generating a sound in accordance with incoming call, reception of data, or an alarm. Note that functions of the mobile phone shown in FIG. 38 are not limited to them, and the mobile phone can have various functions.

Figure 39A:
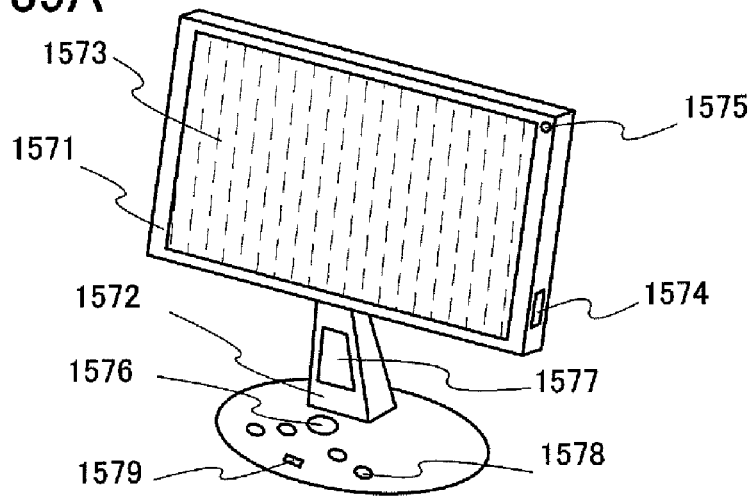
FIGS. 39A to 39C each illustrate an electronic device of the present invention.

FIG. 39A shows a display, which includes a housing 1571, a support base 1572, a display portion 1573, a speaker 1577, an LED lamp 1579, an input means (a connection terminal 1574, a sensor 1575 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), a microphone 1576, and operation keys 1578), and the like. The display shown in FIG. 39A has a function of displaying a variety of information (e.g., a still image, a moving image, and a text image) on the display portion. Note that the display shown in FIG. 39A is not limited to having this function, and can have various functions.

Figure 39B:
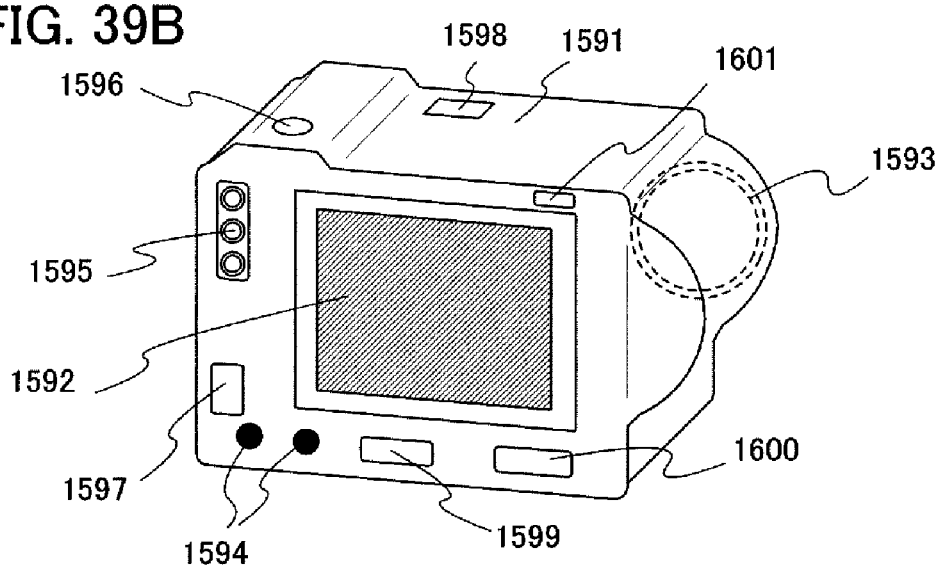

FIG. 39B shows a camera, which includes a main body 1591, a display portion 1592, a shutter button 15796, speaker 1600, an LED lamp 1601, input means (an image receiving portion 1593, operation keys 1594, an external connection port 1595, a connection terminal 1597, a sensor 1598 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), and a microphone 15739), and the like. The camera shown in FIG. 39B has a function of photographing a still image and a moving image; a function of automatically correcting the photographed image (the still image or the moving image); a function of storing the photographed image in a recording medium (provided outside or incorporated in the camera); and a function of displaying the photographed image on the display portion. Note that the camera shown in FIG. 39B is not limited to having these functions, and can have various functions.

Figure 39C:
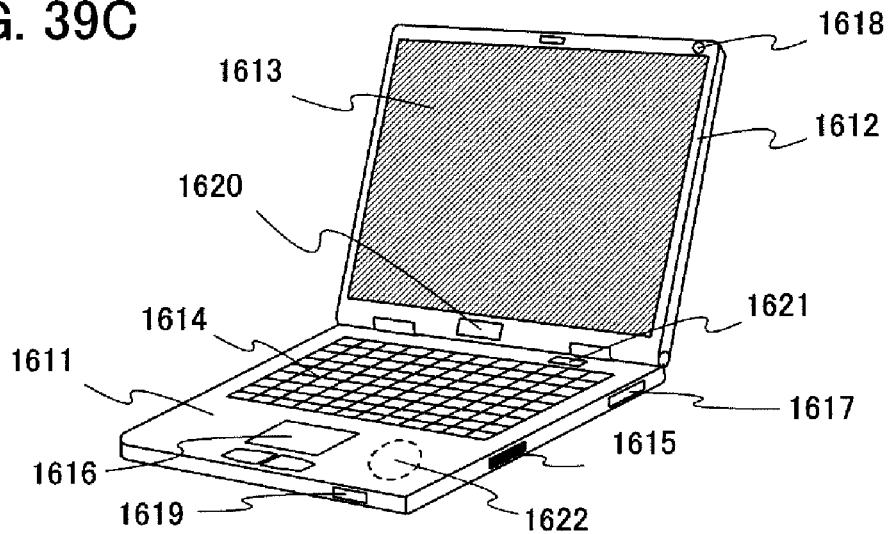

FIG. 39C shows a computer, which includes a main body 1611, a housing 1612, a display portion 1613, a speaker 1620, an LED lamp 1621, a reader/writer 1622, input means (a keyboard 1614, an external connection port 1615, a pointing device 1616, a connection terminal 1617, a sensor 1618 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), and a microphone 1619), and the like. The computer shown in FIG. 39C has a function of displaying a variety of information (e.g., a still image, a moving image, and a text image) on the display portion; a function of controlling processing by a variety of software (programs); a communication function such as wireless communication or wire communication; a function of connecting to various computer networks by using the communication function; and a function of transmitting or receiving a variety of data by using the communication function. Note that the computer shown in FIG. 39C is not limited to having these functions, and can have various functions.

As shown in FIG. 35, FIG. 36, FIGS. 37A and 37B, FIG. 38, and FIGS. 39A to 39C, an electronic device includes a display portion for displaying some information. Thus, when a transistor which is formed by any of the manufacturing methods in Embodiment Modes 1 to 3 is used, the electronic device can be manufactured with high reliability and high yield. Alternatively, since the manufacturing method is simple, manufacturing cost can be reduced.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed when each part is combined with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed when each part is combined with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

This application is based on Japanese Patent Application serial no. 2007-173281 filed with Japan Patent Office on Jun. 29, 2007, the entire contents of which are hereby incorporated by reference.

What is claimed is:

1. A method for manufacturing a semiconductor device, comprising, a first step of providing a first single-crystal semiconductor layer over an insulating substrate;

a second step of processing the first single-crystal semiconductor layer into an island shape;

a third step of providing a second single-crystal semiconductor layer over the insulating substrate; and a fourth step of processing the second single-crystal semiconductor layer into an island shape.

2. The method for manufacturing a semiconductor device according to claim 1, wherein the third step of providing the second single-crystal semiconductor layer over the insulating substrate so as to overlap with a part of a region where the first single-crystal semiconductor layer is provided.

3. The method for manufacturing a semiconductor device according to claim 1, further comprising, a fifth step of forming a gate insulating film;

a sixth step of forming a conductive film above the gate insulating film; and a seventh step of processing the conductive film into an island shape.

4. A method for manufacturing a semiconductor device, comprising first to fourth steps, a first step of providing a first single-crystal semiconductor layer and a second single-crystal semiconductor layer over an insulating substrate;

a second step of processing each of the first single-crystal semiconductor layer and the second single-crystal semiconductor layer into an island shape;

a third step of providing a third single-crystal semiconductor layer over the insulating substrate; and a fourth step of processing the third single-crystal semiconductor layer into an island shape.

5. The method for manufacturing a semiconductor device according to claim 4, wherein the third step of providing the third single-crystal semiconductor layer over the insulating substrate so as to overlap with a part of a region where the first single-crystal semiconductor layer is provided and a part of a region where the second single-crystal semiconductor layer is provided.

6. The method for manufacturing a semiconductor device according to claim 4, further comprising, a fifth step of forming a gate insulating film;

a sixth step of forming a conductive film above the gate insulating film; and a seventh step of processing the conductive film into an island shape.

7. A method for manufacturing a semiconductor device, comprising first to sixth steps, a first step of providing a first single-crystal semiconductor layer over an insulating substrate;

a second step of processing the first single-crystal semiconductor layer into an island shape;

a third step of providing a second single-crystal semiconductor layer over the insulating substrate;

a fourth step of processing the second single-crystal semiconductor layer into an island shape;

a fifth step of providing a third single-crystal semiconductor layer over the insulating substrate; and a sixth step of processing the third single-crystal semiconductor layer into an island shape.

8. The method for manufacturing a semiconductor device according to claim 7, wherein the third step of providing the second single-crystal semiconductor layer over the insulating substrate so as to overlap with a part of a region where the first single-crystal semiconductor layer is provided; and wherein the fifth step of providing the third single-crystal semiconductor layer over the insulating substrate so as to overlap with a part of a region where the first single-crystal semiconductor layer is provided and a part of a region where the second single-crystal semiconductor layer is provided.

9. The method for manufacturing a semiconductor device according to claim 7, further comprising, wherein a seventh step of forming a gate insulating film;

wherein a eighth step of forming a conductive film above the gate insulating film; and wherein a ninth step of processing the conductive film into an island shape.

* * * * *